(12) United States Patent
Butcher et al.

(10) Patent No.: US 8,298,624 B2
(45) Date of Patent: Oct. 30, 2012

(54) METHOD AND APPARATUS FOR GROWING A GROUP (III) METAL NITRIDE FILM AND A GROUP (III) METAL NITRIDE FILM

(75) Inventors: Kenneth Scott Alexander Butcher, Miranda (AU); Marie-Pierre Francoise Wintrebert ep Fouquet, Glebe (AU); Patrick Po-Tsang Chen, Macquarie Park (AU); John Leo Paul Ten Have, Epping (AU); David Ian Johnson, Peakhurst Heights (AU)

(73) Assignee: Gallium Enterprises Pty Ltd., Silverwater, New South Wales (AU)

( * ) Notice: Subject to any disclaimer, the term of this patent is extended or adjusted under 35 U.S.C. 154(b) by 1261 days.

(21) Appl. No.: 11/575,897

(22) PCT Filed: Sep. 27, 2005

(86) PCT No.: PCT/AU2005/001483
§ 371 (c)(1),
(2), (4) Date: Feb. 21, 2008

(87) PCT Pub. No.: WO2006/034540
PCT Pub. Date: Apr. 6, 2006

(65) Prior Publication Data
US 2008/0272463 A1 Nov. 6, 2008

(30) Foreign Application Priority Data

Jul. 1, 2005 (AU) ................................ 2005903494
Sep. 7, 2005 (AU) ................................ 2005904919

(51) Int. Cl.
*H05H 1/24* (2006.01)
(52) U.S. Cl. .................................................. 427/569
(58) Field of Classification Search .................. 427/569
See application file for complete search history.

(56) References Cited

U.S. PATENT DOCUMENTS
5,986,285 A 11/1999 Yagi

FOREIGN PATENT DOCUMENTS
JP 8-167596 A 6/1996
(Continued)

OTHER PUBLICATIONS

Alexandrov, D. et al., "Absorption and Photoluminescence Features Caused by Defects in InN", Journal of Crystal Growth, vol. 269, pp. 77-86, (2004).

(Continued)

*Primary Examiner* — Timothy Meeks
*Assistant Examiner* — Elizabeth Burkhart
(74) *Attorney, Agent, or Firm* — Knobbe, Martens, Olson & Bear, LLP

(57) ABSTRACT

A process and apparatus for growing a group (III) metal nitride film by remote plasma enhanced chemical vapor deposition are described. The process comprises heating an object selected from the group consisting of a substrate and a substrate comprising a buffer layer in a growth chamber to a temperature in the range of from about 400° C. to o about 750° C., producing active neutral nitrogen species in a nitrogen plasma remotely located from the growth chamber and transferring the active neutral nitrogen species to the growth chamber. A reaction mixture is formed in the growth chamber, the reaction mixture containing a species of a group (III) metal that is capable of reacting with the nitrogen species so as to form a group (III) metal nitride film and a film of group (III) s metal nitride is formed on the heated object under conditions whereby the film is suitable for device purposes. Also described is a group (III) metal nitride film which exhibits an oxygen concentration below 1.6 atomic %.

16 Claims, 17 Drawing Sheets

FOREIGN PATENT DOCUMENTS

| | | |
|---|---|---|
| JP | 11-087253 A | 3/1999 |
| JP | 2003188104 | 7/2003 |
| JP | 2003193237 | 7/2003 |
| JP | 2003342715 | 12/2003 |
| JP | 2003342716 | 12/2003 |
| JP | 2003342719 | 12/2003 |
| JP | 2004-210635 A | 7/2004 |
| WO | WO 95/33866 | 12/1995 |
| WO | WO 03/097532 A1 | 11/2003 |

OTHER PUBLICATIONS

Butcher, et al., "A Luminescence Study of Porous Diatoms", Materials Science and Engineering C vol. 25, pp. 658-663, (2005).

Butcher et al., "An Instrumental Solution to the Phenomenon of Negative Capacitances in Semiconductors", Solid-St. Electron. vol. 39, pp. 333-336, (1996).

Butcher et al., "Cathodoluminescence of GaSb/GaAs Self Assembled Quantum Dots Grown by MOCVD", Materials Letters vol. 58, pp. 80-83, (2003).

Butcher, et al., "Crystal Size and Oxygen Segregation for Polycrystalline GaN" Journal of Applied Physics vol. 92, pp. 3397-3403, (2002).

Butcher, et al., "Detailed Analysis of Absorption Data for InN", Materials Science in Semiconductor Processing vol. 6, pp. 351-354, (2003).

Butcher, et al., "Gallium and Oxygen Accumulations on GaN surfaces following argon ion milling in ultra-high vacuum conditions", Applied Surface Science vol. 230, pp. 18-23, (2004).

Butcher, InN, a Historical Review—From Obscurity to Controversy.

Butcher, et al., "InN, Latest Development and a Review of the Bandgap Controversy", Superlattices and Microstructures vol. 38, pp. 1-37, (2005).

Butcher, et al., "Multilayer GaSb/GaAs Self-Assembled Quantum Dots Grown by Metalorganic Chemical Vapor Deposition", Materials Chemistry and Physics vol. 81, pp. 8-10, (2003).

Butcher, et al., "Nitrogen Rich Indium Nitride", Journal of Applied Physics vol. 95, pp. 6124-6128, (2004).

Butcher, et al., "Non-stoichiometry and Non-homogeneity in InN" Physica Status Solidi. No. 7, pp. 2263-2266, (2005).

Butcher, et al., "Optical and Structural Analysis of GaN Grown by Remote Plasma Enhanced Laser Induced Chemical Vapor Deposition", Physical Status Solidi., No. 1, pp. 499-503, (2002).

Butcher, et al., "Photolytic Absorbate Removal During the Growth of Aluminium Nitride by Remote Microwave Plasma Chemical Vapor Deposition", Solid-St. Electron. vol. 41, pp. 305-314, (1997).

Butcher, et al., "Pre-deposition UV Treatment for Adhesion Improvement of Thin Films on Mercury Cadmium Telluride", J. Vac. Sci. Tech., vol. 19, pp. 90-96, (2001).

Butcher, et al., "Recrystallization prospects for freestanding low temperature GaN grown using ZnO buffer layers", Journal of Crystal Growth, vol. 246, pp. 237-243, (2002).

Butcher, "Revisiting Electrochromism in InN", Physica Status Solidi., No. 7., pp. 2293-2296, (2005).

Butcher et al., "Studies of the Plasma Related Oxygen Contamination of Gallium Nitride Grown by Remote Plasma Enhanced Chemical Vapour Deposition", Physical Status Solidi., No. 1, pp. 156-160, (2002).

Butcher, et al., "Ultra-High Resistivity Aluminium Nitride Deposited on Mercury Cadmium Telluride", J. Appl. Phys. vol. 90, pp. 6217-6221, (2001).

Butcher, et al., "Ultraviolet Raman and Optical Transmission Studies of RF Sputtered Indium Nitride", Physical Status Solidi., No. 1, pp. 373-376, (2002).

Butcher, et al., "UV Moderation of Nitride Films During Remote Plasma Enhanced Chemical Vapour Deposition", Physical Status Solidi., vol. 188, No. 2, pp. 667-671, (2001).

Butcher et al, "X-ray Photoelectron Spectroscopy Depth Profiling of Aluminium Nitride Thin Films", Surf. Interface Anal., vol. 25, pp. 99-104, (1997).

Egan et al., "Hydrogenation Passivation of Acceptors in MOCVD Grown p-InSb", Sol. St. Commun., vol. 98, No. 8, pp. 751-754, (1996).

Godlewski et al., "Atomic layer deposition of ZnO thin films and dot structures", Proceedings of the Estonian Academy of Sciences. Physics, Mathematics, vol. 52, No. 3, pp. 277-288, (2003).

Godlewski et al., "Cathodoluminescence Investigations of Interfaces in InGaN/GaN/ Sapphire Structures", Physical Status Solidi., vol. 228, No. 1, pp. 179-182, (2001).

Goldys et al., "Spatial Fluctuations and Localisation Effects in Optical Characteristics of p-doped GaN Films", Physica Status Solidi., vol. 228, No. 2, pp. 365-369, (2001).

Guy et al., "Piezoelectricity in Indium Nitride", Journal of Crystal Growth vol. 269, pp. 72-76, (2004).

Kuball et al., "A Raman spectroscopy study on InN", Journal of Crystal Growth, vol. 269, pp. 59-65, (2004).

Kuball et al., "Resonant Raman Spectroscopy on InN", Physical Status Solidi., vol. 202, No. 5, pp. 763-767. (2005).

Ramelan et al., "High Resolution X-ray Photoelectron Spectroscopy of AlGaSb", Applied Surface.Science, vol. 229, pp. 263-267, (2004).

Shrestha et al, "Accurate Stoichiometric analysis of Polycrystalline Indium Nitride Films with Elastic Recoil Detection", Current Applied Physics, vol. 4, pp. 237-240, (2004).

Shrestha et al., "Nitrogen Depletion of Indium Nitride Films During Elastic Recoil Detection Analysis", Nuclear Instruments and Methods in Physics Research B, vol. 234, pp. 291-307, (2005).

Shrestha et al., "Reliable ERD analysis of group-III nitrides despite severe nitrogen depletion", Nuclear Instruments and Methods in Physics Research B, vol. 219-220, pp. 686-692, (2004).

Shubina et al., "Optical Properties of InN with Stoichiometry Violation and Indium Clustering", Physica Status Solidi., vol. 202, No. 3, pp. 377-382, (2005).

Wintrebert-Fouquet et al., "High sensitivity, high resolution X-ray photoelectron analysis of InN", Phys. Stat. Sol., No. 7, pp. 2785-2789, (2003).

Wintrebert-Fouquet et al., "High-sensitivity X-ray photoelectron spectroscopy characterization of a quantum device structure", Journal of Vacuum Science and Technology, vol. 38, pp. 2131-2133, (2002).

Wintrebert-Fouquet et al., "InN grown by remote plasma enhanced chemical vapor deposition" Journal of Crystal Growth, vol. 269, pp. 134-138, (2004).

Yodo et al., "Visible Emissions Near 1.9-2.2 eV From Hexagonal InN Films Grown By Electron Cyclotron Resonance Plasma-Assisted Molecular-Beam Epitaxy", Journal of Crystal Growth, vol. 269, pp. 145-154, (2004).

Zhou et al., "Growth Mechanisms in Excimer Laser Photolytic Deposition of Gallium Nitride at 500° C", J. of Crystal Growth, vol. 160, pp. 201-206, (1996).

Zhou et al, "Growth of GaN Films by Combined Laser and Microwave Plasma Enhanced Chemical Vapour Deposition", J. Crystal Growth, vol. 151, pp. 249-253, (1995).

Zhou et al., "Microwave Plasma Assisted LCVD Growth and Characterisation of GaN", Applied Surface Science, 100/101, pp. 643-646, (1996).

Zhou et al., "Photoconductive Decay in LCVD/PECVD Low Temperature Grown GaN", Solid-St. Electronics, vol. 41, No. 2, pp. 279-281, (1997).

METHOD AND APPARATUS FOR GROWING A GROUP (III) METAL NITRIDE FILM AND A GROUP (III) METAL NITRIDE FILM

TECHNICAL FIELD

The present invention relates to the growing of gallium nitride, indium nitride and aluminium nitride films or films made from alloys of these. More particularly, the invention relates to a method and apparatus for growing a film of gallium nitride using a remote plasma enhanced chemical vapour deposition (RPECVD) process, wherein electrically neutral but chemically active species from a remotely generated nitrogen plasma may be conducted to a growth chamber where a film of gallium nitride is grown. The invention also extends to a method of reducing damage to a gallium nitride film during growth thereof, and also to a method of passivating a containment vessel made of alumina, quartz or fused silica. The present invention also relates to heating. More particularly, the invention relates to an apparatus for heating a substance to an elevated temperature in a harsh environment.

BACKGROUND OF THE INVENTION

Gallium nitride is a material widely used in the construction of blue, violet and white light emitting diodes, blue laser diodes, ultraviolet detectors and high power microwave transistor devices.

Because of the actual and potential uses of gallium nitride in the manufacture of low energy consumption devices suitable for use in a wide range of applications, there is great interest in gallium nitride films.

Gallium nitride films can be grown in a number of different ways, including molecular beam epitaxy (MBE) and metal organic chemical vapor deposition (MOCVD) processes. MOCVD is the deposition method of choice for achieving films of sufficient quality for LED production.

However, for growing gallium nitride films, the MOCVD process suffers from the disadvantage that it has to be operated at a temperature of approximately 1000° C. Only materials that are capable of withstanding the relatively high temperatures, such as synthetic sapphire, can be used with this process.

Remote plasma enhanced chemical vapour deposition (RPECVD) is another growth method that can be used for growing films of Group (III) metal nitrides. Where the film to be grown is gallium nitride, the RPECVD technique enables the use of a growth temperature of about 600° C. to about 680° C., which is considerably lower than the growth temperature of the MOCVD process and enables the reduction of equipment costs. Another advantage of the RPECVD process is that temperature sensitive substrate materials more closely lattice matched to GaN, such as zinc oxide, can be used.

While RPECVD, by virtue of the remoteness of the plasma source from the substrate, is widely believed to be a technique that avoids film damage from species generated in the plasma, the inventors have found that films grown by this method can suffer severe damage even from relatively low energy species (that is, less than 14.5 eV in the case where a nitrogen plasma is used). Although damage from ionised particles and high energy electrons is avoided when using RPECVD, as a result of a rapid decay in energy within a short distance of the plasma source, relatively low energy active neutral nitrogen species that arrive at the substrate can still impart damage if they possess greater energies than the Ga—N bond strength (which is 2.2 eV). This damage may be manifested by the loss of nitrogen atoms from the film, or by the dislodgement of gallium and nitrogen atoms from their preferred lattice sites with their subsequent incorporation at other non-preferred lattice sites.

There accordingly exists a need for a further reduction of the energy of the active neutral nitrogen species that reach the substrate when using the RPECVD growth technique.

Considerable work has also been done on crystal size and oxygen segregation in GaN films [1]; on the recrystallisation prospects of GaN using ZnO as a buffer layer [2], and on a detailed comparison of the characteristics of GaN grown on quartz and sapphire substrates [3]. Early polycrystalline material produced by a RPECVD process combined with a laser CVD process was comparable to early MBE material growth with unintentional doped n-type material being produced with room-temperature mobility of 100-200 cm$^2$/Vs [4] and carrier concentration around $10^{16}$ cm$^{-3}$.

In PCT/AU2003/000598 a process for manufacturing a gallium rich gallium nitride film is described. That process is operated at a growth temperature of from about 480° C. to about 900° C. and in an atmosphere in which the partial pressure of oxygen is less than $10^{-4}$ Torr. Although the very low partial pressure of oxygen in the process described in the aforementioned publication already contributes to the production of metal nitride films of improved quality, such low partial pressures of oxygen generally require a reduction in system pressure during growth to achieve a low oxygen partial pressure.

The conventional RPECVD process suffers from the disadvantage of oxygen contamination caused by oxygen remaining in the system after evacuation, even down to a base pressure of about $10^{-6}$ to $10^{-8}$ Torr, and by the release of oxygen atoms from the walls of quartz or alumina containment vessels and tubes that are used in this process for the containment of the plasma. This presents a problem in that such oxygen atoms are liable to be incorporated into the gallium nitride film, causing the film to have undesirable properties. Oxygen is a dopant in gallium nitride films but may also segregate at high levels during growth at the temperatures used for RPECVD. Where oxygen incorporation into the gallium nitride film is uncontrolled, its concentration may exceed levels that can be tolerated or that are desirable, depending on whether there is a need for a certain amount of oxygen incorporation or whether its presence, even at low concentrations, is undesirable. Even where the electron carrier concentration is low, the electrical conductivity of the film may be affected by the presence of oxygen due to auto-compensation mechanisms which can cause the electrical conductivity and electron mobility to be very low.

Oxygen contamination may also result in small crystal sizes or even the formation of amorphous gallium nitride under certain growth conditions. Having a low level of is background oxygen present during film growth allows dopant levels to be set to device specifications by controlled input of dopant gases during film growth. It also ensures that crystal size is not limited by oxygen segregation.

When the surface of a containment vessel or tube made of alumina, quartz or silica is bombarded with high energy nitrogen ions forming part of a nitrogen plasma such as that obtained when the RPECVD process is used, some of the chemically bound oxygen atoms in the surface of the containment vessel or tube are released or dislodged as a result of the high energy of the nitrogen ions. This may allow causing a chemical reaction to occur between the dangling bonds produced at the vessel surface and the nitrogen ions. This chemical reaction naturally depends on the type of plasma and the material of the containment vessel or tube. The reaction can be thought of as a type of displacement reaction wherein oxygen is removed from the structure of the vessel and replaced by nitrogen.

An investigation into the possibility of the passivation of quartz and alumina containment vessels and tubes was reported by Butcher, K S A et al, in *Studies of the Plasma Related Oxygen Contamination of Gallium Nitride Grown by Remote Plasma Enhanced Chemical Vapour Deposition*, Phys. Stat. Sol. (c) No 1, 156-160 (2002). In that article, the authors described a method for the conditioning of an alumina containment vessel or tube wherein the alumina containment vessel or tube is conditioned in a nitrogen or ammonia plasma, depending on the type of plasma required to be used subsequently, for a prolonged period of from about 24 hours to several days. Where an ammonia plasma is used to condition the vessel or tube, some alumina molecules on the surface of the vessel or tube are converted to alane ($AlH_3$), an unstable species which decays rapidly in air to form alumina and hydrogen gas. Where a nitrogen plasma is used to condition the vessel or tube, some alumina molecules on the surface of the vessel or tube are converted to aluminium nitride (AlN), which limits the evolution of further oxygen bearing species. However, in an atmosphere of air the aluminium nitride layer is also converted, over a period of time, to alumina and volatile gas products such as hydrogen, so that the conditioning process has to be repeated every time before a gallium nitride film is grown. The aforementioned report by Butcher et al concluded that oxygen contamination of a gallium nitride film grown by using a quartz containment tube or microwave window, even if subjected to some preconditioning by passing a nitrogen plasma therethrough, was unavoidable. The same would be expected to apply to fused silica tubes, in view of the chemical similarity of fused silica and quartz. The reason for the perceived unsuitability of quartz and fused silica for passivation can be ascribed to the chemical reaction which is believed to take place between the high energy nitrogen ions and the silica, which can be simplified as follows:

$$SiO_{2(solid)} + N_{2(plasma)} \rightarrow SiO_{(gas)} + N_2O_{(gas)} \quad (1)$$

As can be seen from equation (1), both the reaction products are gaseous. These gaseous products are swept away by the nitrogen plasma so that more silica is exposed to the nitrogen plasma.

There is therefore a need for a method and apparatus for growing a film of gallium nitride, wherein the oxygen contamination of the gallium nitride film is minimised.

In a RPECVD system a film of metal nitride is grown under partial vacuum in a growth chamber, using a reaction mixture depositing the metal nitride from reactants such as ammonia (and/or nitrogen) and trimethylgallium. The film is grown on a disc shaped substrate that is located on a rotating ring. The substrate is heated from below by a stationary heater. A nitrogen plasma is generated remotely and fed to the growth chamber. In the case of molecular beam epitaxy (MBE) the pressure at which the metal nitride film is grown may be as low as $10^{-5}$ Torr, while for RPECVD the pressure may be about 0.1-10 Torr.

The substrate is positioned about 2 to 3 mm above the heater. Depending on the technology used, the growth temperature may be from about 900° C. to about 1000° C. or from about 500° C. to about 1000° C. However, to achieve a desired growth temperature of about 650° C. on the substrate, it is necessary for the heater to be operated at a considerably higher temperature so that heat can be radiated to the substrate from below. It is thus not unusual to have to operate the heater at a temperature of about 1400° C.

One type of conventional heater for use in heating the substrate comprises a heating element or filament made of tungsten or tantalum wire of about 0.5 mm in diameter, wound around a disc shaped ceramic base with notches in its periphery.

Because of the use of plasmas, the environment within which metal nitrides are grown is typically a reducing atmosphere containing atomic nitrogen, which is very harsh on materials of construction. WO2003/097532 describes a process for the manufacture of a gallium rich gallium nitride film, using a RPECVD process. It is hereby incorporated by reference. With the higher pressure in the growth chamber used in the process described is in WO2003/097532, the conditions are more severe. The aforementioned conventional heaters may even be damaged at a stage prior to growth when the growth system is conditioned to the operating temperature and harsh gaseous environment referred to above.

Conventional heaters comprising resistance filaments made of tantalum or tungsten are embrittled at the growth temperatures used when exposed to the gases used in these systems, which include reactive nitrogen species from the plasma and hydrogen from the metalorganics, and eventually break. Alternately, they can burn through when they short-circuit because of metal deposited between the adjacent loops or windings, from the metalorganic source gases or from the windings themselves which may undergo some evaporation. The resistance wire fails either because of metal embrittlement and expansion or because the metal evaporates and condenses between windings, causing short-circuiting and overloading of short-circuited windings. A more reliable heater than those heaters of which the heating elements are made of tantalum or tungsten is accordingly needed to perform metal nitride semiconductor growths using the MBE and RPECVD techniques.

Another type of conventional heater is described in U.S. Pat. No. 6,140,624. This heater includes a dielectric base made of pyrolytic boron nitride and a heating element of pyrolytic graphite superimposed on the dielectric base. U.S. Pat. No. 5,343,022 describes a similar heating unit composed of a dielectric base of boron nitride and a pyrolytic graphite heating element encapsulated therein.

In U.S. Pat. No. 4,777,022, an epitaxial heater apparatus and process are described. The heater comprises resistive windings located about a core comprising a hollow cylindrical tube portion made of boron nitride, pyrolytic boron nitride or pyrifolyte.

However, these heaters are very expensive because of the use of pyrolytic boron nitride and pyrolytic graphite which are manufactured at high temperatures using chemical vapour deposition technologies with appropriate masks to grow a base incorporating a heating element, layer by layer. As a consequence of the high cost, these heaters are uneconomical in the context of commercial metal nitride film manufacture using the RPECVD technique.

There accordingly exists a need for a cheaper heater that is capable of withstanding the harsh operating conditions encountered in an RPECVD growth system used for growing metal nitrides.

Object of the Invention

It is an object of the present invention to overcome or substantially ameliorate at least one of the above disadvantages or to address at least one of the above needs.

SUMMARY OF THE INVENTION

Processes for Growing Metal Nitride Films

According to a first aspect of the invention, there is provided a process for growing a group (III) metal nitride film by remote plasma enhanced chemical vapour deposition, the process comprising the steps of:

(a) heating an object selected from the group consisting of a substrate and a substrate comprising a buffer layer in a growth chamber to a temperature in the range of from about 400° C. to about 750° C.;

(b) producing active neutral nitrogen species in a nitrogen plasma remotely located from the growth chamber;

(c) transferring the active neutral nitrogen species to the growth chamber;

(d) forming a reaction mixture in the growth chamber, the reaction mixture containing a species of a group (III) metal that is capable of reacting with the nitrogen species so as to form a group (III) metal nitride film; and (e) forming a film of group (III) metal nitride on the heated object under conditions whereby the film is suitable for device purposes.

The substrate may comprise a buffer layer located on the substrate. The lattice of the buffer layer may more closely match the lattice of the film than the lattice of the substrate. Group (III) metal nitride films which may not be suitable for device purposes may have large defect densities as compared to group (III) metal nitride films which are suitable for device purposes.

Group (III) metal nitride films which may not be suitable for device purposes may have low electron or hole mobility as compared to group (III) metal nitride films which are suitable for device purposes.

Group (III) metal nitride films which may not be suitable for device purposes may have low band gaps as compared to group (III) metal nitride films which are suitable for device purposes.

Group (III) metal nitride films which may not be suitable for device purposes may have a high oxygen content as compared to group (III) metal nitride films which are suitable for device purposes.

Group (III) metal nitride films which may not be suitable for device purposes may have been highly damaged by nitrogen species from a nitrogen plasma during growth of the film as compared to group (III) metal nitride films that have not been highly damaged by nitrogen species from a nitrogen plasma during growth of the film.

Group (III) metal nitride films which may not be suitable for device purposes may have been grown on a substrate or buffer layer which has been highly damaged by nitrogen species from a nitrogen plasma prior to growth of the group (III) metal nitride film as compared to group (III) metal nitride films that have not been grown on a substrate or buffer layer which has been highly damaged by nitrogen species from a nitrogen plasma prior to growth of the group (III) metal nitride film.

Group (III) metal nitride films which may not be suitable for device purposes may have been grown without first passivating a tube used to contain the nitrogen plasma as compared to group (III) metal nitride films that have been grown after first passivating a tube used to contain the nitrogen plasma.

Group (III) metal nitride films which may not be suitable for device purposes may have been grown using nitrogen to generate the nitrogen plasma which has too high a level of impurities as compared to group (III) metal nitride films that have been grown using nitrogen to generate the nitrogen plasma which has a suitably low level of impurities.

Group (III) metal nitride films which may not be suitable for device purposes may have been grown at a pressure in the growth chamber which is too low as compared to group (III) metal nitride films which are grown at a suitable pressure in the growth chamber which results in a metal nitride film suitable for device purposes.

Group (III) metal nitride films which may not be suitable for device purposes may have a high oxygen content as compared to group (III) metal nitride films which are suitable for device purposes.

Group (III) metal nitride films which may not be suitable for device purposes may have been grown in an atmosphere containing too high an oxygen partial pressure as compared to group (III) metal nitride films which are suitable for device purposes.

Group (III) metal nitride films which may not be suitable for device purposes may be insulating as compared to group (III) metal nitride films which are suitable for device purposes which may be semiconducting.

Group (III) metal nitride films which may not be suitable for device purposes may require an additional annealing step as compared to group (III) metal nitride films which are suitable for device purposes which may not require an additional annealing step.

Group (III) metal nitride films which may not be suitable for device purposes may be group (III) metal nitride films which do not exhibit a crystallographic structure characteristic of the group (III) metal nitride.

Group (III) metal nitride films which may be suitable for device purposes may be metal nitride films which do exhibit a crystallographic structure characteristic of the group (III) metal nitride.

Group (III) metal nitride films which may not be suitable for device purposes may be group (III) metal nitride films where the film is grown on a substrate or buffer layer such that there is a large lattice mismatch between the film and the substrate or buffer layer.

Group (III) metal nitride films which may be suitable for device purposes may be group (III) metal nitride films where the film is grown on a substrate or buffer layer such that there is a small lattice mismatch or no lattice mismatch between the film and the substrate or buffer layer.

Group (III) metal nitride films which may not be suitable for device purposes may be group (III) metal films whereby the film exhibits a columnar structure (M. A. Sanchez-Garcia E. Calleja, E. Monroy, F. J. Sanchez, F. Calle, E. Munoz and R. Beresford, J. Cryst. Growth, 183, 23, 1998).

Group (III) metal nitride films which may be suitable for device purposes may be where the film does not exhibit a columnar structure.

The film suitable for device purposes may be subjected to further processing steps such as doping, annealing etc.

Step (e) may comprise step (e1):

(e1) forming a film of group (III) metal nitride on the heated object under conditions whereby the measured band gap of the film is less than 500 meV below the established band gap of the group (III) metal nitride and the film is suitable for device purposes.

Step (e) may comprise step (e2):

(e2) forming a film of group (III) metal nitride on the heated object under conditions whereby the measured band gap of the film is less than 500 meV below the established band gap of the group (III) metal nitride and the film is suitable for device purposes wherein during said forming at least one condition applies which condition is selected from the group consisting of:

(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

The film may be particularly suitable for use in the form of a device such as an LED or other device. The LED may be a blue LED or other colour LED or white LED. The LED may be a GaN LED. The LED may be a GaN blue LED.

The object may be located in the growth chamber at a distance of about 20 cm to about 25 cm from the exit end of a containment tube in which a nitrogen plasma is formed. When the object is located at a distance of about 20 cm to about 25 cm from the exit end of a containment tube the pressure may be such in the growth chamber whereby a metal nitride film may be grown whereby the film is suitable for device purposes. The object may be located in the growth chamber at a distance of less than about 20 cm from the exit end of the containment tube or more than about 25 cm from the exit end of the containment tube. When the object is located in the growth chamber at a distance of less than about 20 cm from the exit end of the containment tube (e.g. between about 20 cm and about 10 cm or between about 20 cm and about 15 cm or between 20 cm and 17 cm) the pressure may be such in the growth chamber whereby a metal nitride film may be grown whereby the film is suitable for device purposes (in such a case the pressure in the growth chamber may be higher than the pressure in the growth chamber when the film/object is between about 20 cm and 25 cm from the exit end of the containment tube in order to reduce ionised nitrogen species and neutral nitrogen species from damaging the film grown on the object e.g. if 3-5 Torr is a suitable pressure in the growth chamber for a distance of 20 cm-25 cm then 5-10 Torr in the growth chamber may be suitable for a distance between 20 cm-17 cm although it will be appreciated that a suitable operating pressure range as well as the optimum pressure will need to be determined by experiment). When the object is located in the growth chamber at a distance of more than about 25 cm from the exit end of the containment tube (e.g. between about 25 cm and about 50 cm or between about 25 cm and about 40 cm or between 25 cm and 30 cm or between 25 cm and 28 cm) the pressure may be such in the growth chamber whereby a metal nitride film may be grown whereby the film is suitable for device purposes (in such a case the pressure in the growth chamber may be the same as or lower than the pressure in the growth chamber when the film/object is between about 20 cm and 25 cm from the exit end of the containment tube in order to reduce ionised nitrogen species and neutral nitrogen species from damaging the film e.g. if 3-5 Torr is a suitable pressure in the growth chamber for a distance of 20 cm-25 cm then 1-3 Torr in the growth chamber may be suitable for a distance between 25 cm-35 cm although it will be appreciated that a suitable operating pressure range as well as the optimum pressure will need to be determined by experiment).

A baffle or impeller may be located between the object and the exit end of the containment tube. The baffle or impeller may be located between in near proximity (e.g. 0-10 cm, 1-8 cm, 1 to 6 cm) to the exit end of the containment tube.

Step (e) may comprise step (e3):
(e3) forming a film of group (III) metal nitride on the heated object whereby the measured band gap of the film is from 70 to 40 meV below the established band gap of the group (III) metal nitride and the film is suitable for device purposes.

Step (e) may comprise step (e4):
(e4) forming a film of group (III) metal nitride on the heated object whereby the measured band gap of the film is from 70 to 40 meV below the established band gap of the group (III) metal nitride and the film is suitable for device purposes.

Step (e) may comprise step (e5):
(e5) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object under conditions whereby the film is a semiconducting film and the film is suitable for device purposes.

Step (e) may comprise step (e6):
(e6) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object under conditions is whereby the film is a semiconducting film and the film is suitable for device purposes wherein during said forming at least one condition applies which condition is selected from the group consisting of:

(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

Step (e) may comprise step (e7):
(e7) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object, under conditions wherein the resistivity of the film is between about 0.0001 and $10^4$ ohm·cm, and the film is suitable for device purposes.

Step (e) may comprise step (e8):
(e8) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object, wherein the resistivity of the film is between about 0.0001 and $10^4$ ohm·cm, and the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

Step (e) may comprise step (e9):
(e9) forming a film of group (III) metal nitride on the heated object under conditions whereby the film exhibits a crystallographic structure characteristic of the group (III) metal nitride and the film is suitable for device purposes.

Step (e) may comprise step (e10):
(e10) forming a film of group (III) metal nitride on the heated object whereby the film exhibits a crystallographic structure characteristic of the group (III) metal nitride and the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

Step (e) may comprise step (e11):
(e11) forming a film of group (III) metal nitride on the heated object under conditions whereby the film exhibits an oxygen concentration less than 1.6 atomic % and wherein the film is suitable for device purposes.

Step (e) may comprise step (e12):
(e12) forming a film of group (III) metal nitride on the heated object whereby the film exhibits an oxygen concentration less than 1.6 atomic % and wherein the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

Step (b) may comprise step (b1):
(b1) producing active neutral nitrogen species in a nitrogen plasma remotely located from the growth chamber wherein the plasma is generated from nitrogen gas comprising impurities less than or equal to 10 parts in one billion parts of nitrogen.

Step (c) may comprise step (c1):
(c1) transferring the active neutral nitrogen species to the growth chamber via a containment tube, said containment tube comprising a tube selected from the group consisting of a silica tube, a quartz tube and a boron nitride tube said tube having an inner surface.

Prior to step (a), step (a') may be performed, step (a') comprising:
(a') contacting at least a portion of the inner surface of the containment tube with a nitrogen plasma at a pressure of from about 10 mTorr to about 100 Torr and for a period of about 1 hour to 100 hours, the contacting at least a portion of the inner surface of the containment tube with a nitrogen plasma causing at least a portion of the silica in the containment tube to react with nitrogen ions in the nitrogen plasma, whereby at least a portion of the silica is converted into a species that does not release oxygen atoms, or releases less oxygen atoms at a pressure of from about 10 mTorr to about 100 Torr.

Step (c) may comprise step (c2):
(c2) transferring the active neutral nitrogen species to the growth chamber such that the active neutral nitrogen species are directed towards a central region of the object, along a path that is located substantially from an angle in the range of 45 degrees to a right angle with a plane containing the object.

According to an embodiment of the invention, there is provided a process for growing a group (III) metal nitride film by remote plasma enhanced chemical vapour deposition, the process including the steps of:
heating an object selected from the group consisting of a substrate and a substrate comprising a buffer layer in a growth chamber to a temperature in the range of from about 400° C. to about 750° C.;
producing active neutral nitrogen species in a nitrogen plasma remotely located from the growth chamber;
transferring the active neutral nitrogen species to the growth chamber;
forming a reaction mixture in the growth chamber, the reaction mixture containing a species of a group (III)

metal that is capable of reacting with the nitrogen species so as to form a group (III) metal nitride film; and, forming a film of group (III) metal nitride on the heated object under conditions whereby the measured band gap of the film is less than about 500 meV below the established band gap of the group (III) metal nitride.

The conditions may comprise one or more conditions selected from the group consisting of (i) at a pressure in the growth chamber; (ii) wherein the object is located in the growth chamber at a distance from where the nitrogen plasma exits a region in which the nitrogen plasma is generated; (iii) wherein a baffle or impeller is located between the object and a source used to remotely generate the nitrogen plasma; (iv) the temperature of the object in the growth chamber; and (v) the partial pressure of oxygen in the growth chamber, whereby the measured band gap of the film is less than about 500 meV below the established band gap of the group (III) metal nitride.

The measured band gap of the film may be less than about 450 meV, less than about 400 meV, less than about 350 meV, less than about 300 meV, less than about 250 meV, less than about 200 meV, less than about 175 meV, less than about 150 meV, less than about 125 meV, less than about 100 meV or less than about 80 meV below the established band gap of the group (III) metal nitride. The measured band gap may be between 500-400, 500-300, 500-200, 500-100, 500-80, 500-60, 500-50, 500-40, 500-30, 500-20, 500-10, 450-400, 400-300, 400-200, 400-100, 400-80, 400-60, 400-50, 400-40, 400-30, 400-20, 400-10, 300-250, 300-200, 300-100, 300-80, 300-60, 300-50, 300-40, 300-30, 300-20, 300-10, 250-210, 250-200, 250-100, 250-80, 250-60, 250-50, 250-40, 250-30, 250-20, 250-10, 200-175, 200-150, 200-125, 200-100, 200-80, 200-70, 200-60, 200-40, 200-30, 200-10, 150-120, 150-100, 150-90, 150-80, 150-60, 150-50, 150-40, 150-30, 150-20, 150-10, 100-90, 100-80, 100-70, 100-60, 100-50, 100-40, 100-30, 100-20, 100-10, 75-70, 75-60, 75-50, 75-40, 75-30, 75-20, 75-10, 65-60, 65-50, 65-40, 65-30, 65-20, 65-10, 60-40, 55-40, 55-45 or 53-47 meV below the established band gap of the group (III) metal nitride.

The measured band gap may be about 500, 475, 450, 425, 400, 375, 350, 325, 300, 275, 250, 225, 200, 175, 150, 125, 100, 90, 80, 75, 70, 65, 60, 55, 50, 45, 40, 35, 30, 25, 20, 15, 10 or 5 meV less than the established band gap of the group (III) metal nitride. The pressure in the growth chamber may be maintained during the forming of the group (III) metal nitride film in the range of about 0.1 to about 15 Torr, 0.5 to 10 Torr, 1 to 7 Torr, 1.5 to 5 Torr, 2 to 4 Torr or 2.5 to 3.5 Torr, for example. The partial pressure of oxygen in the growth chamber may be less than $10^{-2}$, $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr.

According to another embodiment of the invention, there is provided a process for growing a group (III) metal nitride film by remote plasma enhanced chemical vapour deposition, the method including the steps of:

heating an object selected from the group consisting of a substrate and a substrate comprising a buffer layer in a growth chamber to a temperature in the range of from about 400° C. to about 750° C.;

producing active neutral nitrogen species in a nitrogen plasma remotely located from the growth chamber;

transferring the active neutral nitrogen species to the growth chamber;

forming a reaction mixture in the growth chamber, the reaction mixture containing a species of a group (III) metal that is capable of reacting with the nitrogen species so as to is form a group (III) metal nitride film; and, forming a film of group (III) metal nitride on the heated object at a pressure whereby the measured band gap of the film is less than about 500 meV below the established band gap of the film.

The group (III) metal may be gallium.

The position of the plasma generating region in which the nitrogen plasma is generated relative to the object, the distance from where the nitrogen plasma exits a region in which the nitrogen plasma is generated, and the pressure in the growth chamber, may be such that the active neutral nitrogen species generated in the plasma generating region which reach the object during growth of the film have a mean energy of less than or equal to about the group (III) metal-nitride bond energy of the group (III) metal nitride, or prior to growth of the film have a mean energy of less than or equal to about the bond energy of the buffer layer on the substrate.

The active neutral nitrogen species may have a mean energy of less than or equal to about the group (III) metal-nitride bond energy of the group (III) metal nitride, but greater than the thermal energy of the substrate.

The active neutral nitrogen species from the nitrogen plasma may be electrically neutral chemically active species. In the case of gallium nitride, electrically neutral chemically active species from the nitrogen plasma with mean energies greater than or equal to about 2.2 eV may be substantially prevented from reaching the substrate during growth of the gallium nitride film by increasing, in combination, the distance from where the nitrogen plasma exits a region in which the nitrogen plasma is generated to the object and the pressure in the growth chamber. A distance from where the nitrogen plasma exits a region in which the nitrogen plasma is generated to the object of about 20 to 25 cm, a pressure in the growth chamber of between about 2 Torr and about 4 Torr and a baffle or impeller located between the object and a source used to remotely generate the nitrogen plasma has been shown to work well for growth of a gallium nitride film. An increase in the distance from where the nitrogen plasma exits a region in which the nitrogen plasma is generated to the object, and an increase in pressure in the growth chamber increases the number of molecular collisions that electrically neutral chemically active species from the plasma undergo with the background gas species which are at thermal energies, so that the overall mean energy of the electrically neutral chemically active species is reduced. The electrically neutral chemically active species in the case of nitrogen may be atomic nitrogen. This reduction in mean energy must be balanced against the finite lifetime of the electrically neutral chemically active species so that the electrically neutral chemically active species react with the group (III) metal prior to reacting with each other to form non-reactive species that will not participate in film growth.

The electrically neutral chemically active species from the nitrogen plasma with mean energies greater than about 2.2 eV (which, in the case of GaN, is the upper mean energy of the electrically neutral, chemically active species which desirably reach the substrate during GaN growth) may have their energies substantially reduced before reaching the substrate by the use of one or more baffles or impellers. The baffles or impellers reduce the mean energy of the electrically neutral, chemically active species by inducing further collisions with low energy surfaces and other lower energy gas species.

In one embodiment in connection with GaN film growth, electrically neutral chemically active species from the nitrogen plasma with mean energies greater than about 2.2 eV may have their energy reduced before reaching the object by (i) controlling the pressure in the growth chamber, (ii) choosing a suitable distance between the object and where the nitrogen plasma exits a region in which the nitrogen plasma is generated, and (iii) by the simultaneous use of one or more baffles and/or impellers located between the object and a source used to remotely generate the nitrogen plasma.

According to another embodiment of the invention, there is provided a process for growing a group (III) metal nitride film by remote plasma enhanced chemical vapour deposition, the process including the steps of:

heating an object selected from the group consisting of a substrate and a substrate comprising a buffer layer in a growth chamber to a temperature in the range of from about 400° C. to about 750° C.;

producing active neutral nitrogen species in a nitrogen plasma remotely located from the growth chamber;

transferring the active neutral nitrogen species to the growth chamber;

forming a reaction mixture in the growth chamber, the reaction mixture containing a species of a group (III) metal that is capable of reacting with the nitrogen species so as to form a group (III) metal nitride film; and, forming a metal nitride film wherein the metal is selected from the group consisting of gallium, indium, a combination of gallium and aluminium, a combination of gallium and indium, a combination of indium and aluminium, and a combination of gallium, indium and aluminium, on the heated object under conditions whereby the film is a semiconducting film.

The conditions may comprise one or more conditions selected from the group consisting of (i) at a pressure in the growth chamber; (ii) wherein the object is located in the growth chamber at a distance from where the nitrogen plasma exits a region in which the nitrogen plasma is generated; (iii) wherein a baffle or impeller is located between the object and a source used to remotely generate the nitrogen plasma; (iv) the temperature of the object in the growth chamber; and (v) the partial pressure of oxygen in the growth chamber, whereby the film is a semiconducting film.

In the case of gallium nitride and indium nitride films and alloys thereof with each other and with AlN, the film resistivity may be less than about $10^4$, $10^3$, $10^2$, 10, 1, 0.1, 0.01, 0.001 or 0.0001 ohm·cm.

In the case of gallium nitride and indium nitride films the film resistivity may be between $10^4$-0.0001, $10^3$-0.0001, $10^2$-0.0001, $10^1$-0.0001, 1-0.0001, 0.1-0.0001, $10^4$-0.001, $10^3$-0.001, $10^2$-0.001, $10^1$-0.001, 1-0.001, 0.1-0.001, 0.01-0.001, 0.05-0.001, $10^4$-0.002, $10^3$-0.002, $10^2$-0.002, $10^1$-0.002, 1-0.002, 0.1-0.002, 0.01-0.002 or 0.05-0.002 ohm·cm.

The measured band gap of the gallium nitride film may be less than about 500 meV below the established band gap of gallium nitride.

The partial pressure of oxygen may be less than $10^{-2}$, $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr.

According to another embodiment of the invention, there is provided a process for growing a group (III) metal nitride film by remote plasma enhanced chemical vapour deposition, the process including the steps of:

heating an object selected from the group consisting of a substrate and a substrate comprising a buffer layer in a growth chamber to a temperature in the range of from about 400° C. to about 750° C.;

producing active neutral nitrogen species in a nitrogen plasma remotely located from the growth chamber;

transferring the active neutral nitrogen species to the growth chamber;

forming a reaction mixture in the growth chamber, the reaction mixture containing a species of a group (III) metal that is capable of reacting with the nitrogen species so as to form a group (III) metal nitride film; and, forming a film of group (III) metal nitride on the heated object under conditions whereby the film exhibits a crystallographic structure characteristic of the group (III) metal nitride.

The conditions may comprise one or more conditions selected from the group consisting of (i) at a pressure in the growth chamber; (ii) wherein the object is located in the growth chamber at a distance from where the nitrogen plasma exits a region in which the nitrogen plasma is generated; (iii) wherein a baffle or impeller is located between the object and a source used to remotely generate the nitrogen plasma; (iv) the temperature of the substrate in the growth chamber; and (v) the partial pressure of oxygen in the growth chamber, whereby the film exhibits a crystallographic structure characteristic of the group (III) metal nitride or X-ray diffraction reflections characteristic of a crystallographic structure characteristic of the group (III) metal nitride.

The crystallographic structure of the film may be a wurtzite or cubic structure. The film may not be an amorphous film. The group (III) metal nitride may comprise GaN, InN, AlN or alloys thereof and may be a wurtzite or cubic structure or exhibit X-ray diffraction reflections characteristic of a wurtzite structure or cubic structure or a combination thereof. The group (III) metal nitride may comprise GaN, InN, AlN or alloys thereof and may be a wurtzite structure or exhibit X-ray diffraction reflections characteristic of a wurtzite structure characteristic of GaN, InN, AlN or alloys thereof. The measured band gap of the film may be less than about 500 meV below the established band gap of the group (III) metal nitride. The film may be a semiconducting film (except in the case of AlN which is insulating).

The partial pressure of oxygen may be less than $10^{-2}$, $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr.

According to another embodiment of the invention, there is provided a process for growing a group (III) metal nitride film by remote plasma enhanced chemical vapour deposition, the process including the steps of:

heating an object selected from the group consisting of a substrate and a substrate comprising a buffer layer in a growth chamber to a temperature in the range of from about 400° C. to about 750° C.;

producing active neutral nitrogen species in a nitrogen plasma remotely located from the growth chamber;

transferring the active neutral nitrogen species to the growth chamber;

forming a reaction mixture in the growth chamber, the reaction mixture containing a species of a group (III) metal that is capable of reacting with the nitrogen species so as to form a group (III) metal nitride film; and, forming a film of group (III) metal nitride on the heated object under conditions whereby the film exhibits an oxygen concentration less than 1.6 atomic %.

The conditions may comprise one or more conditions selected from the group consisting of (i) at a pressure in the growth chamber; (ii) wherein the object is located in the growth chamber at a distance from where the nitrogen plasma exits a region in which the nitrogen plasma is generated; (iii) wherein a baffle or impeller is located between the object and a source used to remotely generate the nitrogen plasma; (iv) the temperature of the substrate in the growth chamber; and (v) the partial pressure of oxygen in the growth chamber, whereby the film exhibits an oxygen concentration below 1.6, 1.5, 1.4, 1.3, 1.2, 1.1, 1.0, 0.9, 0.8, 0.7, 0.6, 0.5, 0.4, 0.3, 0.2, 0.1, 0.075, 0.05, 0.038, 0.030, 0.010, 0.007, 0.005, 0.003, 0.0009, 0.0007, 0.0005, 0.0003, or 0.0001 atomic %. The partial pressure of oxygen in the growth chamber may be may be less than $10^{-2}$, $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr. The partial pressure of oxygen in the growth chamber may be may be in the range of $10^{-2}$-$10^{-12}$, $10^{-2}$-$10^{-11}$, $10^{-2}$-$10^{-10}$, $10^{-3}$-$10^{-12}$, $10^{-3}$-$10^{-11}$, $10^{-3}$-$10^{-10}$, $10^{-4}$-$10^{-12}$, $10^{-4}$-$10^{11}$, $10^{-4}$-$10^{-10}$, $10^{-5}$-$10^{-12}$, $10^{-5}$-$10^{-11}$, $10^{-5}$-$10^{-10}$, $10^{-6}$-$10^{-12}$, $10^{-6}$-$10^{-11}$, $10^{-6}$-$10^{-10}$, $10^{-7}$-$10^{-12}$, $10^{-7}$-$10^{-11}$, $10^{-7}$-$10^{10}$, $10^{-8}$-$10^{-12}$, $10^{-8}$-$10^{11}$, $10^{-8}$-$10^{-10}$, $10^{-9}$-$10^{-12}$, $10^{-9}$-$10^{-11}$, $10^{-9}$-$10^{-11}$, $10^{-11}$-$10^{-12}$, $10^{-10}$-$10^{-11}$, or $10^{-11}$-$10^{-12}$ Torr. The film may exhibit an oxygen concentration in the range of 1.59-0.01, 1.4-0.01, 1.3-0.01, 1.2-0.01, 1.1-0.01, 1-0.01, 0.9-0.01, 0.8-0.01, 0.7-0.01, 0.6-0.01, 0.5-0.01, 0.4-0.01, 0.3-0.01, 0.2-0.01, 0.1-0.01, 0.075-0.01, 1.59-0.02, 1.4-0.02, 1.3-0.02, 1.2-0.02, 1.1-0.02, 1-0.02, 0.9-0.02, 0.8-0.02, 0.7-0.02, 0.6-0.02, 0.5-0.02, 0.4-0.02, 0.3-0.02, 0.2-0.02, 0.1-0.02, 0.075-0.02, 1.59-0.03, 1.4-0.03, 1.3-0.03, 1.2-0.03, 1.1-0.03, 1-0.03, 0.9-0.03, 0.8-0.03, 0.7-0.03, 0.6-0.03, 0.5-0.03, 0.4-0.03, 0.3-0.03, 0.2-0.03, 0.1-0.03, 0.075-0.03, 1.59-0.038, 1.59-0.0001, 1.59-0.0009, 1.59-0.001, 1.59-0.003, 1.59-0.005, 1.59-0.009, 1.59-0.01, 1.0-0.038, 1.0-0.0001, 1.0-0.0009, 1.0-0.001, 1.0-0.003, 1.0-0.005, 1.0-0.009, 1.0-0.01, 0.5-0.038, 0.5-0.0001, 0.5-0.0009, 0.5-0.001, 0.5-0.003, 0.5-0.005, 0.5-0.009, 0.5-0.01, 0.1-0.038, 0.1-0.0001, 0.1-0.0009, 0.1-0.001, 0.1-0.003, 0.1-0.005, 0.1-0.009, 0.1-0.01, 0.05-0.038, 0.05-0.0001, 0.05-0.0009, 0.05-0.001, 0.05-0.003, 0.05-0.005, 0.05-0.009, or 0.05-0.01 atomic %. The film may be an n type film comprising an n type dopant. The film may be a p type film comprising a p type dopant (in the case of p type films a separate p type doping step will be required). The carrier concentration in the film may be in the range of $10^{16}$-$10^{21}$ carriers/cm$^3$, $10^{17}$-$10^{20}$ carriers/cm$^3$, $10^{17}$-$10^{21}$ carriers/cm$^3$, $5\times10^{17}$-$10^{21}$ carriers/cm$^3$, $5\times10^{17}$-$10^{20}$ carriers/cm$^3$, $5\times10^{17}$-$10^{19}$ carriers/cm$^3$, $10^{17}$-$10^{18}$ carriers/cm$^3$, $10^{17}$-$10^{19}$ carriers/cm$^3$, $7\times10^{17}$-$10^{19}$ carriers/cm$^3$, $10^{18}$-$10^{20}$ carriers/cm$^3$, or $10^{19}$-$10^{20}$ carriers/cm$^3$. The carrier concentration may be a donor or acceptor carrier concentration. The film may be suitable for device purposes. The oxygen concentration of the film may be measured by SIMS. The invention also provides a group (III) metal nitride film (e.g. a GaN film) where the film exhibits an oxygen concentration below 1.6, 1.5, 1.4, 1.3, 1.2, 1.1, 1.0, 0.9, 0.8, 0.7, 0.6, 0.5, 0.4, 0.3, 0.2, 0.1, 0.075, 0.05, 0.038, 0.030, 0.010, 0.007, 0.005, 0.003, 0.0009, 0.0007, 0.0005, 0.0003, or 0.0001 atomic %. The film may exhibit an oxygen concentration in the range of 1.59-0.01, 1.4-0.01, 1.3-0.01, 1.2-0.01, 1.1-0.01, 1-0.01, 0.9-0.01, 0.8-0.01, 0.7-0.01, 0.6-0.01, 0.5-0.01, 0.4-0.01, 0.3-0.01, 0.2-0.01, 0.1-0.01, 0.075-0.01, 1.59-0.02, 1.4-0.02, 1.3-0.02, 1.2-0.02, 1.1-0.02, 1-0.02, 0.9-0.02, 0.8-0.02, 0.7-0.02, 0.6-0.02, 0.5-0.02, 0.4-0.02, 0.3-0.02, 0.2-0.02, 0.1-0.02, 0.075-0.02, 1.59-0.03, 1.4-0.03, 1.3-0.03, 1.2-0.03, 1.1-0.03, 1-0.03, 0.9-0.03, 0.8-0.03, 0.7-0.03, 0.6-0.03, 0.5-0.03, 0.4-0.03, 0.3-0.03, 0.2-0.03, 0.1-0.03, 0.075-0.03, 1.59-0.038, 1.59-0.0001, 1.59-0.0009, 1.59-0.001, 1.59-0.003, 1.59-0.005, 1.59-0.009, 1.59-0.01, 1.0-0.038, 1.0-0.0001, 1.0-0.0009, 1.0-0.001, 1.0-0.003, 1.0-0.005, 1.0-0.009, 1.0-0.01, 0.5-0.038, 0.5-0.0001, 0.5-0.0009, 0.5-0.001, 0.5-0.003, 0.5-0.005, 0.5-0.009, 0.5-0.01, 0.1-0.038, 0.1-0.0001, 0.1-0.0009, 0.1-0.001, 0.1-0.003, 0.1-0.005, 0.1-0.009, 0.1-0.01, 0.05-0.038, 0.05-0.0001, 0.05-0.0009, 0.05-0.001, 0.05-0.003, 0.05-0.005, 0.05-0.009, or 0.05-0.01 atomic %. The film may be an n type film comprising an n type dopant. The film may be a p type film comprising a p type dopant (in the case of p type films a separate p type doping step will be required). The carrier concentration in the film may be in the range of $10^{16}$-$10^{21}$ carriers/cm$^3$, $10^{17}$-$10^{20}$ carriers/cm$^3$, $10^{17}$-$10^{21}$ carriers/cm$^3$, $5\times10^{17}$-$10^{21}$ carriers/cm$^3$, $5\times10^{17}$-$10^{20}$ carriers/cm$^3$, $5\times10^{17}$-$10^{19}$ carriers/cm$^3$, $10^{17}$-$10^{18}$ carriers/cm$^3$, $10^{17}$-$10^{19}$ carriers/cm$^3$, $7\times10^{17}$-$10^{19}$ carriers/cm$^3$, $10^{18}$-$10^{20}$ carriers/cm$^3$, or $10^{19}$-$10^{20}$ carriers/cm$^3$. The carrier concentration may be a donor or acceptor carrier concentration. The film may be suitable for device purposes. The film may exhibit a crystallographic structure characteristic of the group (III) metal nitride or X-ray diffraction reflections characteristic of a crystallographic structure characteristic of the group (III) metal nitride.

The crystallographic structure of the film with an oxygen concentration below 1.6 atomic % may be a wurtzite or cubic structure. The film may not be an amorphous film. The group (III) metal nitride may comprise GaN, InN, AlN or alloys thereof and may be a wurtzite or cubic structure or exhibit X-ray diffraction reflections characteristic of a wurtzite structure or cubic structure or a combination thereof. The group (III) metal nitride may comprise GaN, InN, AlN or alloys thereof and may be a wurtzite structure or exhibit X-ray diffraction reflections characteristic of a wurtzite structure characteristic of GaN, InN, AlN or alloys thereof. The measured band gap of the film may be less than about 500 meV below the established band gap of the group (III) metal nitride. The film may be a semiconducting film (except in the case of AlN which is insulating).

According to another embodiment of the invention, there is provided a process for growing a group (III) metal nitride film by remote plasma enhanced chemical vapour deposition, the process including the steps of:
heating an object selected from the group consisting of a substrate and a substrate comprising a buffer layer in a growth chamber to a temperature in the range of from about 400° C. to about 750° C.;
    producing active neutral nitrogen species in a nitrogen plasma remotely located from the growth chamber wherein the plasma is generated from nitrogen gas comprising impurities less than or equal to 10 parts in one billion parts of nitrogen;
    transferring the active neutral nitrogen species to the growth chamber;
    forming a reaction mixture in the growth chamber, the reaction mixture containing a species of a group (III) metal that is capable of reacting with the nitrogen species so as to form a group (III) metal nitride film; and,
    forming a film of group (III) metal nitride on the heated object.

The plasma may be generated from nitrogen gas comprising impurities less than or equal to 9, 8, 7, 6, 5, 4, 3, 2, 1, 0.7, 0.5, 0.3, 0.1, 0.08, 0.05 parts in one billion parts of nitrogen.

The parts may be on a volume:volume, weight:weight or mole:mole basis or a combination thereof.

The film may exhibit a crystallographic structure characteristic of the group (III) metal nitride or X-ray diffraction reflections characteristic of a crystallographic structure characteristic of the group (III) metal nitride.

The crystallographic structure of the film may be a wurtzite or cubic structure. The film may not be an amorphous film. The group (III) metal nitride may comprise GaN, InN, AlN or alloys thereof and may be a wurtzite or cubic structure or exhibit X-ray diffraction reflections characteristic of a wurtzite structure or cubic structure or a combination thereof. The group (III) metal nitride may comprise GaN, InN, AlN or alloys thereof and may be wurtzite structure or exhibit X-ray diffraction reflections characteristic of a wurtzite structure characteristic of GaN, InN, AlN or alloys thereof. The measured band gap of the film may be less than about 500 meV below the established band gap of the group (III) metal nitride. The film may be a semiconducting film (except in the case of AlN which is insulating). The film may have an oxygen concentration less than 1.59 atomic %.

According to another embodiment of the invention, there is provided a process for growing a group (III) metal nitride film by remote plasma enhanced chemical vapour deposition, the method including the steps of:

heating an object selected from the group consisting of a substrate and a substrate comprising a buffer layer in a growth chamber to a temperature in the range of from about 400° C. to about 750° C.;

producing active neutral nitrogen species in a nitrogen plasma remotely located from the growth chamber;

transferring the active neutral nitrogen species to the growth chamber via a containment tube, said containment tube comprising silica, quartz or boron nitride and having an inner surface;

forming a reaction mixture in the growth chamber, the reaction mixture containing a species of a group (III) metal that is capable of reacting with the nitrogen species so as to form a group (III) metal nitride film; and forming a film of group (III) metal nitride on the heated object;

wherein prior to or during the process, at least a portion of the inner surface of the containment tube may be contacted with a nitrogen plasma, wherein the contact step is performed at a pressure of from about 10 mTorr to about 100 Torr and for a period of about 1 hour to 100 hours, the contact step causing at least a portion of the silica in the containment tube to react with nitrogen ions in the nitrogen plasma, whereby at least a portion of the silica is converted into a species that does not release oxygen atoms, or releases less oxygen atoms at a pressure of from about 10 mTorr to about 100 Torr.

The substrate or the substrate comprising a buffer layer may be heated using the heater of the seventh aspect of the invention.

The plasma may be generated from nitrogen gas comprising impurities less than or equal to 9, 8, 7, 6, 5, 4, 3, 2, 1, 0.7, 0.5, 0.3, 0.1, 0.08, 0.05 parts in one billion parts of nitrogen.

The parts may be on a volume:volume, weight:weight or mole:mole basis or a combination thereof.

The film may exhibit a crystallographic structure characteristic of the group (III) metal nitride or X-ray diffraction reflections characteristic of a crystallographic structure characteristic of the group (III) metal nitride.

The crystallographic structure of the film may be a wurtzite or cubic structure. The film may not be an amorphous film. The group (III) metal nitride may comprise GaN, InN, AlN or alloys thereof and may be a wurtzite or cubic structure or exhibit X-ray diffraction reflections characteristic of a wurtzite structure or cubic structure or a combination thereof. The group (III) metal nitride may comprise GaN, InN, AlN or alloys thereof and may be wurtzite structure or exhibit X-ray diffraction reflections characteristic of a wurtzite structure characteristic of GaN, InN, AlN or alloys thereof. The measured band gap of the film may be less than about 500 meV below the established band gap of the group (III) metal nitride. The film may be a semiconducting film (except in the case of AlN which is insulating). The film may have an oxygen concentration less than 1.59 atomic %.

The silica may be converted to a nitride species.

The heated substrate may be rotated during the forming of the film. The heated substrate may be rotated at a rotation rate in the range of 0.1 to 100, 0.5-50, 0.5-20, 0.5-10, 0.5-5, 0.5-3, 1-100, 1-70, 1-50, 1-30, 1-20, 1-15, 1-10, 1-7, 1-5, 1-3 or 1-2 rotations per minute. The heated substrate may be stationary during the forming of the film.

The active neutral nitrogen species generated in a plasma generating region which reach the substrate during growth of the film may have a mean energy of less than or equal to about the bond energy of the group (III) metal nitride, or prior to growth of the film, may have a mean energy of less than or equal to about the bond energy of the buffer layer on the substrate. The active neutral nitrogen species may be nitrogen atoms.

The currently established band gap of GaN (wurtzite) is about 3.4 eV, GaN (cubic) is about 3.1 eV, AlN (wurtzite) is about 6.2 eV, AlN (cubic) is about 5.2 eV, InN (wurtzite) is about 1.7 eV (although variations of this band gap have been reported in the literature down to 0.65 eV), InN (cubic) is about 1.5 eV. It will be appreciated that variations from these values have been reported in the literature and that the established band gap may change as the material properties of InN are better understood and as better quality material becomes available for analysis. In the case of ternary and quaternary alloys the established band gaps for a given composition and crystal structure may be determined from the literature. In the case of GaAlN (wurtzite alternatively referred to as hexagonal) the band gap will be between 3.4 eV and 6.2 eV depending on the relative amounts of Ga and Al in the alloy, for example.

According to another embodiment of the invention, there is provided a process for growing a group (III) metal nitride film by remote plasma enhanced chemical vapour deposition, the method including the steps of:

heating an object selected from the group consisting of a substrate and a substrate comprising a buffer layer in a growth chamber to a temperature in the range of from about 400° C. to about 750° C.;

producing active neutral nitrogen species in a nitrogen plasma remotely located from the growth chamber;

transferring the active neutral nitrogen species to the growth chamber;

forming a reaction mixture in the growth chamber, the reaction mixture containing a group (III) metal species that is capable of reacting with the nitrogen containing species so as to form a metal nitride film; and, forming a film of group (III) metal nitride on the heated object, wherein either the active neutral nitrogen species or the reaction mixture, or both the active neutral nitrogen species and the reaction mixture, are directed towards a central region of the object, along a path that is located substantially at an angle in the range of 45 degrees to a right angle with a plane containing the substrate.

The process may comprise forming a film of group (III) metal nitride on the heated object wherein either the active neutral nitrogen species or the reaction mixture, or both the active neutral nitrogen species and the reaction mixture, are directed towards a central region of the object, along a path that is located substantially at an angle in the range of 50 degrees to a right angle, 60 degrees to a right angle, 70 degrees to a right angle, 80 degrees to a right angle, 85 degrees to a right angle with a plane containing the object.

The process may comprise forming a film of group (III) metal nitride on the heated object, wherein either the active neutral nitrogen species or the reaction mixture, or both the active neutral nitrogen species and the reaction mixture, are directed towards a central region of the object along a path that is located substantially at right angles with a plane containing the object.

The following information applies to the first aspect and embodiments thereof:

The substrate may comprise one or more metal nitride films disposed on a base substrate or on a buffer layer on a base substrate.

The base substrate may selected from the group consisting of: sapphire, silica, soda lime glass, borosilicate glass, silicon, glass, synthetic sapphire, quartz, and crystalline materials having a lattice closely matched to the group (III) metal nitride.

The group (III) metal species may be an alkyl group (III) metal species, for example, $C_1$-$C_5$ trialkyl group (III) metal (where the metal is Ga, Al and/or In).

The gallium species may be an alkyl gallium, for example, $C_1$-$C_5$ trialkyl gallium, trimethyl gallium, triethyl gallium, ethyldimethyl gallium or tripropyl gallium, or a mixture thereof, for example. The indium species may be an alkyl indium, for example, $C_1$-$C_5$ trialkyl indium, trimethyl indium, triethyl indium, ethyldimethyl indium or tripropyl indium, or a mixture thereof, for example. The aluminium species may be an alkyl aluminium, for example, $C_1$-$C_5$ trialkyl aluminium, trimethyl aluminium, triethyl aluminium, ethyldimethyl aluminium or tripropyl aluminium, or a mixture thereof, for example. A mixture of at least two of an alkyl gallium species and/or an alkyl indium species and/or an alkyl aluminium species may be used.

The temperature may be between about 400° C. to 680° C., or between about 500° C. and about 670° C., between about 520° C. and 670° C., or between about 530° C. and 670° C. or between about 540° C. and 670° C., or between about 550° C. and 670° C., or between about 560° C. and 670° C., between 570° C. and 670° C., between 580° C. and 670° C., between 590° C. and 670° C., between 600° C. and 670° C., between 610° C. and 670° C., between 620° C. and 670° C., between 630° C. and 660° C., or between 640° C. and 660° C. The temperature may be about 600, 605, 610, 615, 620, 625, 630, 635, 640, 645, 650, 655 or 660° C. The pressure in the growth chamber may be maintained during the forming of the group (III) metal nitride film at about 0.1, 0.5, 1.0, 1.5, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.1, 4.2, 4.3, 4.4, 4.5, 4.6, 4.7, 4.8, 4.9, 5, 5.5, 6, 6.5, 7, 7.5, 8, 8.5, 9, 9.5 or 10 Torr.

The substrate may be selected from the group consisting of: sapphire, silica, soda lime glass, borosilicate glass, silicon, glass, synthetic sapphire, quartz, and crystalline materials having a lattice closely matched to the group (III) metal nitride. In the case of gallium nitride the substrate may be zinc oxide, SiC, gallium nitride, HfN, AlGaN, for example. The substrate may comprise a buffer layer of zinc oxide, hafnium nitride, SiC etc located on the substrate.

Where the film to be grown is an alternative group (III) metal nitride film, for example aluminium or indium, the active neutral nitrogen species generated in the nitrogen plasma may reach the substrate with a mean energy of less than or equal to the bond energy of the group (III) metal nitride bond. The metal nitride film may comprise gallium nitride, indium nitride, aluminium nitride, gallium aluminium nitride, gallium indium nitride, indium aluminium nitride or indium gallium aluminium nitride.

According to another embodiment of the invention there is provided a gallium nitride film when obtained by a process as defined in any of the previous aspects of the invention.

The gallium nitride film obtained may have a measured band gap of less than about 450 meV, less than about 400 meV, less than about 350 meV, less than about 300 meV, less than about 250 meV, less than about 200 meV, less than about 175 meV, less than about 150 meV, less than about 125 meV, less than about 100 meV or less than about 80 meV below the established band gap of the group (III) metal nitride. The measured band gap may be between 500-400, 500-300, 500-200, 500-100, 500-80, 500-60, 500-50, 500-40, 500-30, 500-20, 500-10, 450-400, 400-300, 400-200, 400-100, 400-80, 400-60, 400-50, 400-40, 400-30, 400-20, 400-10, 300-250, 300-200, 300-100, 300-80, 300-60, 300-50, 300-40, 300-30, 300-20, 300-10, 250-210, 250-200, 250-100, 250-80, 250-60, 250-50, 250-40, 250-30, 250-20, 250-10, 200-175, 200-150, 200-125, 200-100, 200-80, 200-70, 200-60, 200-40, 200-30, 200-10, 150-120, 150-100, 150-90, 150-80, 150-60, 150-50, 150-40, 150-30, 150-20, 150-10, 100-90, 100-80, 100-70, 100-60, 100-50, 100-40, 100-30, 100-20, 100-10, 75-70, 75-60, 75-50, 75-40, 75-30, 75-20, 75-10, 65-60, 65-50, 65-40, 65-30, 65-20, 65-10, 60-40, 55-40, 55-45 or 53-47 meV below the established band gap of the group (III) metal nitride.

The measured band gap may be about 500, 475, 450, 425, 400, 375, 350, 325, 300, 275, 250, 225, 200, 175, 150, 125, 100, 90, 80, 75, 70, 65, 60, 55, 50, 45, 40, 35, 30, 25, 20, 15, 10 or 5 meV less than the established band gap of the group (III) metal nitride.

The film resistivity of the gallium nitride film obtained may be between $10^4$-0.0001, $10^3$-0.0001, $10^2$-0.0001, 10-0.0001, 1-0.0001, 0.1-0.0001, $10^4$-0.001, $10^3$-0.001, $10^2$-0.001, $10^1$-0.001, 1-0.001, 0.1-0.001, 0.01-0.001, 0.05-0.001, 10-0.002, $10^3$-0.002, $10^2$-0.002, $10^1$-0.002, 1-0.002, 0.1-0.002, 0.01-0.002 or 0.05-0.002 ohm·cm. The gallium nitride film obtained may exhibit an oxygen concentration below 1.6, 1.5, 1.4, 1.3, 1.2, 1.1, 1.0, 0.9, 0.8, 0.7, 0.6, 0.5, 0.4, 0.3, 0.2, 0.1, 0.075, 0.05 or 0.038 atomic %.

Each of the processes of the invention may be performed in the absence of ammonia. The process may be performed in the absence of hydrogen, apart from hydrogen that may be contained in the species of a group (III) metal. Hydrogen gas and ammonia may not be added to the growth chamber. In each of the processes of the invention described above the nitrogen precursor is an active neutral nitrogen species derived from a nitrogen plasma. In each of the processes of the invention described above the nitrogen precursor is an active neutral nitrogen species derived from a microwave generated nitrogen plasma. In each of the processes of the invention described above a baffle or impeller may be used between the microwave generated nitrogen plasma and the substrate. The nitrogen precursor may not be derived from a nitrogen species containing hydrogen. The nitrogen precursor may not be derived from a nitrogen species such as ammonia, hydrazine, alkyl hydrazine (e.g. dimethylhydrazine, diethyl hydrazine, methylethylhydrazine) or mixtures thereof. Films of GaN and InN and mixtures thereof as well as ternary films of Ga, In and Al grown by the processes of the invention may be semiconductive without the need for an additional annealing step.

Apparatus for Growing a Metal Nitride Film

In accordance with a second aspect there is provided an apparatus for growing a group (III) metal nitride film by remote plasma enhanced chemical vapour deposition, the apparatus comprising:

(a) a growth chamber;
(b) an object selected from the group consisting of a substrate and a substrate comprising a buffer layer located in the growth chamber;
(c) a heater located in the growth chamber to heat the object to a temperature in the range of from about 400° C. to about 750° C.;
(d) a vacuum system for evacuating the growth chamber;

(e) a containment tube made of quartz, silica or boron nitride and being in fluid communication with the growth chamber, for transferring a stream of active neutral nitrogen species produced in a nitrogen plasma remotely located from the growth chamber to the growth chamber;

(f) means for forming a reaction mixture in the growth chamber, the reaction mixture containing a species of a group (III) metal that is capable of reacting with the nitrogen species so as to form a group (III) metal nitride film whereby a film of group (III) metal nitride on the heated object is formed under conditions whereby the film is suitable for device purposes.

The apparatus may further comprise:
means for controlling the pressure in the growth chamber in the range of from about 0.1 Torr to about 10 Torr during operation, such that the film is suitable for device purposes.

The apparatus may further comprise:
means for substantially preventing active neutral nitrogen species generated in the nitrogen plasma from reaching the substrate with a mean energy of greater than or equal to the bond energy of the group (III) metal nitride bond during growth of the group (III) metal nitride film, such that the film is suitable for device purposes.

The apparatus may further comprise:
means for controlling the partial pressure of oxygen in the growth chamber such that the film exhibits an oxygen concentration below about 1.6 atomic %, such that the film is suitable for device purposes.

The apparatus may further comprise:
means for generating the nitrogen plasma from nitrogen gas comprising impurities less than or equal to 10 parts in one billion parts of nitrogen, such that the film is suitable for device purposes.

The heater may be a resistance heater comprising:
an electrically resistive base having an upper surface, the base being made of or comprising a material selected from the group consisting of compressed particulate nitride or carbide of boron, silicon or aluminium or combinations thereof; and a heating element located on the upper surface of the base or in association therewith and comprising an electrically conductive member that has a resistance selected such as to generate heat when a current passes through the heating element, wherein the member is made of or comprises carbon fibre.

In accordance with an embodiment of the invention, there is provided an apparatus for growing a group (III) metal nitride film, comprising:
 a growth chamber;
 an object selected from the group consisting of a substrate and a substrate comprising a buffer layer, the object locatable inside the growth chamber, in use, the substrate or buffer layer having a crystal structure that is suitable for growing the metal nitride film thereon;
 a vacuum system for evacuating the growth chamber;
 a containment tube made of quartz, silica or boron nitride and being in fluid communication with the growth chamber, for transferring a stream of active neutral nitrogen species to the growth chamber;
 means for providing a vapour of the metal nitride in the vicinity of the object, during operation of the apparatus, so as to cause a film of solid metal nitride to be formed on the object; and
 means for permitting the film to be suitable for device purposes.

The apparatus may further comprise a sample transfer chamber for receiving a substrate prior to location of the substrate in the growth chamber.

The apparatus may additionally comprise a load lock adapted to isolate the sample transfer chamber from ambient conditions and for preparation of the sample by evacuation of air from the transfer chamber, for subsequent transfer from the sample transfer chamber to the growth chamber.

In accordance with an embodiment of the invention, there is there is provided an apparatus for growing a group (III) metal nitride film, comprising:
 a growth chamber;
 an object selected from the group consisting of: a substrate and a substrate comprising a buffer layer, the object locatable inside the growth chamber, in use, the substrate or buffer layer having a crystal structure that is suitable for growing the metal nitride film thereon;
 a vacuum system for evacuating the growth chamber;
 a containment tube made of quartz, silica or boron nitride and being in fluid communication with the growth chamber, for transferring a stream of active neutral nitrogen species to the growth chamber;
 means for providing a vapour of the metal nitride in the vicinity of the object, during operation of the apparatus, so as to cause a film of solid metal nitride to be formed on the object; and,
 means for controlling the pressure in the growth chamber in the range of from about 0.1 Torr to about 10 Torr during operation, such that the film is suitable for device purposes.

The means for controlling the pressure in the growth chamber may be a valve in communication with the growth chamber, said valve being connected to a vacuum pump In accordance with another embodiment of the invention, there is there is provided an apparatus for growing a group (III) metal nitride film, comprising:
 a growth chamber;
 an object selected from the group consisting of: a substrate and a substrate comprising a buffer layer, the object locatable inside the growth chamber, in use, the substrate or buffer layer having a crystal structure that is suitable for growing the metal nitride film thereon;
 a vacuum system for evacuating the growth chamber;
 a containment tube made of quartz, silica or boron nitride and being in fluid communication with the growth chamber, for transferring a stream of active neutral nitrogen species to the growth chamber;
 means for providing a vapour of the metal nitride in the vicinity of the object, during operation of the apparatus, so as to cause a film of solid metal nitride to be formed on the object; and,
 means for substantially preventing active neutral nitrogen species generated in the nitrogen plasma from reaching the substrate with a mean energy of greater than or equal to the bond energy of the group (III) metal nitride bond during growth of the group (III) metal nitride film, such that the film is suitable for device purposes.

Where the group (III) metal nitride film is gallium nitride, the active neutral nitrogen species may reach the object with mean energies of less than or equal to about 2.2 eV.

Where the group (III) metal nitride film is aluminium nitride, the active neutral nitrogen species may reach the object with mean energies of less than or equal to about 2.88 eV.

Where the group (III) metal nitride film is indium nitride, the active neutral nitrogen species may reach the object with mean energies of less than or equal to 1.93 eV.

The means for substantially preventing active neutral nitrogen species generated in the nitrogen plasma from reaching the object with mean energies greater than or equal to the bond energy of the group (III) metal nitride bond, may comprise at least one impeller or at least one baffle, or combinations thereof. The baffle or impeller may be located between the object and a source used to remotely generate the nitrogen plasma. The impeller may impart centrifugal forces to the active neutral nitrogen species. The impeller may substantially prevent active neutral nitrogen species emitted from the nitrogen plasma from moving along a straight line or a "line of sight" to the object.

In another embodiment of the invention, there is provided there is there is provided an apparatus for growing a group (III) metal nitride film, comprising:
a growth chamber;
an object selected from the group consisting of: a substrate and a substrate comprising a buffer layer, the object locatable inside the growth chamber, in use, the substrate or buffer layer having a crystal structure that is suitable for growing the metal nitride film thereon;
a vacuum system for evacuating the growth chamber;
a containment tube made of quartz, silica or boron nitride and being in fluid communication with the growth chamber, for transferring a stream of active neutral nitrogen species to the growth chamber;
means for heating the substrate to a temperature of between about 400° C. and 750° C., such that the film is suitable for device purposes.

The means for heating the substrate may be the heater according to the seventh aspect of the invention.

In a further embodiment of the invention, there is provided an apparatus for growing a group (III) metal nitride film, comprising:
a growth chamber;
an object selected from the group consisting of: a substrate and a substrate comprising a buffer layer, the object locatable inside the growth chamber, in use, the substrate or buffer layer having a crystal structure that is suitable for growing the metal nitride film thereon;
a vacuum system for evacuating the growth chamber;
a containment tube made of quartz, silica or boron nitride and being in fluid communication with the growth chamber, for transferring a stream of active neutral nitrogen species to the growth chamber;
means for providing a vapour of the metal nitride in the vicinity of the object, during operation of the apparatus, so as to cause a film of solid metal nitride to be formed on the object; and,
means for controlling the partial pressure of oxygen in the growth chamber such that the film exhibits an oxygen concentration below about 1.6 atomic %, such that the film is suitable for device purposes.

The means for controlling the partial pressure of oxygen in the growth chamber may comprise contacting at least a portion of the inner surface of the containment tube with a nitrogen plasma, wherein the contact step is performed at a pressure of from about 10 mTorr to about 100 Torr and for a period of about 1 hour to 100 hours, the contact step causing at least a portion of the silica in the containment tube to react with nitrogen ions in the nitrogen plasma, whereby at least a portion of the silica is converted into a species that does not release oxygen atoms, or releases less oxygen atoms at a pressure of from about 10 mTorr to about 100 Torr. The partial pressure of oxygen may be less than $10^{-2}$, $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr.

In yet a further embodiment of the invention, there is provided an apparatus for growing a group (III) metal nitride film, comprising:
a growth chamber;
an object selected from the group consisting of: a substrate and a substrate comprising a buffer layer, the object locatable inside the growth chamber, in use, the substrate or buffer layer having a crystal structure that is suitable for growing the metal nitride film thereon;
a vacuum system for evacuating the growth chamber;
a containment tube made of quartz, silica or boron nitride and being in fluid communication with the growth chamber, for transferring a stream of active neutral nitrogen species to the growth chamber;
means for providing a vapour of the metal nitride in the vicinity of the object, during operation of the apparatus, so as to cause a film of solid metal nitride to be formed on the object; and,
means for generating the nitrogen plasma from nitrogen gas comprising impurities less than or equal to 10 parts in one billion parts of nitrogen, such that the film is suitable for device purposes.

The means for generating the nitrogen plasma from nitrogen gas comprising impurities less than or equal to 10 parts in one billion parts of nitrogen may comprise purifying the nitrogen gas used to generate the plasma with a gas purifier such as a metal zeolite purifier (e.g. a nickel silicate-based zeolite purifier) for example. In a further embodiment of the invention, there is provided an apparatus for growing a group (III) metal nitride film, comprising:
a growth chamber;
an object selected from the group consisting of: a substrate and a substrate comprising a buffer layer, the object locatable inside the growth chamber, in use, the substrate or buffer layer having a crystal structure that is suitable for growing the metal nitride film thereon;
a vacuum system for evacuating the growth chamber;
a containment tube made of quartz, silica or boron nitride and being in fluid communication with the growth chamber, for transferring a stream of active neutral nitrogen species to the growth chamber;
means for providing a vapour of the metal nitride in the vicinity of the object, during operation of the apparatus, so as to cause a film of solid metal nitride to be formed on the object; and,
wherein the containment tube is located in such a manner relative to the substrate that, during operation of the apparatus, the active neutral nitrogen species are is directed towards a central region of the substrate, along a path that is located substantially at an angle in the range of from 50 degrees to right angles with a plane containing the substrate, such that the film is suitable for device purposes.

The path may be oriented substantially at right angles with a plane containing the substrate.

In accordance with another embodiment of the invention, there is provided an apparatus for growing a group (III) metal nitride film, comprising:
a growth chamber;
an object selected from the group consisting of: a substrate and a substrate comprising a buffer layer, the object locatable inside the growth chamber, in use, the substrate or buffer layer having a crystal structure that is suitable for growing the metal nitride film thereon;
a vacuum system for evacuating the growth chamber;
a containment tube made of quartz, silica or boron nitride and being in fluid communication with the growth chamber, for transferring a stream of active neutral nitrogen species to the growth chamber;

means for providing a vapour of the metal nitride in the vicinity of the object, during operation of the apparatus, so as to cause a film of solid metal nitride to be formed on the object; and, wherein the means for providing the metal nitride vapour in the vicinity of the substrate is located in such a manner relative to the substrate that, during operation of the apparatus, the metal nitride vapour is directed towards a central region of the substrate, along a path that is oriented at an angle substantially in the range of 45 degrees to right angles with a plane containing the substrate, such that the film is suitable for device purposes.

The plane may be oriented at right angles with a plane containing the substrate.

RPECVD is widely recognised as a low damage growth technique, however the inventors have observed that films grown with the RPECVD process could undergo damage by resilient and energetic active neutral nitrogen species, created from the microwave generated plasma. This has led the inventors to consider ways of preventing such species from reaching the film, whilst still allowing low mean energy species to be able to react with the trimethylgallium (or -indium or -aluminium) used to form the metal nitride.

Microwave and RF plasma sources are used for molecular beam epitaxy (MBE) growth of nitride semiconductors. These employ an exit orifice with small holes to maintain a high pressure at the plasma side, with a beam of active species being directed into a chamber with relatively low operating pressure (~$10^{-5}$ Torr). The active species used for growth in MBE systems are often directed around baffles and are apparently able to make their way around the shutters used in these MBE systems. The orifices used for small area MBE sources can also be used to direct the active neutral nitrogen species over quite large areas for film growth. However MBE employs much lower pressures which, despite the use of baffles and shutters, can lead to damage by resilient and energetic active neutral nitrogen species.

It was not expected that for RPECVD a similar situation should hold where active neutral nitrogen species can be directed over a large area for film growth because the active species exit the plasma area in conditions closer to that of a flow regime compared to that for MBE in which a particle beam is employed. The higher growth pressures used in RPECVD, whilst substantially preventing damage to the film, do not seem to be an impediment to allowing a wide area growth from the re-direction of the resilient active neutral nitrogen species created in the microwave plasma.

The means for substantially preventing active neutral nitrogen species generated in the nitrogen plasma from reaching the substrate with a mean energy of greater than or equal to the bond energy of the group (III) metal nitride bond may comprise one or more baffles and/or impellers to redirect plasma flow over a larger area allowing the deposition of a more uniform metal nitride film. The one or more baffles or impellers may be adapted to cause the plasma, or one or more components thereof, to be displaced radially from a central region such as the centre line of a conduit, duct or tube. Alternatively, an impeller in the form of a fan comprising blades or fins arranged in the path of the plasma and located at an angle thereto, may be used for substantially preventing active neutral nitrogen species generated in the nitrogen plasma from reaching the substrate with a mean energy of greater than or equal to the bond energy of the group (III) metal nitride bond.

A baffle or impeller may be used to increase the growth area of the group (III) metal nitride film to increased areas while still using a relatively small area plasma source.

An inherent advantage of the apparatus of the third aspect over MBE systems is the use of higher growth pressures in the chamber which limits film damage during film growth.

The processes and apparatus according to the invention have greatly improved the quality and uniformity of GaN grown by the RPECVD method.

Greater film uniformity allows larger area deposition of GaN than can be achieved conventionally.

The improved growth conditions in the process according to the invention have allowed the use of a ZnO buffer layer to be successfully employed, providing excellent quality GaN films.

A baffle or impeller forming part of the growth system according to the invention allows film growth over a surface area of about 4 inches diameter, which is much larger than was previously believed possible for a small area microwave plasma source.

GaN films grown by the process according to the invention have the potential to provide lattice-matched and thermally matched layers for further epitaxial growth of high quality GaN with low dislocation density on different heterostructure devices.

The deposition process according to the invention is based on conventional MOCVD growth, but allows deposition of a metal nitride at lower temperatures of about 400-650° C. An excimer laser remote from the substrate holder may be used to enhance dissociation of gas molecules into free radicals.

Low temperature group (III) metal nitride growth, such as GaN growth, for example, has some practical advantages. These include the use of lower cost equipment and substrates, the possibility of using buffer layers such as ZnO, SiC, HfN, GaN, AlGaN, etc, the lower inclusion of impurities, sharper interfaces when growing thin layers, and the lower thermal stress between the GaN film and the substrate. The principal shortcomings are weaker film adhesion to the substrate and the possible higher degree of incorporation of hydrogen, oxygen and carbon during growth.

Passivation

In accordance with a third aspect of the invention, there is provided a method for the treatment of an object made of or comprising quartz or silica, the method including the steps of:

contacting at least a portion of the surface of the object with a nitrogen plasma, at a pressure of from about 10 mTorr to about 100 Torr and for a period of from about 1 hour to about 100 hours; and causing at least a portion of the silica in the surface of the object to react with nitrogen ions in the nitrogen plasma, whereby at least a portion of such silica is converted into a species that does not release oxygen atoms or releases less oxygen atoms at said pressure.

In the context of the third aspect, the object may be any object comprising releasable oxygen atoms.

The contacting step is preferably performed at a pressure towards the lower end of the aforementioned range of pressures.

In order to avoid reversion of the species into a species that does release oxygen atoms or is releases more oxygen atoms at said pressure, the object is preferably maintained at the aforementioned pressure of from about 10 mTorr to about 100 Torr under a flow of nitrogen, or at less than 10-6 Torr whilst under vacuum, whilst avoiding contact with air, water vapour or any other substance or gas that contains oxygen. The method according to this aspect of the invention may therefore include the step of preventing the surface of the object from being contacted with air, water vapour or substance or gas that contains oxygen, after conversion of the portion of the surface of the object into said species.

The silica may be converted into a nitride species.

The object may be a containment vessel or tube. The containment vessel or tube may be adapted to be employed in an RPECVD process described above for conducting a nitrogen plasma comprising electrically neutral but chemically active species to a growth chamber before or during a step of growing a film of metal nitride. The metal may be gallium.

In accordance with a fourth aspect of the invention, there is provided a process for growing a nitride film of a metal selected from the group consisting of gallium, aluminium, indium and combinations thereof, including the steps of:
contacting, with a nitrogen plasma, at least a portion of an inner surface of a plasma containment tube made of or comprising quartz or silica, wherein the contacting step is performed at a pressure of from about 10 mTorr to about 100 Torr and for a period of from about 1 hour to about 100 hours; and, thereafter
depositing a film of solid metal nitride, from a vapour of metal nitride, on a suitable substrate provided in a growth chamber, whilst a nitrogen plasma comprising electrically neutral but chemically active species is being conducted through the tube to the growth chamber.

The contacting step is preferably performed at a pressure towards the lower end of the aforementioned range of pressures. The period may be about 5, 7, 10, 11, 12, 13, 14, 15, 16, 17, 18, 19, 20, 21, 22, 23, 24, 27, 30, 33, 36, 40, 45, 50, 55, 60, 65, 70, 75, 80, 85, 90, 95, 100 hours or more.

In order to avoid reversion of the species into a species that does release oxygen atoms or releases more oxygen atoms at said pressure than said species, the object is preferably maintained at the aforementioned pressure of from about 10 mTorr to about 100 Torr under a nitrogen flow, or at less than $10^{-6}$ Torr whilst under vacuum, whilst avoiding contact with air, water vapour or any other substance or gas that contains oxygen.

The contacting step may take place at a temperature of from about 100° C. to about 1000° C.

In the contacting step, at least a portion of the silica present in the surface of the tube may be converted into a species that does not release oxygen atoms or releases less oxygen atoms when the nitrogen plasma is present in the tube and is supplying electrically neutral but chemically active species to the growth chamber through the tube. The species into which the silica is converted may be a nitride based species.

The metal nitride film may be formed by causing a stream of metalorganic vapour, such as trimethylgallium, to react with a stream of ammonia, in the presence of the nitrogen plasma. The metal may be gallium.

The method according to the fourth aspect of the invention may include the step of repeating either the contacting step or the depositing step, or both, until the presence of oxygen in the film of solid metal nitride, as may be measured by a ratio of oxygen atoms to nitrogen atoms in the solid metal nitride film, has decreased to a desired level. In the event that the metal nitride is gallium nitride, the desired level may be below about 0.1 at a depth exceeding about 300 nm from the surface of the gallium nitride film.

The method according to the fourth aspect of the invention may include the step of subjecting the substrate to a vacuum, prior to the deposition of the metal nitride film on the substrate. The pressure in that vacuum may be from about 10 mTorr to about 100 Torr, if a flow of nitrogen is present, or it may be less than 106 Torr in the absence of any gas that is purposely introduced into the growth chamber.

The substrate may be subjected to a vacuum in a growth chamber or in a separate chamber which may be in the form of a loading chamber or load lock. The method according to the fourth aspect of the invention may include the further step of transferring the substrate, after it has been so subjected to the vacuum, from the separate chamber, loading chamber or load lock to the growth chamber. The method may further include the step of preventing the substrate from coming into contact with an oxygen bearing species after it has been subjected to the vacuum.

Furthermore, the method may include the step of heating the substrate or otherwise preconditioning it before growing the metal nitride film on it.

In accordance with a fifth aspect of the invention, there is provided an apparatus for treating or passivating at least a portion of a surface of an object made of or comprising quartz or silica, the apparatus comprising contacting means adapted to provide contact between a nitrogen plasma and the surface or the portion thereof.

The apparatus may further comprise a vacuum system adapted to provide a vacuum in the presence of the at least a portion of the surface of the object. The vacuum system may be adapted to provide the vacuum in the presence of the surface when the apparatus is in use and when it is not in use.

The nitrogen plasma may comprise electrically neutral but chemically active species.

The apparatus may comprise a plasma generator capable of generating a nitrogen plasma.

The apparatus may further comprise a growth chamber in communication with the containment vessel or tube, for growing a gallium nitride film on a suitable substrate, during operation of the RPECVD process.

The apparatus may be adapted to be operated at a pressure of from about 10 mTorr to about 100 Torr. Alternatively or additionally, the apparatus may be adapted to be operated at a temperature of from about 500° C. to about 1000° C., for a period of from about 0.5 minutes to about 100 hours. The partial pressure of oxygen in the apparatus may be less than $10^{-2}$, $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr. The partial pressure of oxygen in the apparatus may be between $10^{-3}$-$10^{-12}$ Torr, $10^{-3}$-$10^{-11}$ Torr, Torr, $10^{-3}$-$10^{-9}$ Torr, $10^{-4}$-$10^{-9}$ Torr, $10^{-5}$-$10^{-9}$ Torr, $10^{-6}$-$10^{-9}$ Torr, $10^{-6}$-$10^{-12}$ Torr, $10^{-7}$-$10^{-12}$ Torr, $10^{-6}$-$10^{-11}$ Torr, $10^{-7}$-$10^{-7}$ Torr, $5 \times 10^{-7}$-$10^{-10}$ Torr, $10^{-7}$-$10^{-9}$ Torr, $10^{-3}$-$10^{-8}$ Torr, $10^{-3}$-$10^{-8}$ Torr, $10^{-5}$-$10^{-8}$ Torr, $10^{-6}$-$10^{-8}$ Torr, $10^{-7}$-$10^{-8}$ Torr, $10^{-3}$-$10^{-7}$ Torr, $10^{-4}$-$10^{-7}$ Torr, $10^{5}$-$10^{-7}$ Torr, $10^{-6}$-$10^{-7}$ Torr, $10^{-2}$-$10^{-9}$ Torr, $10^{-3}$-$10^{-9}$ Torr, $10^{-4}$-$10^{-9}$ Torr, $10^{-5}$-$10^{-9}$ Torr, $10^{-6}$-$10^{-9}$ Torr, $10^{-7}$-$10^{-9}$ Torr, $10^{2}$-$10^{-10}$ Torr, $10^{-3}$-$10^{-10}$ Torr, $10^{-4}$-$10^{-10}$ Torr, $10^{-5}$-$10^{-10}$ Torr, $10^{-6}$-$10^{-10}$ Torr, or $10^{-7}$-$10^{-10}$ Torr.

The apparatus may further comprise a sample transfer chamber for receiving a suitable substrate prior to a gallium nitride film being grown thereon.

Alternatively or additionally, the apparatus may comprise a load lock adapted to isolate the sample transfer chamber from ambient conditions and for preparation of the sample by evacuation of air from the transfer chamber, for subsequent transfer from the sample transfer chamber to the growth chamber.

In accordance with a sixth aspect of the invention, there is provided an apparatus for growing a nitride film of a metal selected from the group consisting of gallium, aluminium, indium and combinations thereof, comprising:

a growth chamber;

a substrate locatable inside the growth chamber, in use, the substrate having a crystal structure that is suitable for growing the metal nitride film thereon;

a vacuum system for evacuating the growth chamber;

a containment vessel or tube made of quartz or silica and being in fluid communication with the growth chamber, for conducting a stream of nitrogen plasma to the growth chamber; and means for providing a metal nitride vapour in the vicinity of the substrate, during operation of the apparatus so as to cause a film of solid metal nitride to be deposited on the substrate, wherein at least a portion of an inner surface of the containment vessel or tube has been converted to a passivated species which does not release oxygen atoms or which releases fewer oxygen atoms, in use.

The nitrogen plasma may comprise electrically neutral but chemically active species. The electrically neutral but chemically active species may be nitrogen atoms.

The conversion to a passivated species may be performed by contacting the surface of the containment vessel or tube, or a portion thereof, with a nitrogen plasma at a pressure of from about 10 mTorr to about 100 Torr for a period of from about 1 hour to about 100 hours.

The passivated species may be a nitride based species.

The means for providing a gallium nitride vapour in the growth chamber may comprise a tube for admitting a stream of trimethylgallium to the growth chamber, upstream of the substrate; and, in some embodiments, a tube for admitting a stream of ammonia to the growth chamber, so as to react with the trimethylgallium, during operation of the apparatus, so as form the gallium nitride vapour.

The pressure at which the surface of the containment vessel or tube is contacted with the nitrogen plasma may be between about 10 mTorr and about 10 Torr, alternatively between about 1 Torr and about 10 Torr. The pressure is preferably below 10 Torr, conveniently from about 1 Torr to about 5 Torr.

The apparatus according to the sixth aspect of the invention may further comprise a vacuum system adapted to provide a vacuum in the presence of the at least a portion of the surface of the object. The vacuum system may be adapted to provide the vacuum in the presence of the surface when the apparatus is in use and when it is not in use.

The apparatus according to the sixth aspect of the invention may further comprise a loading chamber or load lock which is adapted to accommodate the substrate before it is transferred into the growth chamber. The loading chamber or load lock may be capable of being evacuated prior to the substrate being transferred into the growth chamber. The apparatus may comprise transfer means for transferring the substrate from the loading chamber or load lock into the growth chamber. The transfer means may be in the form of a pair of tongs, a conveyor, a shuttle or a suitable vehicle or lifting or lowering device.

The method according to the third aspect of the invention may be conducted at a temperature, at the surface of the containment vessel or tube, of from about 100° C. to about 1200° C. The temperature may be from about 100° C. to about 900° C., alternatively from about 100° C. to about 800° C., or from about 100° C. to about 700° C.

In a preferred embodiment of the invention, the temperature at the surface of the containment vessel or tube is from about 200° C. to about 600° C. The temperature of the quartz containment vessel or tube normally increases to about 200° C. during operation, but it may increase to much higher temperatures within the aforementioned range of temperatures when the silica or quartz contains impurities or when the transfer of heat from the plasma to the tube is greater.

It is to be understood that the temperature of the plasma is generally higher than the aforementioned temperatures of the tube or the containment vessel.

It is to be understood furthermore that the temperature of the surface of the containment vessel or tube may be increasing over a period of time, from when it is first contacted with the plasma, until the surface of the containment vessel or tube has been sufficiently chemically passivated with nitrogen, this process may be assisted by heat transfer to the containment vessel or tube from the plasma.

The nitrogen may be of a high purity. In order to ensure that the gallium nitride film that is grown in an apparatus according to the invention contains as little impurities as possible, and has as few defects as possible, the nitrogen gas for the nitrogen plasma is preferably of a high purity. It preferably contains less than about 10 parts per billion of total impurities, more preferably less than about 5 parts per billion, still more preferably less than 1 part per billion of total impurities. Thus, any moisture, oxygen, carbon dioxide or any other impurities that may be present, are preferably removed before the nitrogen is converted into plasma.

In order to prevent reoxidation of the surface of the containment vessel or tube, it is preferably isolated from air and is preferably kept under vacuum when not in use.

A standard size tube that is frequently used to contain the nitrogen plasma has an outside diameter of about 1 inch (about 25 mm). Tubes having a large diameter have the disadvantage that they may allow microwaves to pass through into the growth chamber, which is undesirable in view of the detrimental effect it has on the gallium nitride film. Larger tubes may however be used in the presence of a magnetic field that still contains the microwaves, and they may also be used when lower radiofrequency or DC electromagnetic excitation are used in place of the microwaves.

The nitrogen plasma may be formed by the employment of microwaves, using a magnetron. The magnetron may have a power rating of up to about 500 Watts.

The power of the magnetron may be from about 450 to about 700 Watts if the power of the magnetron is higher than about 700 Watts, it tends to increase the temperature of the containment tube or vessel, which is undesirable as it may lead to increased dislodgement of oxygen items from the surface of the containment or vessel.

In order to ensure that the nitrogen plasma is stable, the power of the magnetron is increased to a level at which the plasma has a pink colour. The plasma may also be orange in some instances.

The plasma may be generated by using a suitable band width of electromagnetic radiation. The frequency of the electromagnetic radiation may accordingly be in the range from about 0.1 hertz to about 10 Gigahertz.

The frequency of the microwaves is preferably within the range of about 2 Gigahertz to about 3 Gigahertz.

In the event that electromagnetic radiation of a different frequency is required, such as radiofrequency (around 13.56 Megahertz) or where a DC plasma generator is used (O Megahertz), the frequency may be lower.

It is desirable for all water vapour to be removed from the apparatus prior to passivation, and to avoid water vapour and other oxygen containing species from entering the system at any time thereafter. It is believed that the water molecules attach themselves to the walls of the containment tube or vessel and do not contribute much to the total pressure in the system. By incorporating a load lock into an apparatus in accordance with the invention, the increase of water vapour into the apparatus can be minimised if not completely avoided.

The oxygen partial pressure in the apparatus in accordance with the invention may be less than $10^{-7}$ Torr. The partial pressure of oxygen in the apparatus may be less than $10^{-3}$, $10^{-4}$, $10^{-5}$, $10^{-6}$, $10^{-7}$, $10^{-8}$, $10^{-9}$, $10^{-10}$, $10^{-11}$ or $10^{-12}$ Torr. The partial pressure of oxygen in the apparatus may be in the range of $10^{-3}$-$10^{-12}$, $10^{-3}$-$10^{-11}$, $10^{-3}$-$10^{-10}$, $10^{-4}$-$10^{-10}$, $10^{-5}$-$10^{-10}$, $10^{-6}$-$10^{-10}$, $10^{-7}$-$10^{-10}$, $10^{-8}$-$10^{-10}$, or $10^{-9}$-$10^{-10}$ Torr.

The passivation method in accordance with the invention is preferably carried out at about the same pressure as that at which the gallium nitride film is to be grown. Alternatively, a different pressure may be used.

In general, a plasma generated at a low pressure yields nitrogen atoms that have more energy per ion, albeit that there are fewer ions.

The optimum pressure will depend on the dimensions of the containment vessel or tube.

Generally speaking, at higher passivation pressures, the period during which the surface of the containment vessel or tube is to be subjected to the nitrogen plasma may be shorter, whereas where the passivation pressure is lower, the period for which the passivation process needs to be carried out in order to obtain a satisfactory nitridation of the surface of the containment vessel or tube, needs to be longer.

An optimum pressure may be determined by taking into consideration the dimensions of the containment tube or vessel, the microwave energy, and the strength and nature of the materials used. The optimum pressure will also depend on how the system is to be optimised. A residual gas analyser or plasma emission spectroscopy may be used to determine the quality of the nitrogen used for the purposes of the generation of the plasma.

It has been found that, where the surface of a containment vessel or tube made of silica quartz, that has been passivated in accordance with the method of the invention, can yield a gallium nitride film, when grown in accordance with a method according to the second aspect of the invention, that has an oxygen concentration of less than $10^{19}$ atoms per cubic cm.

If the surface of a new silica quartz containment vessel or tube is not passivated, the oxygen concentration in a gallium nitride film grown using such a containment vessel or tube with the RPECVD process may be several percentage points.

For purposes of the manufacture of LED's, a gallium nitride film having an oxygen concentration $10^{20}$ is acceptable. However, for laser diodes, an oxygen concentration of less than $10^{18}$ atoms per cc will be desirable.

The lower the oxygen concentration in a gallium nitride film, the lower its conductivity. It is desirable to grow gallium nitride films having a low conductivity. Oxygen is not a good quality dopant for gallium nitride as it quenches light emission. It is preferable to use silicon as a dopant.

For the purpose of the manufacture of LEDs, a high level of silicon may be used to dope the gallium nitride films. For those applications it will be necessary to have very low concentrations of oxygen.

What is desirable is to have a gallium nitride film at a very low level of doping, whilst the is residual carriers have a very high mobility.

It is desirable for the electron mobility in the gallium nitride film to be more than about 50, preferably in the range of from about 50 to about 1200.

Ions created in an RF plasma tend to be a lot more energetic and to penetrate more into the quartz than ions generated in a microwave plasma.

The microwaves provide an electric field which strips the electrons of purified molecular nitrogen gas. It is the electric field of the electromagnetic radiation that generates the plasma.

If the nitrogen plasma is flickering, the power is too low and should be increased. If the colour remains a bright pink, the power is at a satisfactory level. An orange colour indicates that higher energy transitions are occurring in the nitrogen plasma and that the plasma is therefore more energetic.

The distance between the plasma and the substrate should be sufficient so as to prevent ions from the plasma reaching the gallium nitride film as these are energetic and can cause damage to the film.

The more impurities there are in the silica or quartz, the more its temperature will tend to increase when a nitrogen plasma is generated inside the tube or vessel.

A metal zeolite purifier may be used to purify the nitrogen gas used for the generation of the plasma.

In order to prepare the vacuum system, it may be first subjected to an increased temperature whilst under vacuum maintained by pumping out air from the apparatus until the pressure has dropped to an operating pressure falling within the aforementioned range of pressures.

The gallium nitride film is grown at a temperature of approximately 650° C., using the RPECVD process. In the conventional MOCVD process, the growth temperature is of the order of about 1000° C.

The invention includes within its scope the use of RF plasmas and DC plasmas.

The invention also includes within its scope the use of microwaves, at a frequency of about 2.45 GHz, which are not contained by a magnetic field. In that case, the diameter of the containment tube may be of the order of from about 0.5 cm to about 2-3 cm. Even smaller diameters than 0.5 cm may be required if it is necessary to prevent the microwaves from being transmitted into the growth region. For higher microwave frequencies, smaller tube dimensions are required to prevent the microwave transmission from entering the growth chamber, whilst for lower microwave frequencies larger tube dimensions may be used.

As a further alternative, an RF Helicon source may be used. Such a source may operate with a tube of 30 cm diameter. Microwaves may also be operated with this diameter tube if magnetic confinement is applied, such as where, for instance, an ECR (electron cyclotron resonance) plasma source is used, since the microwave power is absorbed by the plasma more efficiently in the region of magnetic confinement.

Larger diameters, up to about 60 cm, might be used with proper attention to confinement and plasma uniformity.

With the improved vacuum conditions used in the RPECVD process, and because of infrequent exposure of the containment vessel or tube to air, resulting from the introduction of a load lock, so that a sample substrate is placed in a separate container before being introduced into the main growth chamber (which is not exposed to air), the predominant chemical reaction taking place in the surface of the fused silica or quartz is believed to be:

$$SiO_{2(solid)} + N_{2(plasma)} \rightarrow Si_xN_{y(solid)} + N_2O_{(gas)} \qquad (2)$$

It is further believed that, as the reaction proceeds, $Si_xN_y$ species build up on the surface of the containment vessel or tube, so that less $SiO_2$ is available for nitrous oxide production, whereby the amount of oxygen released from the surface decreases and the vessel or tube becomes passivated.

The invention has the advantage that the quartz (or fused silica) used to contain the plasma is "passivated" i.e. it is rendered chemically inert so that oxygen species are not liberated from the quartz (silica) walls, during growth of a gallium nitride film, at levels that affect the quality of the film. The passivation method may be used as part of the processes described in the first aspect and in the embodiments thereof.

It has been found that the amount of oxygen released from the tube gradually decreases in concentration during and even after the initial conditioning step as the tube wall probably becomes passivated with a nitride based surface. The passivation process may take up to 0.75 to 5 days or more, 0.8 to 3 days or 1 to 2 days. The passivation process may take 0.75, 0.8, 0.9, 1, 1.1, 1.2, 1.3, 1.4, 1.5, 1.6, 1.7, 1.8, 1.9, 2, 2.25, 2.5, 2.75, 3, 4.25, 4.5, 4.75, 5, 6, 7, 8, 9, 10 or more days.

It has furthermore been found that, provided the tube is kept under ultra-high vacuum (UHV) conditions, without exposure to air or to a hydrogen bearing plasma, and provided the system is not left idle for long periods between film growths, the passivation can remain intact for an unlimited number of film growths thereafter, since it will be reinforced by the use of a nitrogen plasma during each film growth. If the apparatus for some reason has to be left idle for a period of weeks between film growths, a short nitrogen plasma re-passivation period (of perhaps 1 to 3 hours, depending upon residual impurities in the vacuum system) will be necessary to again lower the oxygen release from the tube wall. If, however, the tube is exposed to air at any stage, or in the event that the plasma contains ammonia or other hydrogen related species (hydrogen based plasmas will cause tube etching, which will remove the passivated layer) then the re-passivation process will again take up to 0.75 to 5 days or more, 0.8 to 3 days or 1 to 2 days. The re-passivation process may take 0.75, 0.8, 0.9, 1, 1.1, 1.2, 1.3, 1.4, 1.5, 1.6, 1.7, 1.8, 1.9, 2, 2.25, 2.5, 2.75, 3, 4.25, 4.5, 4.75, 5, 6, 7, 8, 9, 10 or more days.

Water vapour is usually the main residual oxygen bearing species in an older UHV environment and it is believed that exposure to the residual water vapour in the growth system causes a slow degradation of the passivated $Si_xN_y$ layer resulting in the hydrolysis of the nitride layer and the formation of silicon hydroxide and oxide species. Hence, if the system is left for a long period, for example more than 2 weeks, the time required for re-passivation will be considerably more than when it is used continuously, as the build-up of this hydroxide or oxide layer on the inner surface of the tube will be greater.

With the higher amount of residual water vapour present in the older HV system, the reaction path give by equation 2 could not be achieved, as the competing reaction of tube hydrolysis ensured that oxygen was being constantly resupplied to the tube surface during the tube nitridation process. The continual reopening of the system also exposed the tube to high levels of water vapour (even with the presence of a nitrogen gas flow from the system during opening) and ensured that the background water vapour level was resupplied to a much higher minimum level than can be achieved with the new UHV system.

Secondary ion mass spectroscopy (SIMS) results, for GaN samples grown by REPCVD at 650° C. with the passivated tube, show that the oxygen levels are considerably lower for the UHV system and are low compared to films grown by metalorganic chemical vapour deposition at approximately 1000° C.

The apparatus in accordance with the invention allows the RPECVD method of film growth to be used for the growth of nitride films without significant oxygen contamination from the quartz (silica) plasma containment tube.

The process according to the invention also offers the advantage that a gallium nitride film can be grown using the RPECVD method of film growth, which means that the film can be grown at significantly lower temperatures.

The process according to the invention has the further advantage that nitrogen can be used as a source rather than ammonia, which means that hydrogen contamination originating from the ammonia can be avoided.

Lower temperature growth of good quality GaN will lower the cost of GaN LED based room lighting.

The present invention is therefore a significant step towards using the RPECVD method for producing GaN films, whilst still achieving the same quality of film as is achievable by the MOCVD method.

It should be noted that the terms "conducting" and "transferring" in the context of moving the active neutral nitrogen species from the nitrogen plasma to the growth chamber are understood to have the same meaning.

Heater Apparatus

According to a seventh aspect of the invention, there is provided a resistance heater comprising:
    an electrically resistive base having an upper surface, the base being made of or comprising a material selected from the group consisting of compressed particulate nitride or carbide of boron, silicon or aluminium or combinations thereof; and
    a heating element located on the upper surface of the base or in association therewith and comprising an electrically conductive member that has a resistance selected such as to generate heat when a current passes through the heating element, wherein the member is made of or comprises carbon fibre.

The material may also comprise a refractory composite that may include other materials such as boron oxide or titanium diboride.

As used herein, the phrase "located on the upper surface of the base or in association therewith" is to be understood as including embodiments wherein the heating element is located on the surface, in a groove provided in the surface, embedded in the surface or in a passage underneath the surface.

Whilst the resistance heater according to the invention may be operated at lower temperatures ranging from any temperature above ambient temperature, it is particularly suitable for use under the aggressive operating conditions, at high temperatures, such as those encountered in the MBE and RPECVD processes. For use in these and other applications where a high temperature is required, the heater may be operated to generate heat at a temperature of from about 1000° C. to about 1600° C., or from about 1000° C. to about 1500° C., preferably from about 1200° C. to about 1500° C.

Base

The base may conveniently be shaped from compressed particles of boron nitride or aluminium nitride which may be sintered together during or after compression. In the event that it is made of compressed boron nitride, the boron nitride may be selected from hexagonal boron nitride, cubic boron nitride, wurzite boron nitride and rhombohedral boron nitride. Boron nitride tends to become red hot at an operating temperature of about 1300° C. to about 1400° C.

The base is preferably shaped from a machinable, compressed and sintered particulate boron or aluminium nitride material. To be machinable in the context of conventional metal cutting techniques and steel workshop tools, the material needs to have appropriate mechanical strength, lubricating, elasticity, modulus, hardness and other properties. In practice, machinable ceramics, such as machinable forms of boron nitride, tend to be very soft to machining tools, compared to metals, as they break into powder under the machine cutting edges. Pyrolytic boron nitride is extremely hard and brittle and does not easily break into a powder form, so that tools with diamond cutting edges are often required for it to be machined.

In the hot pressed state, hexagonal boron nitride (h-BN) is readily machinable, hence a base having a complex can be fashioned from a hot pressed billet.

Providing oxidation of the surface can be prevented, h-BN is not wetted by most molten metals, glasses and salts and hence has a high resistance to chemical attack. It also has a high dielectric breakdown strength, high volume resistivity and good chemical inertness. Typical properties for hexagonal boron nitride, in comparison with cubic boron nitride, are as follows:

TABLE 1

| Property | h-BN | C-BN |
|---|---|---|
| Density (g·cm$^{-3}$) | 2.3 | 2.2 |
| Melting Point (° C.) | 3000 (dissociates) | |
| Hardness (Knoop 100 g) (kg·mm$^{-1}$) | 400 | |
| Modulus of Rupture (MPa) | 100 (ll to press dir) | 110 |
| | 50 (⊥ to press dir) | |
| Young's Modulus (MPa) | 20-103 | |
| Thermal Expansion Co-eff (RT-1000° C.- x10$^{-6}$)(° C.$^{-1}$) | 1 (ll to press dir) | 3.8 |
| | 4 (⊥ to press dir) | |
| Thermal Conductivity (W/m·° K) | 20 (ll to press dir) | |
| | 27 (⊥ to press dir) | |
| Dielectric Breakdown Strength (kV·mm$^{-1}$) | 35 | |
| Dielectric Constant | | 4.1 |
| Vol Resistivity (ohm·cm) | 10$^8$-10$^{13}$ | |

Source: http://www.azom.com/details.asp?ArticleID=78#_Electrical_insulators.
Note:
The data in this table for h-BN were taken from a hot pressed sample. As this is a highly directional forming process, properties are anisotropic i.e, they differ in directions relative to the pressing direction. For this reason, some values are in practice higher than those reported in the attached property table.

Pyrolytic boron nitride generally has very few impurities (<100 parts per million), whereas machinable boron nitride usually contains much higher levels of impurities, e.g. in the percentage range. As an example, around 5% to 10%, typically 6% by weight, calcium borate is used as a binder in one instance and almost 1% to 10%, typically about 5% by weight, of boric oxide is used in another instance (see for instance http://www.advceramics.com/geac/products/bn-_shapes/). The material used for the base may be less pure than pyrolytic boron nitride, for applications where large amounts of ammonia are not used in the growth chamber, and provided that the operating temperature of the heater during growth does not exceed about 1500° C.

As stated above, the base may alternatively be made of aluminium nitride. Aluminium nitride has a higher thermal conductivity than boron nitride and is better able to distribute the heat generated by the heating element under operating conditions. Aluminium nitride is specifically of interest for its very high thermal conductivity in combination with its effective electrical insulation. A base made of aluminium nitride may be produced by dry pressing and sintering or by hot pressing with appropriate sintering aids. The material suffers surface oxidation above about 700° C.

Aluminium nitride has a very good thermal conductivity. Its thermal expansion coefficient is similar to that of silicon. It also has good dielectric properties and good corrosion resistance. It is stable in atmospheres encountered in MBE and RPECVD processes.

Hot-pressed (sintered) particulate nitrides and carbides usually contain higher concentrations of impurities than pyrolytic boron nitride. Where films are grown by molecular beam epitaxy (MBE), the background vacuum has to be much lower than in the case of RPECVD growth. Surprisingly, in the RPECVD process, it is not disadvantageous to use hot-pressed particulate nitrides or carbides as their impurities do not have any noticeable effect on the quality of metal nitride films grown using the heater according to the invention. In the event that the heater according to the invention is to be used in the MBE process, care should be taken to use only materials which would not cause contamination of the films to be grown in that process under the relatively low pressure conditions used therein.

The hot-pressed and sintered particulate nitride or carbide may be made by compressing a suitable powder thereof containing additives like rare earth metal oxides. When the particulate nitride or carbide powder is hot-pressed, its structural transformation and bonding evolution between powder grains make it compact and very stable to be used as a heat dissipater. The hot-pressed particulate material is very cheap compared to pyrolytic boron nitride.

In the event that the base is made of machinable hexagonal boron nitride, the thermal conductivity of the base at 25° C. may be from about 11 W/m.° K. to about 70 W/m.° K., preferably from about 20 W/m.° K. to about 60 W/m.° K., more preferably from about 30 W/m.° K. to about 50 W/m.° K. A higher thermal conductivity within the aforementioned ranges is preferable.

In the event that the base is made of machinable cubic boron nitride, the thermal conductivity of the base, at 25° C., in the a axis direction, may be from about 50 W/m.° K. to about 150 W/m.° K., preferably around 100 W/m.° K., say about 105 W/m.° K. A higher thermal conductivity within the aforementioned range is preferable.

In the event that base is made of machinable aluminium nitride, the thermal conductivity of the base, at 25° C., may be from about 100 W/m.° K. to about 250 W/m.° K., preferably between about 150 W/m.° K. to about 200 W/m.° K., say around 175 W/m.° K. A higher thermal conductivity within the aforementioned range is preferable.

The electrical resistivity of the base is preferably very high, in order to prevent it from short-circuiting the heating element. The base may thus have an electrical resistivity of at least about 100 Ω.cm, preferably at least about 1 KΩ·cm.

In the event that boron nitride is used, its resistivity may be from about 10$^8$-10$^{13}$ Ω.cm, as is stated above in Table 1.

The base may be manufactured by compressing or moulding boron or aluminum nitride or silicon carbide particles at a pressure of from about 1 GPa to about 100 GPa, preferably about 7.7 GPa, and at a temperature of from about 1300° C. to about 1700° C., preferably from about 1400° C. to about 1600° C., preferably about 1500° C., so as to cause the particles to sinter and form a solid matrix upon cooling to ambient conditions. In this way, individual carbide or nitride particles may be bonded together.

Compressed boron nitride that is machinable may be obtained from GE-Advanced Ceramics, Saint-Gobain Ceramics, International Ceramic Engineering, etc.

Groove

The base may have a groove formed in its upper surface and the heating element may be located therein.

The groove may be machined into the upper surface of the base after compression. The machining step may be a milling procedure. Alternatively, the groove may be formed by a complementary ridge in a suitable mould or press used for shaping the base such as where the base is hot pressed therein.

The groove may have any shape. In the event that the length of the heating element exceeds the diameter or width of the upper surface, the heating element may be shaped so as to form a spiral, a helix, a loop, a circle, a rectangle, a square or any other shape that is convenient for effective heat transfer to the substrate on which the film is to be grown. The groove may have the same shape as the heating element of a stove.

In one embodiment, the groove is shaped so as to locate both of its ends near the centre of the upper surface of the base. In another embodiment, the ends of the groove are located near the perimeter of the upper surface. In still another embodiment of the invention, the ends of the groove are located at opposite extremities of the upper surface.

The length of the groove may be selected so as to provide a path length sufficient to accommodate a heating element having a required resistance. The length may vary according to the size of the heater, the resistivity of the material from which the heating element is made, the current that is to be passed through the heating element at operating temperature, the required operating temperature and other considerations. Using a flexible carbon fibre as a heating element has the advantage that the groove may be curved or shaped as mentioned above, in order to be positionable below and cover or be located opposite an area on the underside of the substrate that has to be heated from below when the sample is being grown on a top surface thereof. The length of the groove may accordingly vary over a very wide range.

More than one groove may be provided in the surface of the base, and they may be separate or interconnected. Each groove may accommodate a heating element, and the heating elements may be the same or different in terms of their capabilities to heat the substrate. The heating elements may be connected to different electric circuits so that they may be operated independently of one another.

The groove may be deep enough to accommodate the entire thickness of the heating element or, alternatively, it may be shallower that the thickness of the heating element.

Heating Element

The heating element may comprise a carbon fibre or a bundle of carbon fibres. As an alternative, it may be made of silicon carbide.

Silicon carbide has some desirable properties such as a low thermal expansion coefficient, little deformation, stable chemical properties, long service life, easy installation and maintenance, etc. Silicon carbide heating elements may be used for temperatures from about 100° C. to about 1600° C. typically for higher temperatures within the aforementioned range, such as temperatures ranging from about 600° C. to about 1600° C., particularly for temperatures between about 1000° C. and about 1600° C., or between about 1200° C. and about 1500° C. They may be directly used in an air atmosphere without any protective blanket gas.

As another alternative, a ceramic material impregnated with graphite or carbon may be used as the heating element. The amount or percentage of carbon or graphite impregnated into the ceramic element may be varied to suit a particular application or to provide a desired resistivity in the heating element.

The heating element may be packed into the groove with particulate boron nitride, which may be in the form of a paste.

In a preferred embodiment of the invention, the heating element comprises carbon fibre made from polyacrylonitrile.

It has been found that a commercially available carbon fibre used for building model aeroplanes is particularly suitable.

The heating element may comprise a plurality of strands or fibres of carbon which may be braided to form a rope-like composite. The heating element may comprise up to about 12000 individual strands of carbon fibre. The carbon fibre may be encapsulated in a suitable capsule that can withstand the operating temperature of the heater and the harsh operating conditions of the growth chamber.

A Torayca™ carbon fibre designated T300-1000, supplied by Toray Carbon Fibres America, Inc, has been found to work well.

The carbon fibre may have a coefficient of thermal expansion in the axis direction of from about $-0.4$ to about $-1.0 \times 10^{-6}/°$ K. A coefficient of thermal expansion of $-0.41 \times 10^{-6}/°$ K. has been found to be low enough to ensure that the carbon fibre does not warp within the groove when it is subjected to the operating temperatures in an RPECVD growth system. The length of the carbon fibre may be calculated as a function of the amount of heat that is required to be delivered by the heater. A total resistance of about 10 to 20 ohm is required for a heater for use in the RPECVD growth system. It is advantageous to keep the voltage and the current low in the growth chamber.

The carbon fibre may have an electrical resistivity of from about 0.1 to about $10 \times 10^{-3}$ $\Omega$.cm. It has been found that a braided carbon fibre comprising from about 1000 to about 3000 fibres, each having a resistivity of about $1.7 \times 10^{-3} \Omega$.cm, provides a resistance of about 12 to 20$\Omega$ over a convenient length of about 31 cm so as to generate about 125 to 200 Watt heat when driven with a 50 V power supply.

Carbon fibres are usually made for their exceptional strength in a longitudinal direction and not for their potential use as heating elements in heaters. In the heater according to the invention, strength is not a serious consideration, whereas electrical conductivity is. Some of the characteristics of carbon fibres that may be important for their use in conventional applications include their strength, modulus, density, uniformity (of mechanical properties), resistance to environmental attack and compatibility with other materials. It has been found that these properties are generally not in conflict with their use as a heating element in the heater according to the invention.

The carbon fibre may be in the form of a cable made up of many filaments, so as to give it enough strength when handling, wrapping around corners in the groove of the base, and to enable it to stay in the groove when doing the electrical connections interconnecting the heater with an electric circuit. The carbon fibre is preferably pre-braid to avoid fraying while handling it and mounting it in the heater. Its thermal conductivity may be from about 0.01 to about 0.1 Cal/cm.s.° C., preferably in the region of about 0.025 Cal/cm.s.° C. Its electrical conductivity may be from about 1000 $\mu\Omega$.cm to about 10000 $\mu\Omega$.cm, preferably in the region of about 1700 $\mu\Omega$.cm.

The carbon fibres may for example be Hexcel or Torayca™ carbon fibres. The inventors have found that carbon fibres made by Eurocarbon BV and designated T300 give good results.

A variety of braided cables are commercially available from Eurocarbon BV (www.eurocarbon.com). Light weight (3KT300) or medium weight (6KT300) braided carbon fibres may be used. The braided carbon fibre may have a diameter (measured at approximately 45° C.) of from about 5 mm to about 15 mm and may have a weight of about 7 g/m to about 20 g/m. The thickness at 50% FV may vary from about 0.31 mm to about 0.48 mm.

Other types of carbon fibre that may be used, can be found in Table 2:

TABLE 2

Strength and Modulus Figures for Commercial PAN-based Carbon Fibres.

| Grade | Tensile Modules (GPa) | Tensile Strength (GPa) | Country of Manufacture |
|---|---|---|---|
| Standard Modulus (<265 GPa) (also known as "High Strength") | | | |
| T300 | 230 | 3.53 | France/Japan |
| T700 | 235 | 6.3 | Japan |
| HTA | 230 | 3.95 | Germany |
| UTS | 240 | 4.8 | Japan |
| 34-700 | 234 | 4.5 | Japan/USA |
| ASA | 241 | 4.0 | USA |
| T650-35 | 241 | 4.55 | USA |
| Panex33 | 226 | 3.6 | USA/Hungry |
| F3C | 228 | 3.8 | USA |
| TR50S | 235 | 4.83 | Japan |
| TR30S | 234 | 4.41 | Japan |
| Intermediate Modulus (265-320 GPa) | | | |
| T800 | 294 | 5.94 | France/Japan |
| M30S | 294 | 5.49 | France |
| IMS | 295 | 4.12/5.5 | Japan |
| MR40/MR50 | 289 | 4.4/5.1 | Japan |
| IM6/IM7 | 303 | 5.1/5.3 | USA |
| IM9 | 310 | 5.3 | USA |
| T650-42 | 290 | 4.82 | USA |
| T40 | 290 | 5.65 | USA |
| High Modulus (320-440 GPa) | | | |
| M40 | 392 | 2.34 | Japan |
| M40J | 377 | 4.41 | France/Japan |
| HMA | 350 | 3.0 | Japan |
| UMS2526 | 335 | 4.56 | Japan |
| MS40 | 340 | 4.8 | Japan |
| HR40 | 381 | 4.8 | Japan |
| Ultra High Modulus (~440 GPa) | | | |
| M46J | 436 | 4.21 | Japan |
| UMS3536 | 435 | 4.5 | Japan |
| HS40 | 441 | 4.4 | Japan |
| UHMS | 441 | 3.45 | USA |

Information from manufacturer's datasheets

Source: David Cripps, SP Systems (http://www.spsystems.com)

Where the heater according to the invention is to be used in the MBE or RPECVD processes, the heater element may comprise from 3 to 20 bundles of single filaments, and each bundle may comprise from 50 to 50000 filaments. The inventors have found that a braided carbon fibre cable consisting of 12 bundles (each consisting of 1000 single filaments) works particularly well.

The ends of the carbon fibre may be connected to an electric circuit. The connections may be via platinum or gold wires or connectors. Contacts may alternatively be provided via a molybdenum sheet rolled into a cylinder with one end of a wire or the heating element projecting into one end of the cylinder and a contact or platinum or gold wire introduced into the other end of the cylinder before it is cramped onto the ends of the wire and heating element.

If platinum wire is used, it may be of sufficient diameter and shortness of length to ensure that it does not contribute significantly to the overall resistance of the heating element, as platinum has a relatively high resistivity and could possibly melt if the temperature of the heating element and connectors rises above the melting point of platinum.

The braided carbon fibre may be pulled hard around the curves of the groove, so as to prevent the carbon fibre coming out of the groove and shorting on itself.

The atmospheres encountered in the MBE and RPECVD processes are generally reducing. Carbon fibre does not deteriorate under the reducing conditions encountered in the aforementioned processes. It also does not suffer embrittlement in the gases used in the RPECVD or MBE processes. However, where the heater is to be used in an oxidizing atmosphere, such that there is a risk that carbon fibre may be oxidized, it would be advantageous to use silicon carbide rather than carbon fibre as the material of construction of the heating element.

Overlay

The heater may further comprise a heat transmissive overlay covering the heating element. The heat transmissive overlay may conveniently be made of sapphire or quartz. It may be sized so as to prevent or at least impede carbon that has evaporated from the heating element, from condensing on to a metal nitride layer which is being grown on the substrate in a growth chamber.

The overlay may be thermally conductive to provide even and homogeneous temperature distribution onto the substrate during crystal growth of the metal nitrides.

The heat transmissive overlay may be made of sapphire or quartz. In the event that the overlay is made of sapphire or quartz, the overlay may have a transmissivity to heat of from about 60% to about 90%, depending on its thickness. The thickness may vary from about 50 micrometers to about 2 mm. In the event that thickness is about 500 micrometers, the transmissivity may be about 85%. Alternative thicknesses may be 100 micrometers, 200 micrometers, 300 micrometers, 400 micrometers, 600 micrometers, 700 micrometers, 800 micrometers, 900 micrometers, 1 mm, 1.5 mm, etc. It has been found that sapphire is a good material of construction for the overlay as it has a high thermal transmissivity and allows a substantial portion of the heat generated by the heating element to be transferred by radiation to the substrate on which the film is grown. Boron nitride does not work well as a heating element overlay.

The overlay does not have to be made of very pure material, as long as the impurities therein do not absorb too much heat. The overlay preferably does not absorb more than about 20%, more preferably not more than about 15%, still more preferably more than about 10%, even more preferably more than about 5% of the heat radiated by the heating element.

Support

The base may be positioned on a support made of a suitable material such as ceramics material, alumina, silica, etc., to insulate the heater from its environment and to ensure that most of the heat generated by the heating element is directed towards the substrate on which film growth occurs.

Thermocouples

The heater may also comprise one or more thermocouples for measuring temperature. One thermocouple may be connected to the top surface of the base. Another may be connected to the top surface of the overlay.

The thermocouple may be connected to any part of the heater. One or more thermocouples may be connected to the heater. A further thermocouple may be connected to the substrate on which the metal nitride film is to be grown. Another thermocouple may be connected to the heating element, although this is undesirable, particularly in the case of a heating element made of carbon fibre. In order to determine what the temperature of the substrate is when a metal nitride film is being grown thereon, one thermocouple may be connected to the substrate whilst another one may be connected to any convenient part of the heater, so that a relationship between the temperature of the substrate and the temperature of the particular part of the heater can be determined during operation. The inventors have found that a convenient part of the heater where the thermocouple may be located, is the support for the base. To calibrate the temperature of the substrate against the temperature of the part of the heater, the relationship in temperature between the temperature of the substrate and the temperature of the part of the heater where the other thermocouple is located can be determined over a range of temperatures so that under normal operating conditions, when a film is grown on the substrates, a thermocouple is not connected to the substrate but only to that part of the heater where it was connected during calibration of the temperature relationship.

According to an eighth t aspect of the invention, there is provided a method of heating an object, including the steps of:
  positioning an electrically resistive base having an upper surface in close proximity to the object, wherein the base is made of a material selected from the group consisting of: a compressed sintered particulate nitride or carbide of boron or aluminium or a combination thereof;
  locating a heating element on the upper surface of the base or in association therewith, the heating element comprising an electrically conductive member that has a resistance sufficient to generate heat when a current passes through the heating element, the heating element being made of a material selected from the group consisting of: carbon fibre, silicon carbide and graphite impregnated ceramic material; and
  causing an electric current to flow through the heating element, whereby heat generated by the heating element is transferred to the object.

The object may be a substrate used for growing a gallium, indium or aluminium nitride film in an MBE or an RPECVD process.

The object may be a substrate used for growing a group (III) metal nitride film in accordance with one of the processes described above.

The method of heating according to the invention may comprise the further step of covering the heating element with an overlay.

According to a ninth aspect of the invention, there is provided a method of manufacturing a heater, including the steps of:
  compressing particulate material selected from a nitride or carbide of boron or aluminium or a combination thereof, to form a base having an upper surface;
  locating a heating element on the upper surface of the base or in association therewith, the heating element comprising an electrically conductive member that has a resistance sufficient to generate heat when a current passes through the heating element, wherein the heating element is made of a material selected from the group consisting of: carbon fibre, silicon carbide and graphite impregnated ceramic material; and
  providing contacts for connecting the heating element to an electric circuit for passing the electric current through the heating element, in use, so as to generate heat.

The upper surface may be provided with a groove and the method of manufacturing the heater according to the invention may include the step of locating the heating element in the groove.

The method of manufacturing the heater may also comprise the step of connecting the ends of the carbon fibre to the ends of chemically inert wires, for providing connections to an electric circuit. The wires may be made of any suitable metal selected from the platinum group of metals. The connection may be achieved by rolling a strip of a suitable foil (such as a foil made of molybdenum or a platinum group metal) into a tube, inserting one end of the heating element into one end of the tube and the wire made of the inert material into the other and clamping the ends of the tube onto the ends of the heating element and wire respectively. The wires may be connected to an electric circuit when required to operate the heater.

According to a tenth aspect of the invention, there is provided a method of manufacturing a heater for use in an aggressive atmosphere, wherein the method includes the steps of:
  forming an electrically resistive base from a material selected from the group consisting of a compressed sintered particulate nitride or carbide of boron or aluminium or a combination thereof; and
  locating a heating element on an upper surface of the base or in association therewith, the heating element comprising an electrically conductive member that has a resistance such that heat is generated when a current passes through the heating element, and wherein the heating element is made of a material selected from the group consisting of carbon fibre, silicon carbide and graphite impregnated ceramic material.

The base may be cut from a wafer or disc made of a sintered particulate nitride or carbide of boron or aluminium or a combination thereof. The base may be in the form of a circular disc. A groove may then be machined or milled into its top surface.

According to an eleventh aspect of the invention, there is provided a method of manufacturing a heater for use in an aggressive atmosphere, wherein the method includes the steps of:
  providing an electrically resistive base made from a material selected from the group consisting of a compressed sintered particulate nitride or carbide of boron or aluminium or a combination thereof; and
  locating a heating element on an upper surface of the base or in association therewith, the heating element comprising an electrically conductive member that has a resistance such that heat is generated when a current passes through the heating element, and wherein the heating element is made of a material selected from the group consisting of carbon fibre, silicon carbide and graphite impregnated ceramic material.

The method may further comprise the step of disposing a heat transmissive overlay over the upper surface of the base and/or on the heating element.

Alternatively or additionally, the overlay may be located over the support.

As a further optional step, the base may be located on a support.

Applications

The heater may form part of an RPECVD growth system. The RPECVD growth system may be suitable for use in epitaxial growth of semiconductor nitrides.

One embodiment of the heater in accordance with the invention is suitable for use under a vacuum from about $10^{-1}$ Torr down to about $1 \times 10^{-7}$ Torr or even lower e.g. $10^{-8}$, $10^{-9}$ or $10^{-10}$ Torr. Another embodiment may be used within a harsh oxidizing atmosphere. In this embodiment, a silicon carbide element is preferably used. A further embodiment of the invention may be used in an environment comprising free metalorganics and nitrogen radicals during metal nitride semiconductor growth.

Advantages

One advantage of the heater according to the present invention is the significantly lower cost of materials.

Another advantage is that the heater may be manufactured with considerable ease since the base may be made from a material that can be machined using standard steel cutting tools.

Where a carbon fibre heating element is used, it can fit into almost any shape of groove required.

The heater according to the present invention may be used under circumstances where a radiant heating system is required in a harsh gaseous atmosphere.

BRIEF DESCRIPTION OF THE DRAWINGS

A preferred form of the present invention will now be described by way of example with reference to the accompanying drawings wherein.

a) on a ZnO/soda lime glass substrate with a typical rms roughness of 19 to 27 nm;

b) on a ZnO/sapphire substrate with a typical rms roughness of 9 to 13 nm, and 3) on a ZnO/silica substrate with a typical rms roughness of 1 nm.

Figure 3:
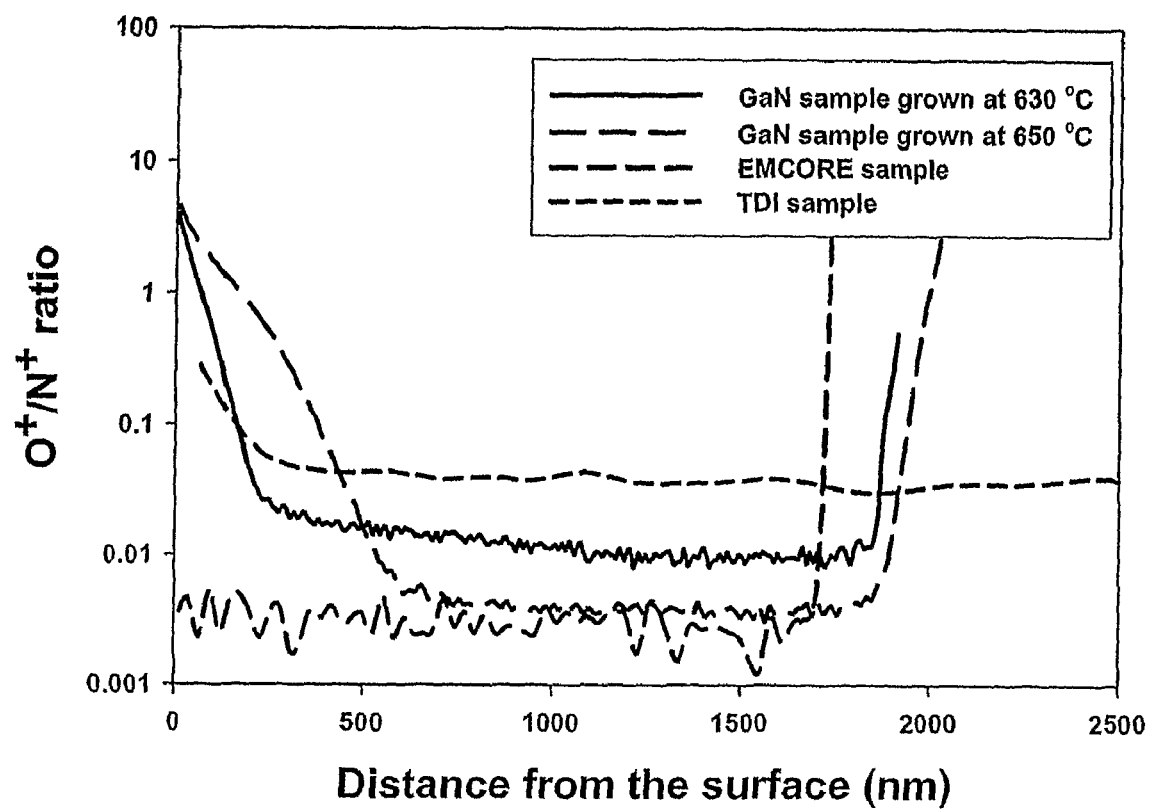
Figure 4:
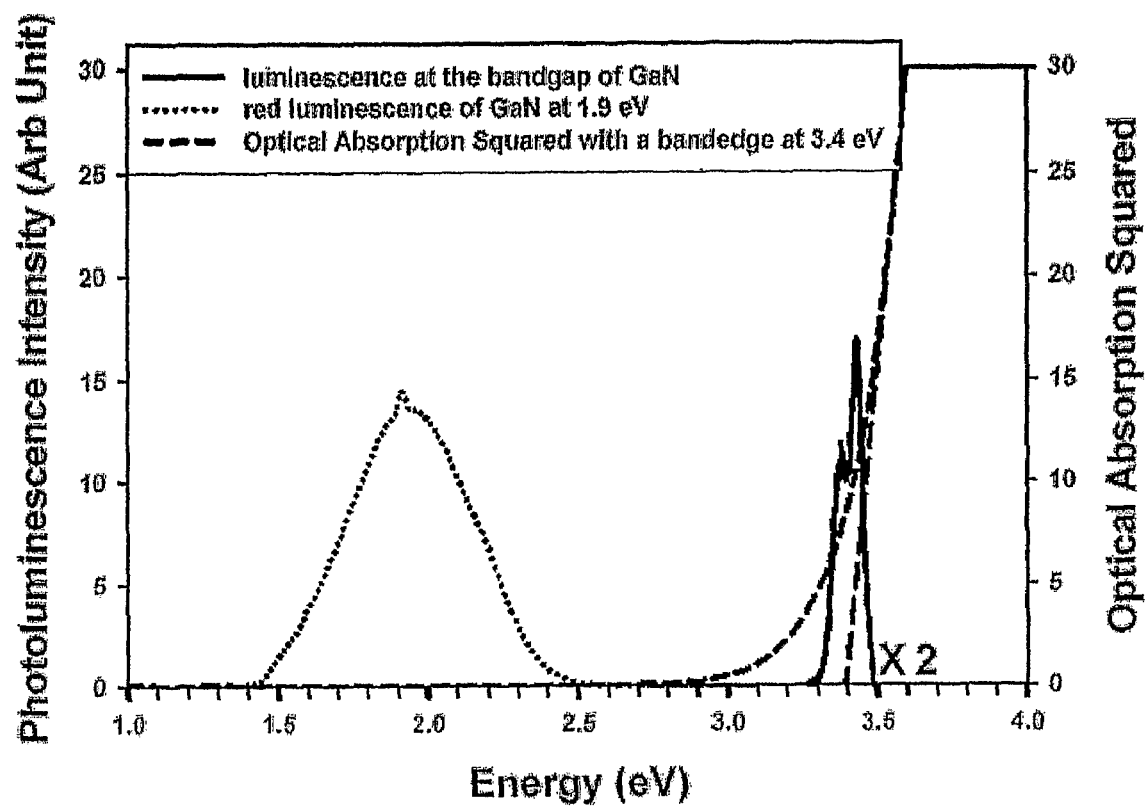
Figure 5:
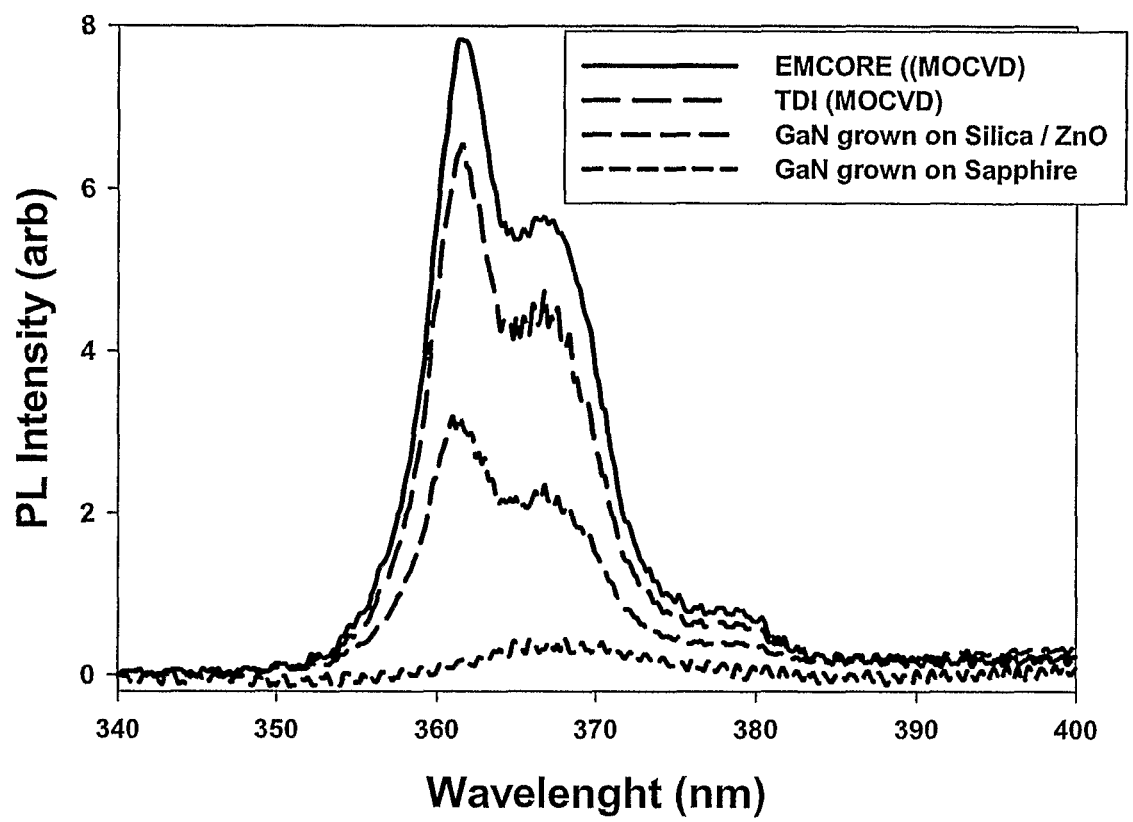
Figure 6:
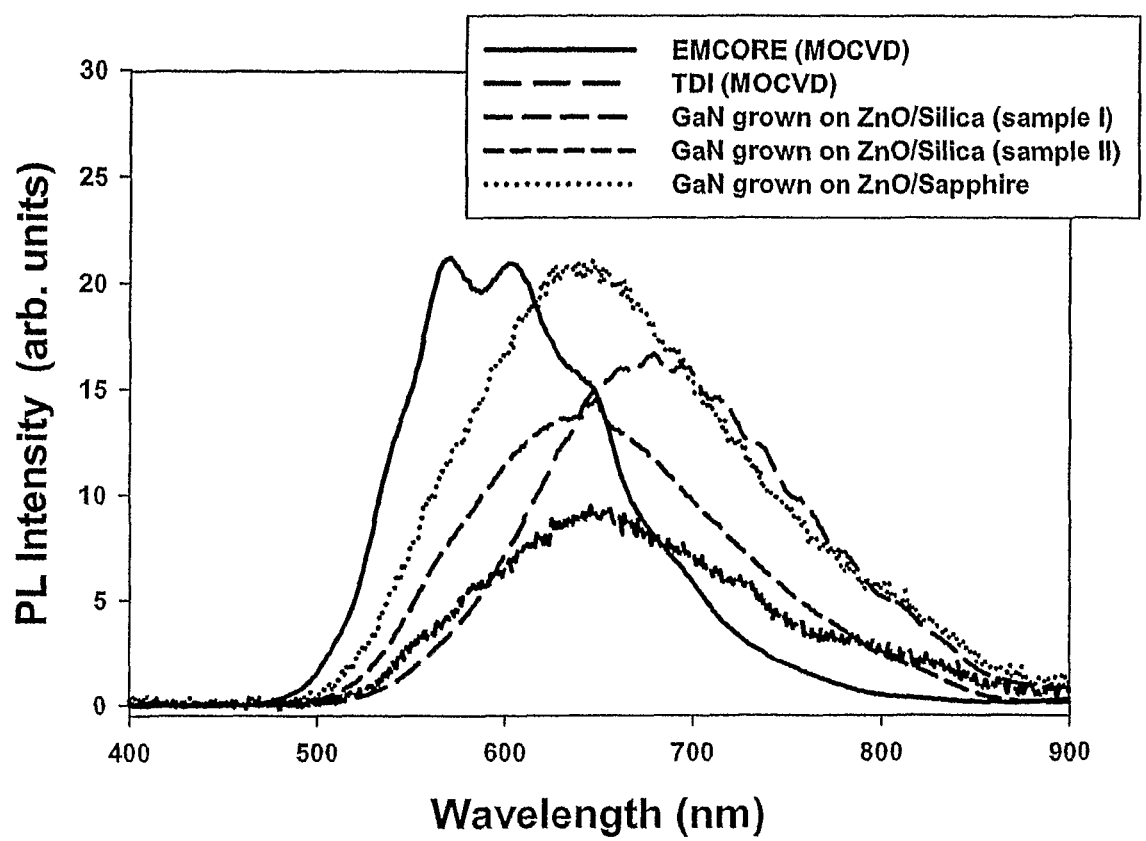
Figure 7:
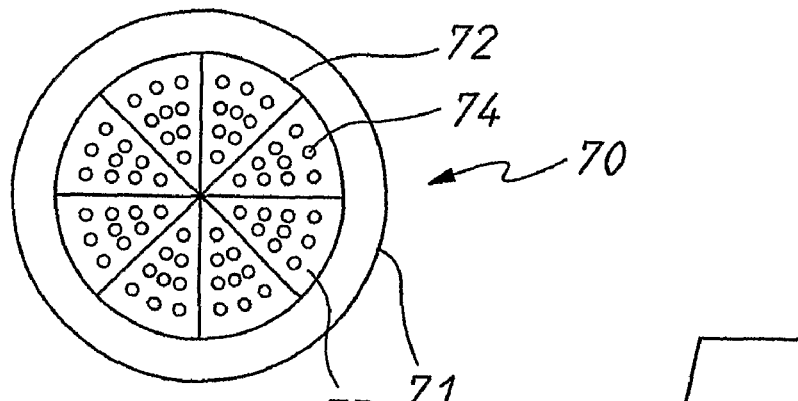
Figure 8:
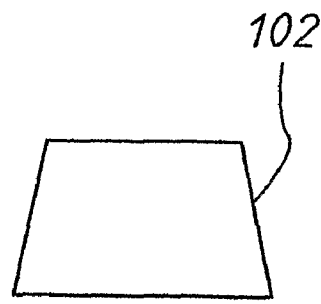
Figure 9:
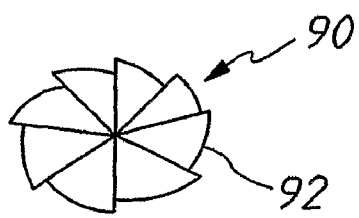
Figure 10:
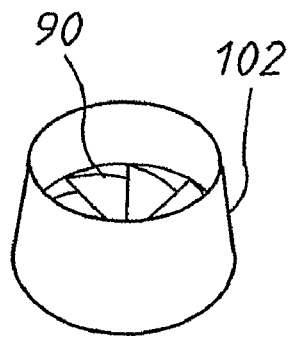
Figure 11A:
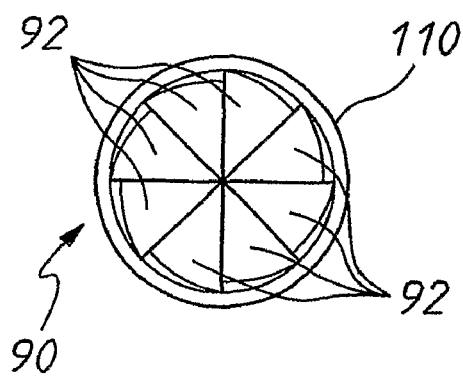
Figure 11B:
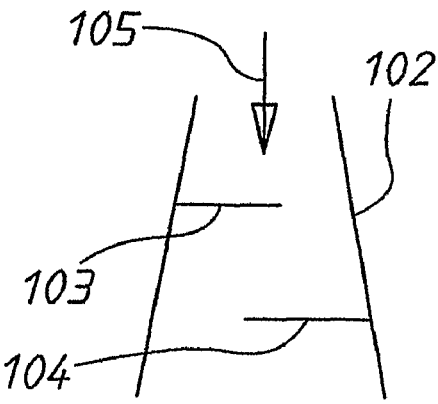
Figure 12A:
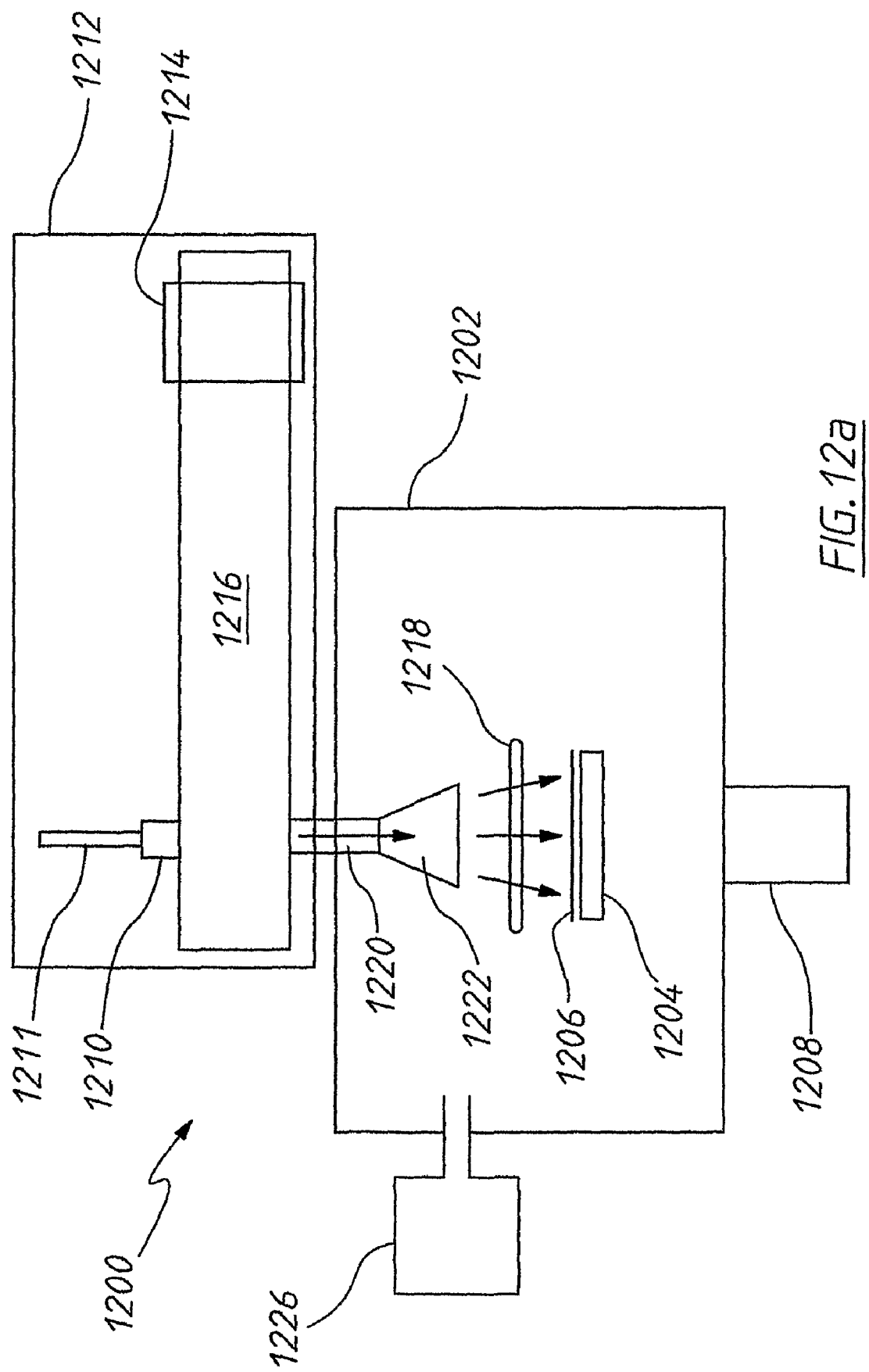
Figure 12B:
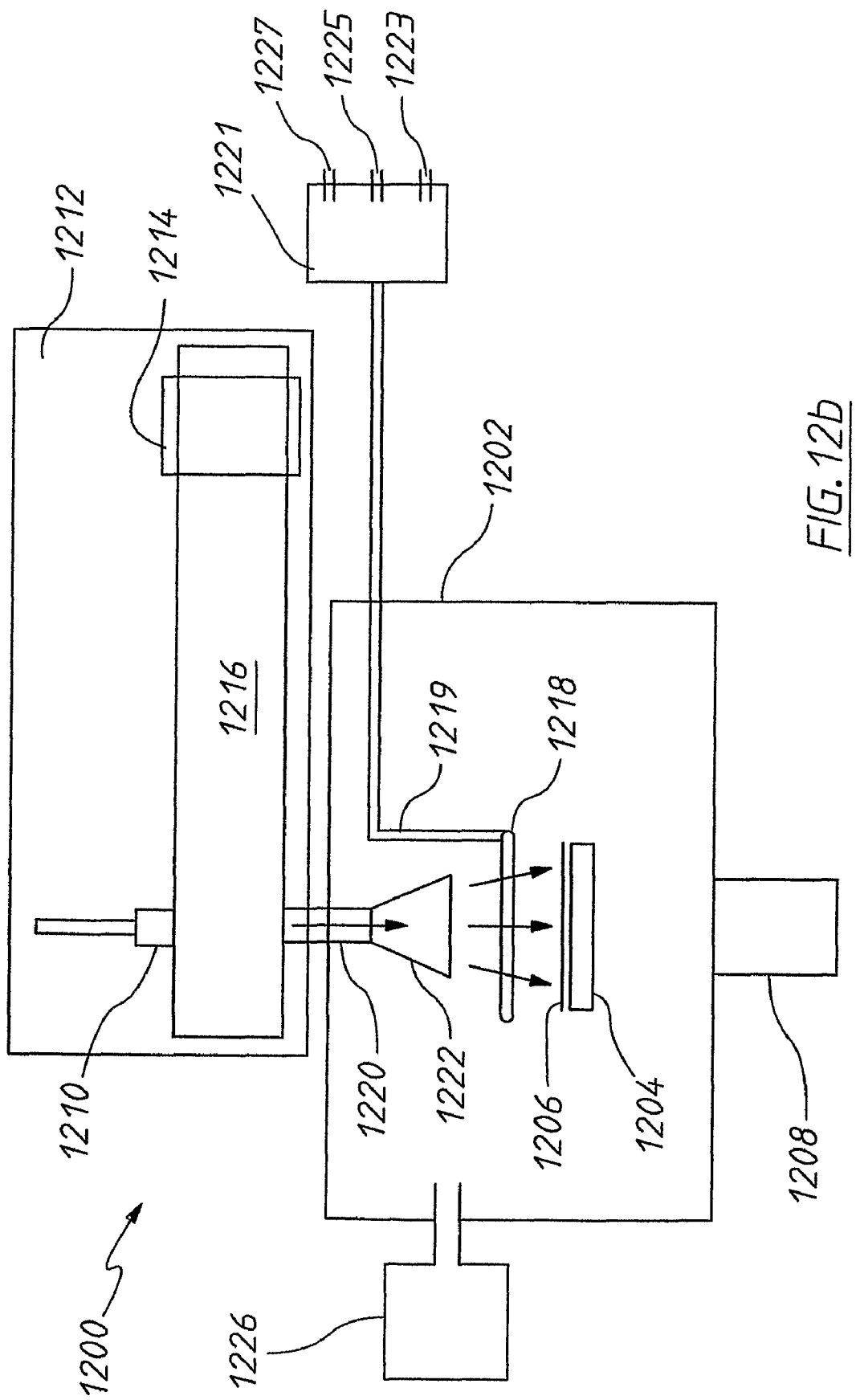
Figure 13:
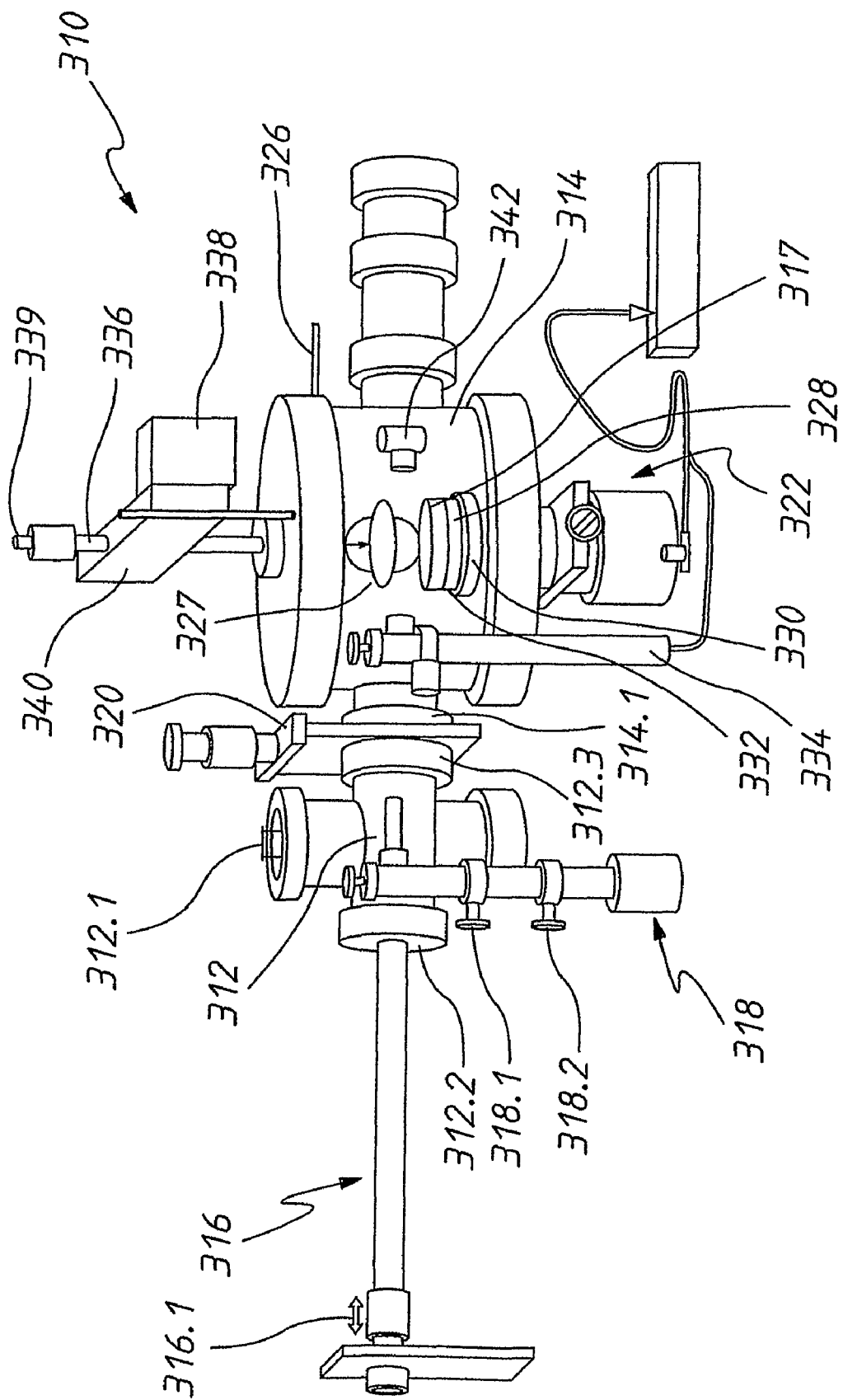
Figure 14:
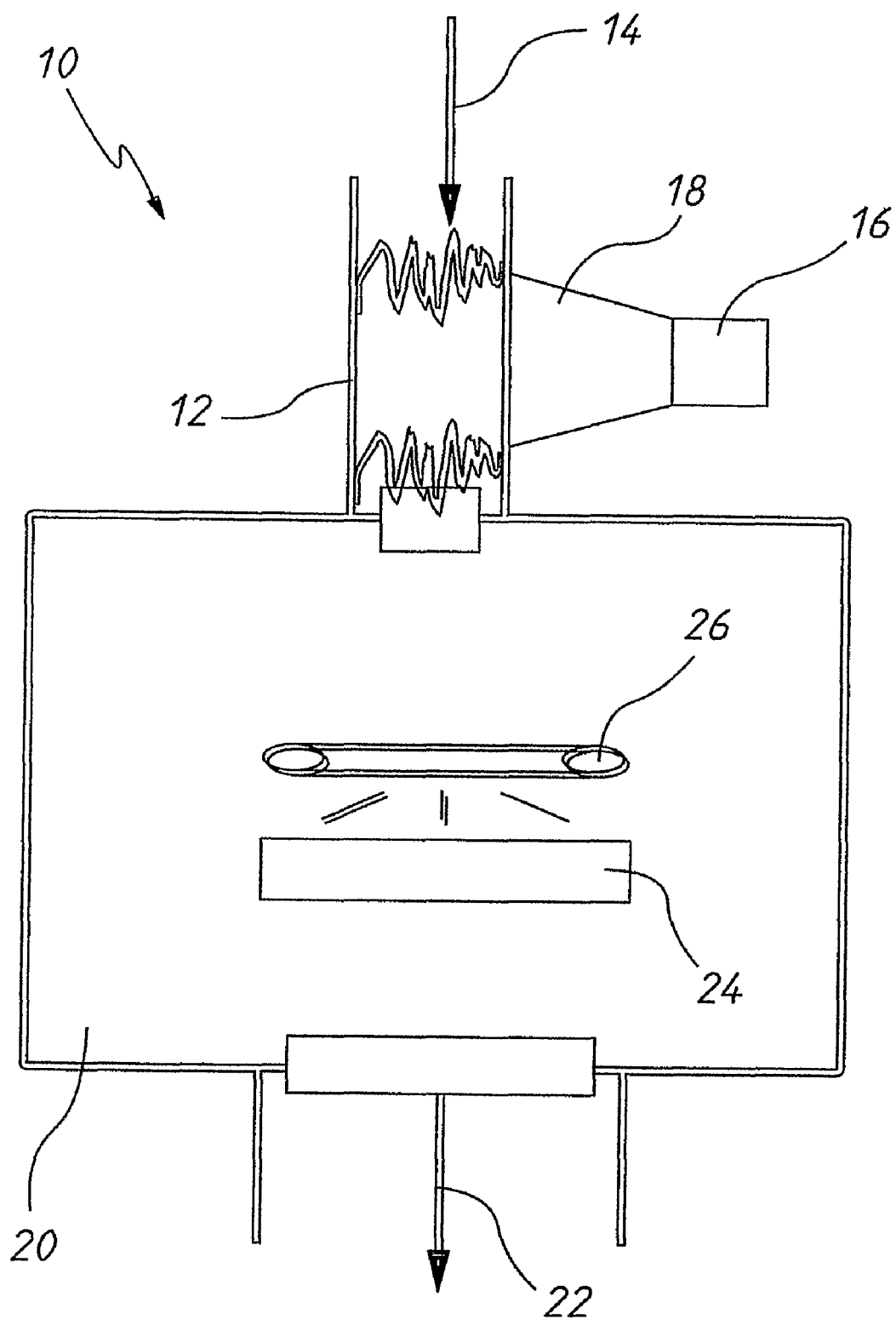
Figure 15:
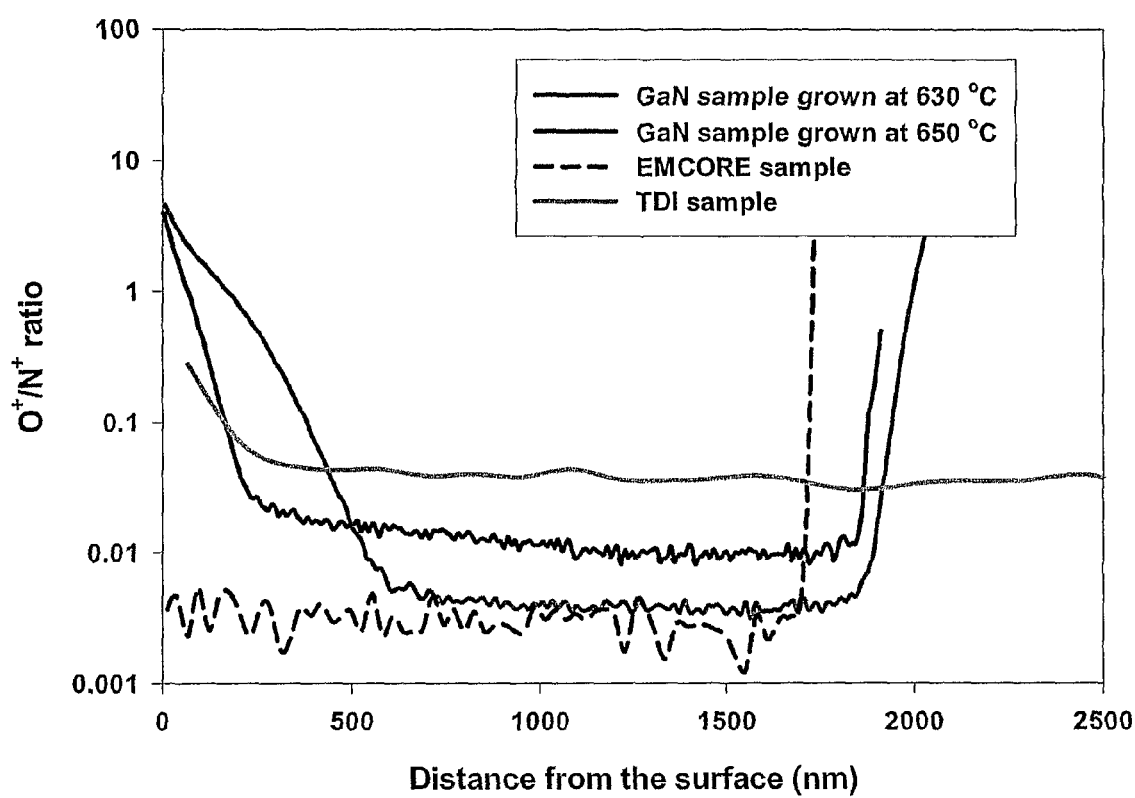
Figure 16:
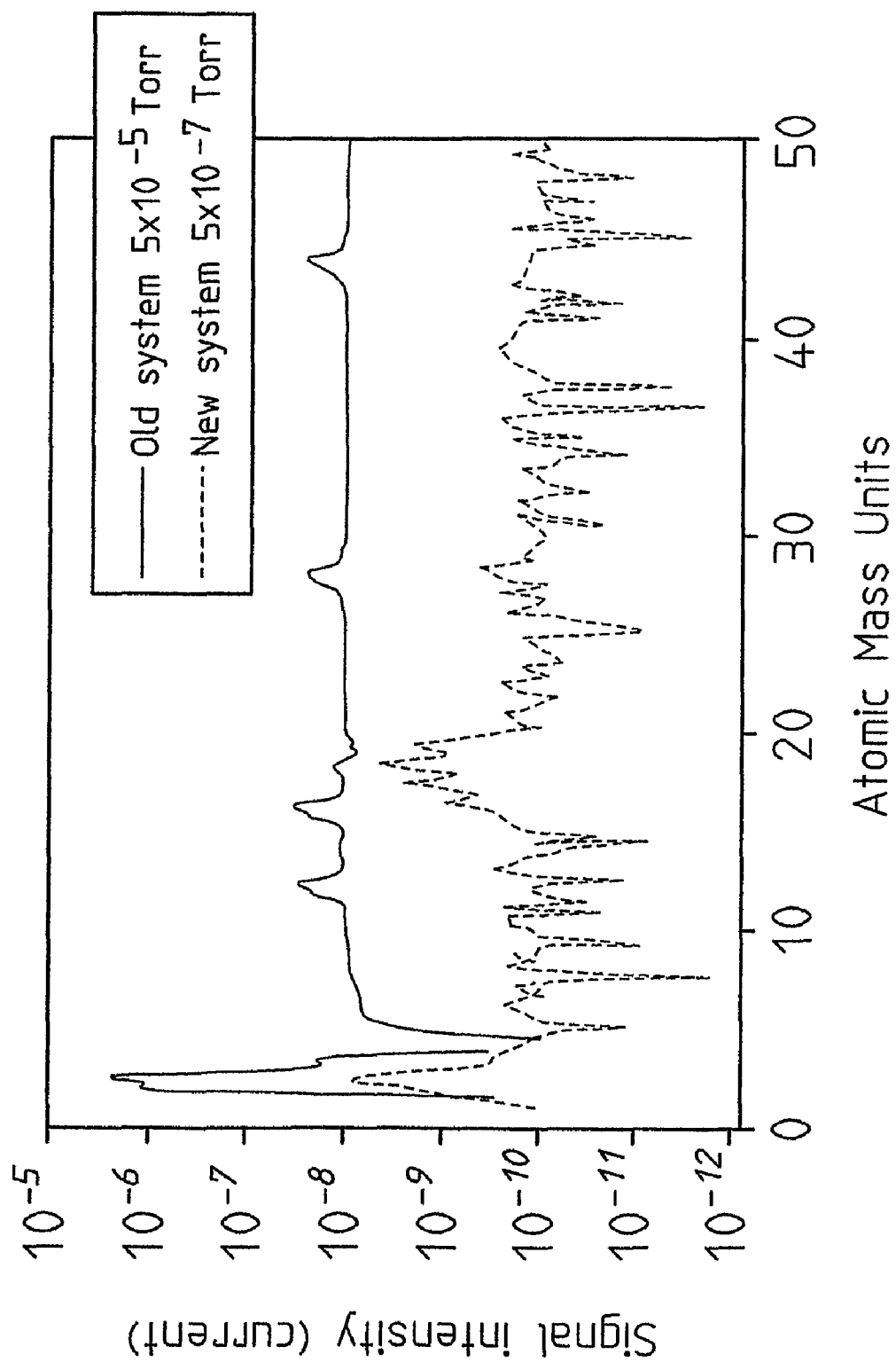
Figure 17:
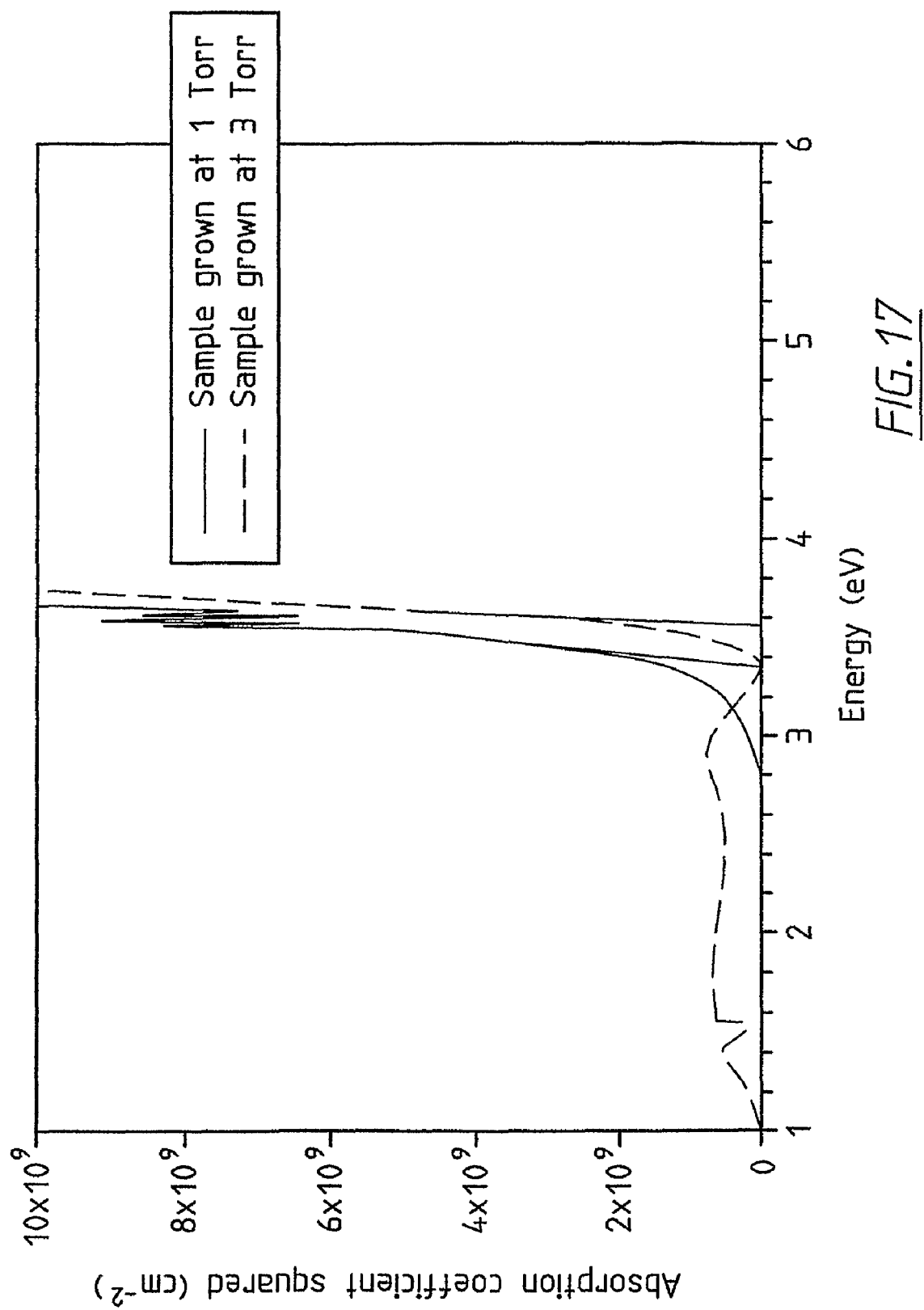
Figure 19:
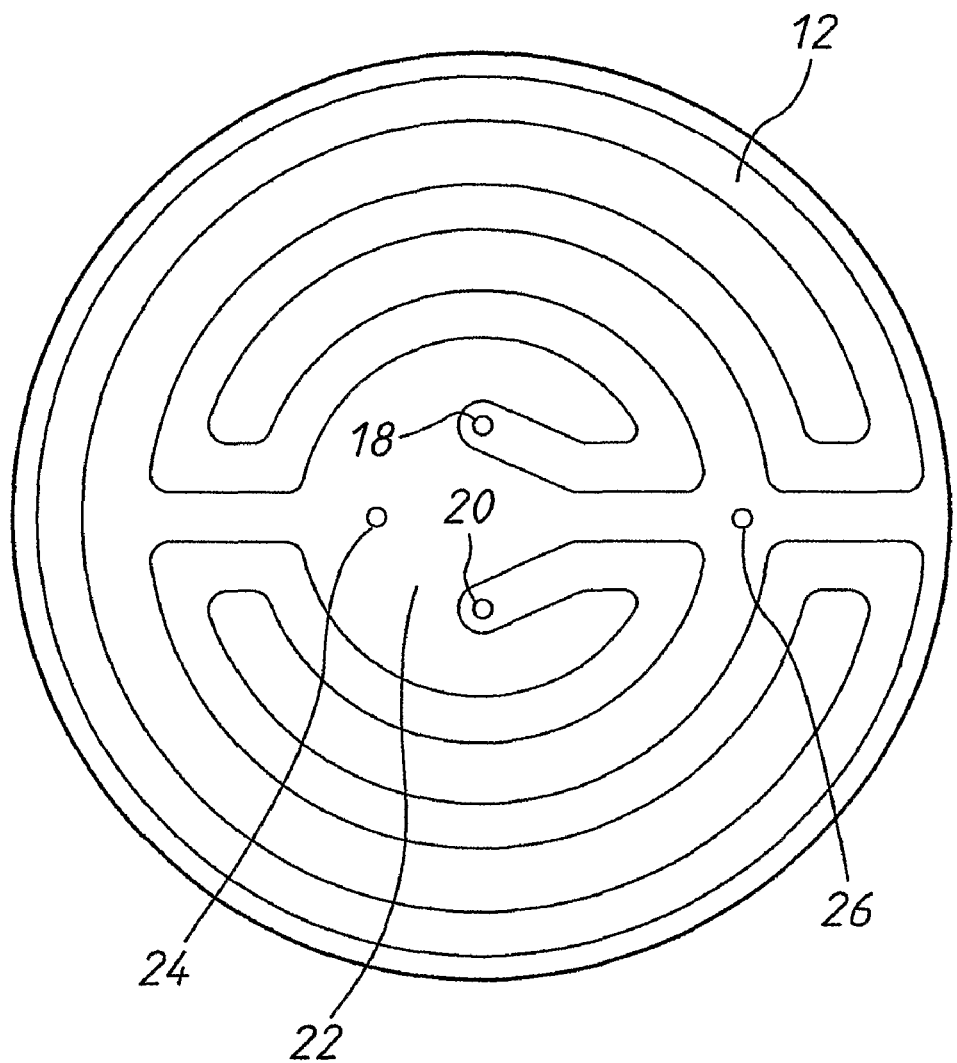
Figure 18:
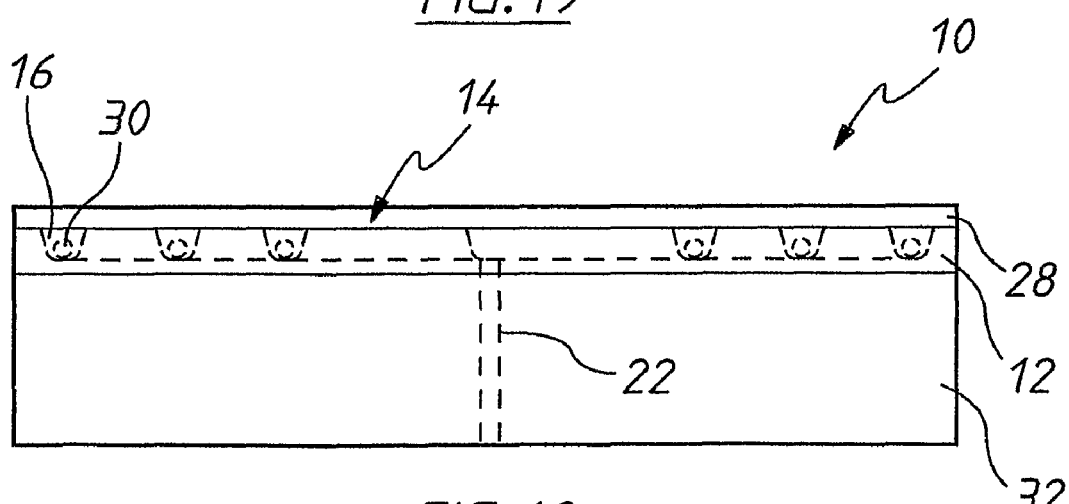
Figure 20:
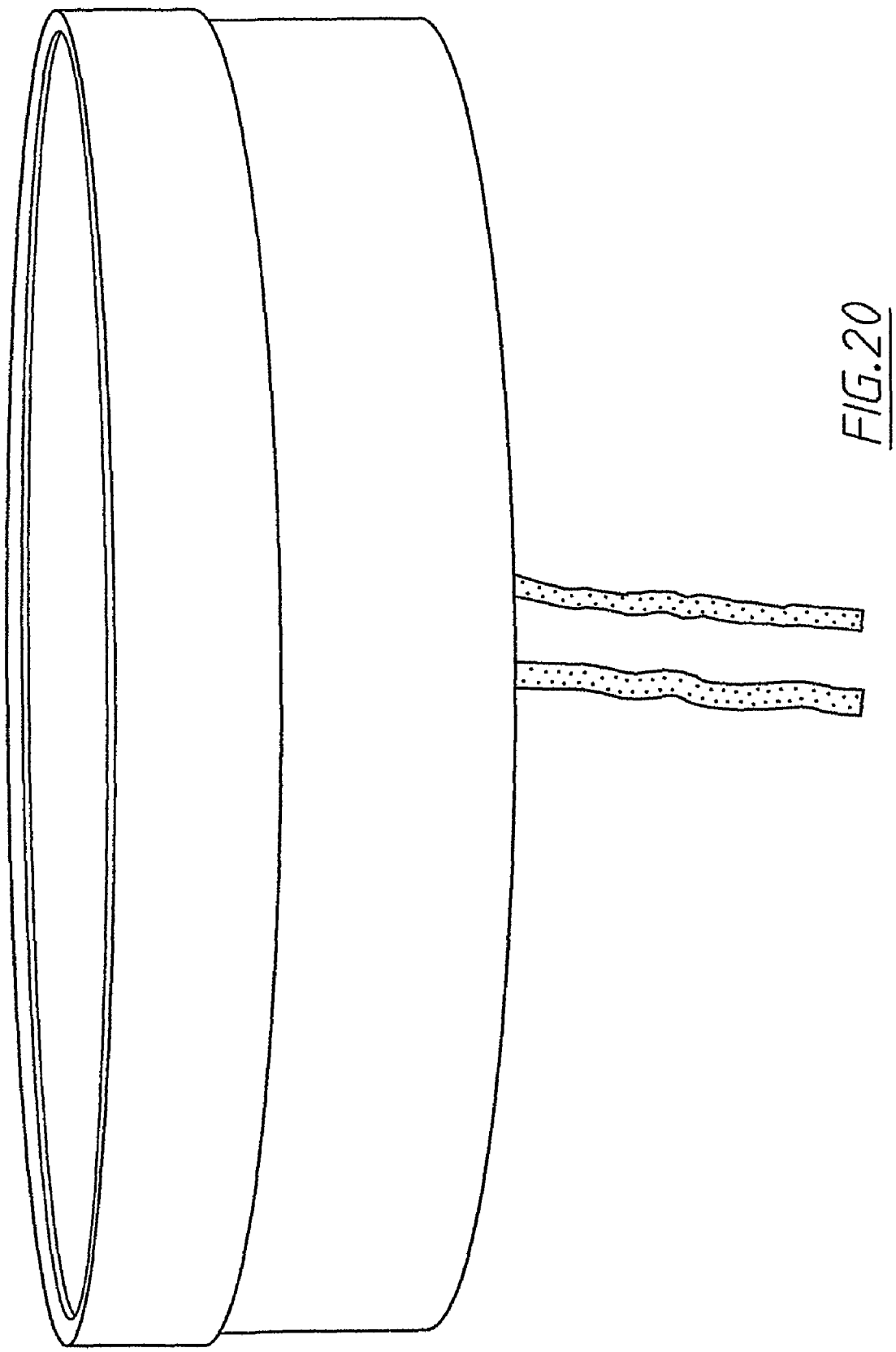
Figure 21:
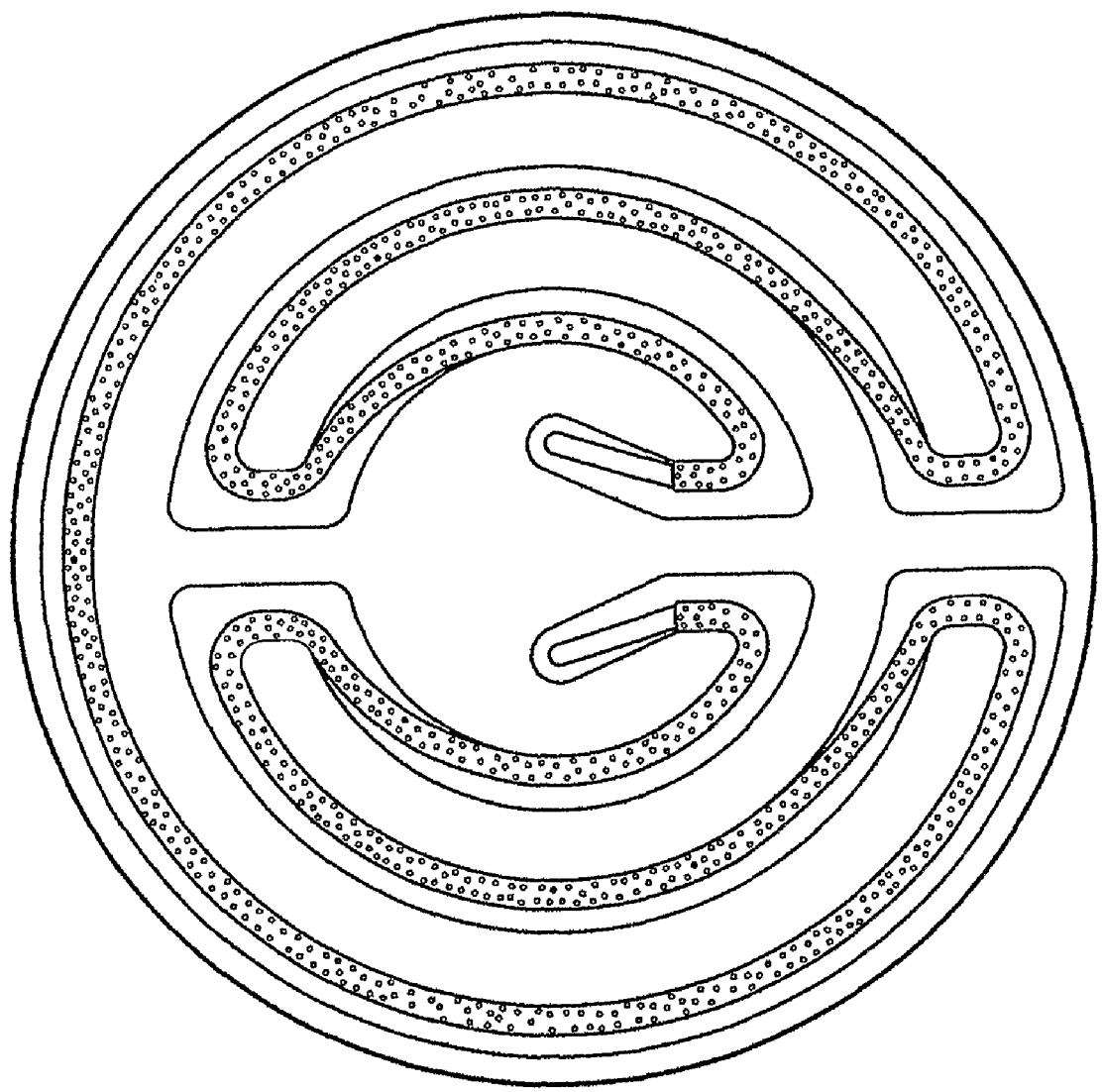

FIG. 3 shows SIMS oxygen ion signals for GaN films grown at respectively 630° C. and 650° C., the oxygen ion signals being presented as a ratio of the nitrogen ion yield and comparing the oxygen ion signals for the aforementioned GaN films with those obtained from commercial samples of GaN films grown by MOCVD and made by EMCORE and TDI;

FIG. 4 represents room temperature photoluminescence intensity and optical absorption squared studies of a GaN sample grown on a ZnO/silica substrate, using one embodiment of a process in accordance with the invention;

FIG. 5 represents room temperature photoluminescence intensity spectra at a short wavelength band gap for two different GaN samples and the two commercial samples referred to in relation to FIG. 3, by way of comparison;

FIG. 6 represents room temperature photoluminescence intensity spectra at the mid-band gap for three different GaN samples and the two commercial samples referred to in, relation to FIG. 3, by way of comparison;

FIG. 7 is a top view of a baffle in accordance with an embodiment of the invention;

FIG. 8 is a side view of casing used to house a baffle or impeller in accordance with an embodiment of the invention;

FIG. 9 is an isometric view of an impeller in accordance with one embodiment of the invention;

FIG. 10 is an isometric view of a casing comprising the impeller of FIG. 9 in accordance with one embodiment of the invention;

FIG. 11a is a top view of a casing comprising an impeller in accordance with an embodiment of the invention;

FIG. 11b is a side view of a baffle in accordance with an embodiment of the invention;

FIG. 12a is a diagrammatic representation of an embodiment of an apparatus in accordance with the invention for growing a group (III) metal nitride film;

FIG. 12b is a diagrammatic representation of an embodiment of an apparatus in accordance with the invention for growing a group (III) metal nitride film;

FIG. 13 is a three dimensional representation of another embodiment of an apparatus in accordance with the invention for growing a group (III) metal nitride film;

FIG. 14 is a diagrammatic representation of an embodiment of an apparatus in accordance with the invention for growing a group (III) metal nitride film;

FIG. 15 is a graph showing the ratio of oxygen atoms to nitrogen atoms at an increasing depth from the surface of a gallium nitride film grown in an apparatus in accordance with an embodiment of the invention;

FIG. 16 is a graphic comparison of atomic mass spectroscopy analysis showing the background signals present due to the presence of residual gas in the old and new RPECVD in accordance with an embodiment of the invention and in accordance with the conventional RPECVD process;

FIG. 17 is a plot of energy versus absorption co-efficient squared for a gallium nitride film grown at 1 Torr, and a gallium nitride film grown at 3 Torr;

FIG. 18 is a diagrammatic elevational view of a heater in accordance with an embodiment of the invention;

FIG. 19 is a diagrammatic plan view of a base forming part of the heater of FIG. 18;

FIG. 20 is a photograph showing an elevational view of a heater in accordance with another embodiment of the invention, without the overlay; and FIG. 21 is a photograph of plan view of a base forming part of the heater of FIG. 20, showing a heating element made of braided carbon fibre located in a groove milled in the surface of the base (the overlay is not present).

DETAILED DESCRIPTION OF THE PREFERRED EMBODIMENTS

Referring to FIG. 7, there is shown a baffle 70 for substantially preventing active neutral nitrogen species generated in the nitrogen plasma from reaching the substrate with a mean energy of greater than or equal to the bond energy of the group (III) metal nitride bond. Baffle 70 is of an annular configuration and would be located at the lower end of the RPECVD connection 1220 shown in FIGS. 12a and 12b. Baffle 70 comprises outer surface 71 and inner surface 72. To the inner surface 72 is fixed to an annular plate 73 which may be made of boron nitride and comprise a series of apertures 74 to permit passage of active neutral nitrogen species therethrough.

Referring to FIG. 8 there is shown a side view of casing 102 which may house impeller 90 shown in FIG. 10, or baffle 70 shown in FIG. 7.

Referring to FIG. 9, there is shown a fan-shaped impeller 90 that may be used for substantially preventing active neutral nitrogen species generated in the nitrogen plasma from reaching the substrate with a mean energy of greater than or equal to the bond energy of the group (III) metal nitride bond. Impeller 90 consists of a plurality of blades 92 offset with respect to one another so as to provide surfaces for the scattering of active neutral nitrogen species, the scattering leading to a decrease in the mean energy of the active neutral nitrogen species. In one embodiment the impeller 90 may be adapted to rotate.

Referring to FIG. 10, there is shown a casing 102 comprising an impeller 90. The casing 102 and impeller 90 located therein, may comprise means 1222 (see FIGS. 12a and 12b) for substantially preventing active neutral nitrogen species generated in the nitrogen plasma from reaching the substrate with a mean energy of greater than or equal to the bond energy of the group (III) metal nitride bond.

Referring to FIG. 11a, there is shown an impeller 90 having blades 92 and casing configuration 110 that may be used for substantially preventing active neutral nitrogen species generated in the nitrogen plasma from reaching the substrate with a mean energy of greater than or equal to the bond energy of the group (III) metal nitride bond.

Referring to FIG. 11b, there is shown a casing 102 that would comprise means 1222 in FIGS. 12a and 12b for substantially preventing active neutral nitrogen species generated in the nitrogen plasma from reaching the substrate with a mean energy of greater than or equal to the bond energy of the group (III) metal nitride bond. The casing 102 is in the form of a baffle, which comprises protrusions 103 and 104 adapted to redirect the flow of active neutral nitrogen species. Arrow 105 depicts the direction of the flow of active neutral nitrogen species from the nitrogen plasma source.

Referring to FIG. 12a (and also FIG. 12b), there is shown an apparatus 1200 for growing a group (III) metal nitride film. The apparatus comprises a growth chamber 1202 in which is located a substrate holder 1204 on which a substrate 1206 resides. The substrate holder 1204 may be located on a heater (not shown). The substrate 1206 has a crystal structure that is suitable for growing the group (III) metal nitride film thereon. A vacuum pump 1208 is used to evacuate the growth chamber 1202 before a reaction mixture is formed therein. The apparatus also comprises containment duct 1210 and a remote nitrogen plasma source 1212, the remote nitrogen plasma source comprises microwave power source 1214, which may be a magnetron operating at 2.45 GHz, and microwave waveguide 1216. The substrate is located about 20 cm to 25 cm from the position at which the plasma exits the remote nitrogen plasma source 1212. Nitrogen gas is introduced into the containment tube 1210 by inlet 1211.

Growth chamber 1202 also comprises means 1218, which may be a shower head, for providing a mixture containing a group (III) metal species, for example trimethyl gallium, in the vicinity of the substrate 1206. The showerhead may be located in a position directly above the substrate. In one embodiment, the showerhead may comprise a ring shape which includes a series of holes therein. The holes are directed towards the substrate allowing passage of the group (III) metal species therethrough, in a direction towards the substrate 1206. The ring shape permits the active neutral nitrogen species from the plasma source 1212 to travel through the space in the centre of the ring towards the substrate 1206. In an alternative embodiment the means 1218 may be located at an extremity of the growth chamber 1202.

The remote nitrogen plasma source 1212 and the containment duct 1210 act to establish and conduct a stream of active neutral nitrogen species into the growth chamber 1202 via RPECVD connection 1220, which is operatively associated with means 1222 for substantially preventing active neutral nitrogen species generated in the nitrogen plasma is from reaching the substrate 1206 with a mean energy of greater than or equal to the bond energy of the group (III) metal nitride bond. The means 1222 for substantially preventing active neutral nitrogen species generated in the nitrogen plasma from reaching the substrate 1206 with a mean energy of greater than or equal to the bond energy of the group (III) metal nitride bond may be a baffle as depicted in FIGS. 7 and 11b or an impeller such as depicted in FIGS. 8 to 11a. The baffle may be made of boron nitride and may comprise a plurality of holes. The impeller may be in the form of a fan comprising blades which may act to impart a centrifugal force on molecules travelling therethrough.

The temperature of the substrate 1206 in the growth chamber 1202 is in the range of from about 480° C. to about 680° C., and preferably about 650° C. The apparatus may additionally comprise a laser 1226 to induce deposition on the substrate of the group (III) metal nitride formed by the reaction mixture.

In use, the vacuum pump 1208 is used to achieve a pressure in the growth chamber of about $10^{-7}$ Torr. The substrate is then heated to the growth temperature which is about 650° C. during the vacuum pumping period. When the desired pressure has been achieved, film growth may commence. The plasma source gas (nitrogen) is introduced into the top of the containment duct 1210 via inlet 1211 which is subject to microwave ionisation by means of microwave power source 1214. The pressure in the growth chamber is maintained at 3 Torr by introduction of gasses. Microwave power source 1214 is turned on to start the plasma. The plasma includes high energy electrons and ions, as well as electrically neutral atomic nitrogen and excited molecular nitrogen. The electrons and high energy ions decay rapidly outside of the plasma generation region, and as such very few of these species reach the lower area of the containment duct 1210. The electrically neutral atomic nitrogen and excited molecular nitrogen travel via the RPECVD connection to the means 1222 for substantially preventing active neutral nitrogen species generated in the nitrogen plasma from reaching the substrate with a mean energy of greater than or equal to the bond energy of the group (III) metal nitride bond, which may be an impeller arrangement such as the impeller arrangements depicted in FIGS. 8 to 10 or FIG. 11a. With the plasma now running, the group (III) metal species, which may be trimethyl gallium, is introduced via the showerhead 1218 allowing film growth to begin on the surface of the substrate 1206. It should be noted that in this embodiment no ammonia or hydrogen (except for where hydrogen is added as trimethyl gallium) is added to growth chamber 1202.

In the apparatus depicted in FIG. 12, the plasma source is remote, that is the substrate on which the film is grown, is not immersed in the plasma. As noted above, the plasma species generated by the source are highly active and can cause damage to the film when it is exposed to these species. The species include high energy electrons and ions, plus electrically neutral atomic nitrogen and excited molecular nitrogen. The substrate may placed some distance from where the nitrogen plasma exits a region in which the nitrogen plasma is generated (~20 to 25 cm) and the high energy ions and electrons very quickly decay outside of the plasma generation region such that they do not reach the substrate. Visible light emission from the plasma is confined to the plasma generation region itself and the so-called afterglow region. The region in which the substrate is held in the growth chamber has no visible emission related to the plasma because the gas molecules present in the growth chamber are at such a pressure that collisions with neutral low energy active neutral nitrogen species which ensures that high energy ionic species are confined to the region near where the plasma is generated.

For a nitrogen plasma the first ionisation potential is at 14.53 eV. When all of the nitrogen species have fallen below this energy, no further visible plasma emission can occur. Hence the neutral atomic nitrogen and excited molecular species reaching the substrate have energies of less than 14.53 eV. For the growth of GaN at a pressure of 3 Torr it has been noted that the introduction of trimethylgallium at shower head 1218 in FIG. 12, results in a strong visible emission related to the presence of gallium. The first ionisation energy of gallium is 6.00 eV, hence the neutral nitrogen species incident on the gallium atoms have mean energies greater than 6.00 eV. However, this emission does not reach the substrate as a result of the combined effect of the pressure in the growth chamber, the location of the substrate in the growth chamber in relation to where the nitrogen plasma exits the region in which the nitrogen plasma is generated, and the use of a baffle or impeller, so that the active neutral nitrogen species reaching the substrate have mean energies less than 6.00 eV. The GaN bond energy is about 2.2 eV so that active neutral nitrogen species incident on a growing film surface should ideally have energies slightly less than this value to prevent nitrogen from dissociating from the surface during film growth (i.e. to prevent damage to the crystal surface during film growth). The pressure in the growth chamber may be adjusted to a suitable value (e.g. a higher value in the case where the film is being damaged during growth) to ensure that this condition is met (i.e. lower than the bond energy of the film being grown which is lower than about 2.2 eV in the case of a GaN film), since at higher pressures more collisions occur between the excited active neutral nitrogen species and low energy gas species, resulting in a decrease in the energy of the excited species. Alternatively, the distance between the substrate and where the nitrogen plasma exits the region in which the nitrogen plasma is generated may be adjusted (e.g. the distance between the exit position of the silica containment tube and the substrate may be made longer where the film is being damaged during growth) to ensure that this condition is met (i.e. lower than the bond energy of the film being grown which is lower than about 2.2 eV in the case of a GaN film). Alternatively, both the pressure in the growth chamber and the distance between the substrate and where the nitrogen plasma exits the region in which the nitrogen plasma is generated may be adjusted to a suitable value to ensure that this condition is met (i.e. lower than the bond energy of the film being grown which is lower than about 2.2 eV in the case of a GaN film). Slightly higher energies than 2.2 eV can be accommodated if there is a sufficient flux of active neutral nitrogen species to the GaN surface to compensate for the nitrogen that is lost, however this situation is not ideal. The mean energies of the neutral atomic species reaching the substrate may be as low as the thermal energy of the substrate (determined by the temperature at the substrate). With a N—N bond energy of 9.8 eV excited molecular species have mean energies that are too high in order to take part in film growth without causing film damage, unless, for low energy molecular nitrogen, some degree of catalysis assists the molecular dissociation at the film surface. Where it is desired to maximize the quality of the film produced, it is necessary to determine the optimum pressure to use in the growth chamber for a given impeller arrangement, and for a given distance between the substrate and where the nitrogen plasma exits a region in which the nitrogen plasma is generated. In order to determine such a pressure it may be necessary to perform a number of trial and error experiments wherein the physical characteristics of the films obtained are analysed after each experiment.

By adjusting the pressure of the growth chamber it is possible to tune the mean energy of the active neutral nitrogen species emanating from the plasma, and thereby influence the characteristics of the group (III) metal nitride film. For example, where it is desired to produce a high quality film which is essentially clear and non-yellow, the pressure would be set to about 3 Torr at a distance of 25 cm between the substrate and where the nitrogen plasma exits the region in which the nitrogen plasma is generated. Alternatively, if it was desired to prepare a film with insulating properties, the pressure may be lowered to around 1 Torr at a distance of 25 cm in order to allow more high energy species to reach the substrate.

As a result of this mean energy tuning capability, when growing a film on a substrate having a buffer layer of zinc oxide which has a bond strength of about 1.61 eV, the initial pressure of the growth chamber may be increased such that species with a mean energy of greater than 1.61 eV are prevented from reaching the zinc oxide layer and causing damage. Once growth of the film has commenced and a layer of group (III) metal nitride has covered the buffer layer, the pressure can then be decreased in order to increase the mean energy of the species reaching the substrate.

When growing a group (III) metal nitride film, it is desirable to maintain the mean energy of the chemically active species above the thermal energy of the substrate.

Referring to FIG. 12b, there is shown an apparatus as per FIG. 12a further comprising a means for introducing multiple group (III) metal species, or indeed dopants, into the growth chamber. Accordingly, the present invention also permits the growing of mixed metal nitride films of group (III) metals, for example aluminium gallium nitride, indium gallium nitride etc. Showerhead 1218 is connected to one end of duct 1219, the other end being connected to distributor 1221. Distributor 1221 has multiple inputs 1223, 1225 and 1227 for introduction of multiple group (III) metal species or dopants, for example trimethyl indium, trimethyl gallium, trimethyl aluminium, trimethylaminealane, triethyl gallium etc, or p-type dopants, for example calcium, beryllium, carbon or magnesium (via addition of magnesium cyclopentadiene), for GaN, or for n-type GaN silicon, oxygen, selenium, sulfur, tellurium or germanium dopants. In the case of gallium nitride, the best choice for n-type doping during film growth is silicon, due to its low ionization level, high activation efficiency (over 90% in most cases) and low diffusivity. For p-type doping, the highest concentrations are achieved using either magnesium or calcium dopants during film growth. The group (III) metal species may be added in an amount of about 1 atom to about 1200-2500 active neutral nitrogen species atoms or about 1:1200, 1:1500, 1:1700, 1:1800, 1:1900, 1:2000, 1:2100, 1:22001:2300, 1:2400 or 1:2500.

FIG. 13 shows an apparatus 310 in accordance with the invention for growing a gallium nitride film. The apparatus 310 comprises a loading chamber or load lock 312, which is adapted to accommodate a substrate before it is introduced into or after it has been removed from a growth chamber 314 through a growth chamber inlet 314.1, using a sample transfer device 316. The sample is transferred on a transferable sample holder 317.

The loading chamber or load lock 312 is in the form of a cylindrical tube provided with a top inlet covered with a lid 312.1, a flange 312.2 on its distal side (relative to the growth chamber 314), and a flange 312.3 on its proximal side.

The flange 312.3 is provided with a passage through which an arm 316 of the sample transfer device 316.1 extends.

The loading chamber or load lock 312 is connected to a load lock vacuum system 318 designed to produce a vacuum in the loading chamber or load lock 312. The vacuum system 318 comprises a set of load lock vacuum valves 318.1, 318.2, functionally connected to the loading chamber or load lock 312 in such a way as to admit air into the loading chamber or load lock 312 when required, or isolate the loading chamber or load lock 312 when it is required to prepare the sample prior to transfer to the growth chamber 314.

The growth chamber can be isolated from the loading chamber or load lock 312 by means of a growth chamber gate valve 320.

When required, a vacuum can be produced in the growth chamber by means of a growth chamber vacuum system 322. The growth chamber is provided with a growth chamber vacuum gauge 324 so that the pressure inside the growth chamber 314 can be measured. Trimethyl gallium and dopants can be introduced into the growth chamber through a tube 326, which is connected to showerhead 327.

The transferable sample holder 317 is placed on top of a heater 328, which itself is supported by heater stage 330 in the growth chamber 314. The heater 328 is provided for heating the sample to a temperature as high as 750° C., if required. A thermocouple 332 is provided to measure the temperature of the sample holder 328. The heater 328 may be the heater of the seventh aspect of the invention.

During film growth the pressure inside the growth chamber 314 can be controlled by means of a pressure control valve 334.

Active neutral nitrogen species may be conducted to the growth chamber through a plasma containment tube 336, which is made of quartz. A microwave source 338 and associated waveguide 340 are provided for ionising a supply of purified nitrogen 339 (e.g. nitrogen with less than 1 part per billion impurities) whereby a plasma is formed that, in addition to ionised particles and electrons, contains electrically neutral chemically active species. The electrically neutral chemically active species are conducted to the growth chamber 314 via the containment tube 336.

In use, a sample is introduced through the removable lid 312.1 after air is introduced into the loading chamber 312 via the air inlet valve 318.1.

The load lock vacuum system 318 is isolated from the loading chamber via the load lock isolation valve 318.2 while air is introduced through the valve 318.1.

The sample is loaded on the sample holder 317 and placed inside the loading chamber or load lock 312. The loading chamber air inlet valve 318.1 is then closed and the lid 312.1 is put in place.

The load lock isolation valve 318.2 is opened and the load lock vacuum system 318 pumps down the loading chamber 312.

Once the vacuum is down to a low value (e.g. $10^{-2}$ to $10^{-3}$ Torr) the load lock pump isolation valve 318.2 is closed; then the growth chamber gate valve 320 is opened and the sample and graphite sample holder are transferred into the main growth chamber 314 using the sample transfer device 316.

The sample holder 317 (with sample) is then placed on the heater stage 330 (which holds the heater 328).

The sample transfer device 316 is then removed from the growth chamber 314 and the chamber gate valve 320 is closed.

The growth chamber 314 is independently pumped by a vacuum system comprising a turbo pump which is backed up by a rotary pump, interconnected by means of a turbo-to-rotary valve. The growth chamber is connected to the vacuum system via a turbo gate valve.

The turbo gate valve and turbo-to-rotary valves are opened and the pressure control valve closed during this stage of operation.

The growth chamber 314 is then left to pump down to its base pressure. The main chamber 314 is never opened to atmosphere except during repair and maintenance situations.

The samples are heated to the growth temperature (about 650° C.) during this vacuum pumping period and the heater temperature is monitored with the thermocouple 332. The thermocouple 332 is introduced through a vacuum feed-through near where the heater connectors are also feed-through into the main chamber.

When a good base pressure is achieved, film growth can commence. The plasma source gas (nitrogen) is introduced into the top of the chamber via the plasma containment tube 336, which is subjected to microwave ionisation of the nitrogen gas by means of a microwave source 338.

The microwave source 338 is turned on to start the plasma. Energetic ions created in the plasma decay quickly and do not leave the plasma generation region. Long lived radicals and atomic nitrogen are able to travel beyond the plasma interaction region and are available for reaction with the metalorganics to produce nitride materials on the samples and sample holder.

The metalorganic and dopant source gases/vapours are introduced through the gas line 326 connected to the top of the growth chamber 314.

When gases are introduced into the main chamber, the turbo gate valve and turbo to rotary pump valves are closed and the pressure control valve is set to maintain a constant pressure.

A chamber vacuum gauge 342 monitors the pressure during film growth.

In an alternative use of the apparatus shown in FIG. 13, a substrate (which may comprise a buffer layer such as zinc oxide) is introduced through the removable lid 312.1 to the substrate holder 317 which is initially resident in the loading chamber or load lock 312. The load lock vacuum system 318 is isolated from the loading chamber or load lock 312 via the load lock isolation valve 318.2 while air is introduced through the loading chamber air inlet valve 318.1. The loading chamber air inlet valve 318.1 is then closed and the lid 312.1 is put in place. The load lock isolation valve 318.2 is opened and the load lock vacuum system 318 pumps down the loading chamber or load lock 312 to a pressure less than $5 \times 10^{-2}$ Torr. The load lock vacuum system 318 is then isolated from the loading chamber or load lock 312. Once the vacuum reaches a value of about $10^{-2}$ to $10^{-3}$ Torr (though lower levels are preferable), the load lock pump isolation valve 318.2 is closed, and the growth chamber gate valve 320 is opened and the substrate holder 317 is transferred into the main growth chamber 314 and placed on heater stage 330 (which holds the heater 328) using the sample transfer device 316. The sample transfer device 316 is then withdrawn from the growth chamber 314 and the growth chamber gate valve 320 is closed isolating it from the loading chamber or load lock 312. The growth chamber 314 is independently pumped by a vacuum system comprising a turbomolecular pump which is backed up by a rotary pump, interconnected by means of a turbo-to-rotary valve. The growth chamber 314 is connected to the vacuum system via a turbo gate valve. The turbo gate valve and turbo-to-rotary valves are opened and the pressure control valve closed during this stage of operation. A vacuum of about $10^{-7}$ Torr may be achieved.

The heater 328 is then set to the required temperature to achieve film growth, which may be about 650° C. for a gallium nitride film. The heater 328 may be of the type shown in FIGS. 18 to 20. A calibration curve may be used to estimate the sample temperature for a thermocouple 332 located near the heater 328. The heating time must be kept to about one hour before growth for substrates such as those comprising forms of glass that may soften at 650° C., and to avoid decomposition of ZnO buffer layers which may occur after prolonged periods at 650° C. Evidence of ZnO decomposition is provided by the observation of the ZnO changing from an insulating state to a conductive state after exposure at 650° C. This change occurs partly because of a loss of oxygen from the ZnO. In severe cases the ZnO can be lost altogether. If the substrate is to be left overnight or for a prolonged period, the sample may be left at a lower temperature of about 300-400° C. At this temperature, the vacuum of the growth chamber 314 is improved by desorption of weakly bound impurities (in particular water vapour) from the substrate surface. Occasionally, film growth will initially be undertaken at a lower temperature of 400-600° C. in order to reduce decomposition of the ZnO buffer layer until a protective layer of gallium nitride covers the ZnO. The temperature will then be raised to a higher final growth temperature in order to proceed with film growth. The substrate may be left at the temperature at which the film will be grown until a vacuum of at least $5 \times 10^{-6}$ Torr is achieved. If the substrate has been left in the temperature range of about 300-400° C. for a period of time, it may take less than 1 hour to achieve a vacuum of at least $5 \times 10^{-6}$ Torr at the temperature at which the film will be grown. The substrate should be left at the temperature at which the film will be grown for at least 1 hour in order to allow the sample temperature to stabilise.

Slight decomposition of the ZnO buffer layer can be tolerated, in fact it is sometimes advantageous to allow the ZnO to decompose somewhat so that the n-type conductivity of that layer is ensured. Film growth may therefore commence under conditions that favour the growth of GaN, though are necessarily undamaging to a ZnO buffer layer. Growth pressures higher than 3 Torr are preferred in order to prevent damage to the ZnO buffer layer.

Once a vacuum of at least $5 \times 10^{-6}$ Torr is achieved, film growth may begin. The plasma gas source (nitrogen) is introduced into the top of the growth chamber 314 via the plasma containment tube 336, which is subjected to microwave ionisation energy by means of microwave source 338.

For gallium nitride film growth a nitrogen flow rate of 600 standard cubic centimetres (sccm) of nitrogen gas may be introduced via the plasma containment tube 336 in the case where the nitrogen is delivered over a 4 inch diameter area by an impeller such as that depicted in FIG. 9, but not shown in FIG. 13.

Once the flow of nitrogen gas begins, the turbo gate valve and turbo to rotary pump valves are closed and the turbo pump is turned off. The nitrogen gas may then be exhausted from the chamber directly to the rotary pump via an automatic valve. A high accuracy Baratron pressure gauge monitors the pressure in the growth chamber 314. The pressure of the growth chamber 314 is preferably set to about 3 Torr, and this valve would be maintained to within approximately 1% of this value.

The temperature of the substrate may be allowed to re-equilibrate to the growth temperature (e.g. 650° C.) for a few minutes after gas flow has commenced and the process pressure is set. The thermal conductivity of the gas flow will momentarily affect substrate temperature and therefore the growth temperature may need to be adjusted in order to account for this. It is also desirable to flow nitrogen through the system for 5-10 minutes before commencing film growth in order to flush out any oxygen bearing species that may have built up out of the gas delivery system.

Approximately 10 minutes before commencing growth, tube 326 and showerhead 327 may be flushed with the carrier gas (e.g. nitrogen) through a gas line which bypasses the growth system (not shown). This serves to flush away any build up of oxygen bearing species.

At this stage, the nitrogen plasma will be ignited, with the 3 Torr pressure growth being adequate to prevent active neutral nitrogen species from damaging the gallium nitride film as it grows. The substrate may or may not be rotated during film growth.

The group (III) metal species is now switched from the bypass line to the growth chamber via the tube 326 and showerhead 327. Trimethylgallium may be used as the gallium source when growing a gallium nitride film at a flow rate of 5.0 sccm, with the trimethylgallium being carried in a nitrogen flow at a ratio of approximately 1 trimethylgallium atom to about 250 to 2000 nitrogen atoms. Other gallium bearing species could also be used, such as trichlorogallium and gallium hydride, though the latter source is so short lived that it would have to be prepared in the growth chamber, as it cannot be stored for any appreciable period of time. In alternative embodiments, indium and aluminium metal-organic species may also be used. It should be noted that any molecular hydrogen entering the growth system with a gallium hydride source is also to be avoided as this can affect the conditioning of the chamber.

With the plasma ignited, and the group (III) metal-organic species entering the growth chamber, film growth begins.

Growth may occur for a period of 4 hours resulting in a 0.5 micron thick film under the growth conditions described. Higher growth rates may be achieved by increasing the number of active neutral nitrogen species created in the plasma by the delivery of higher power to the plasma, or the use of a different excitation source which can more efficiently produce such species.

At the completion of the film growth period, the group (III) metal organic species is again switched to the bypass line, so that it does not flow into the growth chamber. The substrate is then cooled with the nitrogen plasma source still on as nitrogen loss from the sample surface can occur at the growth temperature under vacuum conditions. With the plasma source on, this loss of nitrogen from the surface is avoided. When the temperature drops beneath approximately 300-400° C. the plasma is turned off and the nitrogen flow is temporarily directed through the turbomolecular pump. The turbomolecular pump is turned on and the plasma gas flow is turned off. The chamber then pumps down to the background pressure. Once the sample is cooled to a temperature of less than 100° C., the gate valve between the load lock and main chamber is reopened (the load lock would have been pre-pumped to less than $5 \times 10^{-2}$ Torr using the same steps described above for loading the substrate) and the sample is removed from the heater 328 and transferred to the loading chamber or load lock 312. The growth chamber gate valve 320 between the load lock and the growth chamber is then closed and the load lock vented via load lock vacuum valve 318.1 to atmospheric pressure for the removal of the substrate holder 317 comprising the substrate with film thereon from the loading chamber or load lock 312.

Prior to commencing, or during growth of the gallium nitride film, the process described in Example 7 below may be used in order to reduce the oxygen contamination that could be caused by the tube. The treatment may be done by running a nitrogen plasma through the containment tube 336 for 20 to 48 hours. This may be carried out as follows: The growth chamber 314 is evacuated to a base pressure of about $8 \times 10^{-8}$ to $2 \times 10^{6}$ Torr (at least 16 hours of pumping if pumped from atmospheric pressure), purified nitrogen is then introduced into the growth chamber through the plasma containment tube 336. A nitrogen plasma is then ignited and the system left for 20-48 hours with the nitrogen ions and radicals bombarding and reacting with the inner surface of the containment tube 336. Referring to FIG. 14, there is shown an apparatus 10 in accordance with an embodiment of the invention. The apparatus 10 comprises a quartz tube 12 for containing nitrogen plasma that is generated by subjecting ultra pure nitrogen gas introduced into the quartz tube 12 via an inlet line 14, to an electrical field inside the quartz tube 12, caused by microwaves generated by a magnetron 16 and guided to the quartz tube 12 by means of a wave guide 18.

The quartz tube 12 is connected to a growth chamber 20 from which gas is evacuated to a vacuum system through an outlet 22.

A heater 24 is provided in the growth chamber 20, for heating a substrate on which a gallium nitride film is to be grown.

A metalorganic vapour containing a metal source (selected from gallium, aluminium and indium) is introduced via a gas showerhead 26 above the substrate heater 24.

In use, before a gallium nitride film is grown in the growth chamber 20, the apparatus 10 is prepared by firstly evacuating it to a vacuum level of approximately $10^{-6}$ Torr through the outlet 22. After evacuation, the components of the apparatus 10 are heated, with heat tape or the like, which may be applied externally, to a temperature near or exceeding 100° C., to drive off any moisture that may be present in the apparatus 10. As an alternative, an internal heater may be used for this purpose. When the vacuum has been lowered to $<10^{-6}$ Torr, nitrogen gas is introduced through the inlet line 14 and a plasma is generated in the quartz tube 12 so that the tube 12 can be passivated. The passivation process is continued for a period that may range from a few hours to several days, depending upon whether or not the inside of the quartz tube 12 and the growth chamber 20 had been in contact with air and moisture at atmospheric pressure, and depending on the level of vacuum obtained prior to the passivation process.

Referring to FIG. 15, there is shown four traces, one representing a gallium nitride sample grown by the RPECVD process at a temperature of 630° C., another one for gallium nitride sample grown by the RPECVD process at a temperature of 650° C., and two other traces shown for commercial GaN samples grown by MOCVD by the companies Emcore and TDI.

As will be noticed, the gallium nitride sample grown at a temperature of 630° C. has a considerably higher ratio of oxygen/nitrogen atoms in the bulk plateau region away from the surface than the gallium nitride sample grown at a temperature of 650° C. This is because of the lower growth rate for the 630° C. sample compared to the 650° C. sample, so that greater oxygen incorporation occurs during growth for the 630° C. sample. For both RPECVD samples, however the oxygen in the bulk of the samples is shown to be between the levels typically measured for present commercial GaN material grown by MOCVD.

The exhaust gas (or residual gas) to the vacuum pump for both the conventional RPECVD process and the process according to the invention was subjected to Residual Gas (RGA) analysis using a quadrupole mass spectrometer RGA. The results are graphically represented in FIG. 16.

As can be seen, there is a peak at 44 for the sample of the film grown in the conventional system. This could be ascribed to $CO_2$ and/or $N_2O$.

The peak at 28 for the sample of the film grown in the system in accordance with the invention is due to nitrogen.

The peaks at 16-19 for the sample of the film grown in the conventional system are water related.

The peak at 12 for the sample of the film grown in the conventional system is probably due to carbon contamination on the residual gas analyzer, and is therefore unrelated to the process according to the invention.

The peak at 2 for both samples is due to hydrogen.

Metal nitride films grown on substrates according to the invention may be suitable for use in devices, such as: LED's including p-n junction LED's, blue LED's including GaN LED's, double heterojunction LED's and Metal-Insulator-Semiconductor LED's, general lighting applications, laser diodes, SIS devices, photodetectors and transistors including bipolar transistors and field effect transistors, and other suitable devices. The processes of the invention may be used to prepare electronic and photonic devices.

In FIG. 18, a heater 10 in accordance with the invention is shown. The heater 10 comprises a disc shaped compressed boron nitride base 12 having an upper surface 14 into which a groove 16 has been machined. The groove 16 has a first end 18 and a second end 20. Both the first end 18 and the second end 20 are located near the centre of the disc shaped base 12.

Pins 24 and 26 are provided for attachment of an overlay 28. (In alternative embodiments, the pins 24 and 26 may be replaced by a recess or shoulder provided in a distal end of a cylindrical sidewall projecting upwards from the perimeter of the boron nitride base. The recessed area may hold the sapphire cover plate in an operative position in which it covers the heating element).

A braided carbon fibre heating element 30 extends from the first end 18 of the groove 16 to the second end 20 thereof. To avoid confusion, the braided carbon fibre heating is element 30 is not shown in FIG. 2.

The overlay 28 is made of sapphire and is transmissive to heat radiated, in use, by the braided carbon fibre heating element 30. In practice, the thickness of the overlay 28 is chosen so as to transmit as much heat energy to the substrate as is permitted by the impurity levels in the overlay 28, whilst maintaining sufficient mechanical strength for normal handling of the overlay 28.

The base 12, the heating element 30 and the overlay 28 all rest on a disc shaped ceramic support 32 which is electrically and thermally insulating. The overlay 28 radiates the heat to the top towards the substrate where crystal nucleation takes place. The braided carbon fibre heating element 30 is held down in the groove 16 by the overlay 28, so as to prevent the heating element 30 from being short circuited on to itself. The overlay 28 also serves to evenly distribute heat generated by the heating element 30.

A thermocouple may be located on the top surface of the overlay 28 or at any other location where the temperature measurement is required. Further thermocouples may be provided to determine the relationship between the temperatures of various parts of the heater.

The temperature relationship between the top surface and/or other parts of the heater relative to the temperature of the substrate on which the metal nitride film is to be grown, is determined for a range of temperatures under operating conditions so that, when a metal nitride film is to be grown, the temperature of the substrate can be estimated by measuring only the temperature of that part of the heater. As the resistivity of the heating element changes over time, and in the case of a carbon fibre heating element the resistivity may vary substantially, particularly initially, it becomes necessary to recalibrate the temperature relationship between the temperature of the substrate and the temperature of the part of the heater from which the calibration was done.

The heater 10 may be used in a remote plasma enhanced chemical vapour deposition system (RPECVD growth system) in which a film of gallium nitride is grown in a growth chamber in the presence of a reaction mixture forming gallium nitride from reactants such as activated nitrogen and trimethyl gallium.

The overlay 28 prevents or impedes evaporation in use, of the braided carbon fibre heating element 30 and deposition of the vapour on a sample to be grown on a substrate in the growth chamber.

In use, the heater is connected to an electric circuit and an electric current passed therethrough.

In order to prevent damage to the heater when it is used for the first time, it is preferably heated up gradually to a temperature, on the surface of the heating element, of from about 100° C. about 300° C., preferably from about 150° C. to about 250° C., more preferably about 200° C. and kept at that temperature or within the aforementioned range of temperatures for a time sufficient to ensure that all excess water, other materials and hydrogen (including hydrogen in a chemically bound form such water) are driven off, before the temperature is increased to the operating temperature which may exceed 1000° C. The time may be from about 5 minutes to about 24 hours, preferably from about 30 minutes to about 10 hours, more preferably for at least about an hour.

During operation of the heater, the temperature of the heating element may be controlled by controlling an electric current flowing through the heater.

EXAMPLES

Comparative Example 1

Gold Film Exposed to Growth Conditions Inside Growth Chamber Used for Growing a Gallium Nitride Film A thin evaporated gold film was exposed to the plasma conditions used in the process described in International PCT Patent Application PCT/AU2003/000598. These conditions included a pressure in the growth chamber of about 1 Torr but without the presence of trimethyl gallium. Using the same conditions for film growth with trimethylgallium present the resulting GaN film was slightly yellow in colour. For the gold film damage was observed when it peeled off the glass substrate on which it was deposited. The glass substrate was at room temperature at the time when the film peeled off. It was believed that the nitrogen species incident on the slide from the remote plasma during growth of the film were still very energetic, despite the presence of a considerable distance (about 25 cm) between the plasma source and the substrate.

Example 2

GaN Film Grown at 3 Torr using RPECVD

Example 1 was repeated to grow a gallium nitride film. A higher growth pressure of about 3 Torr as opposed to 1 Torr as used in Example 1, was used in order to reduce the mean energy of the active neutral nitrogen species reaching the substrate. It was believed that the higher growth pressure resulted in more gas collisions which reduced the mean energy of the active neutral nitrogen species incident on the gallium nitride film.

This change in growth conditions led to the film immediately appearing clearer in colour than the film grown at a pressure of 1 Torr. The slight yellowishness observed in the film grown in Example 1 was believed to have resulted from the sample being slightly gallium rich, or as the result of some crystal damage. The electrical properties of the film grown in Example 2 were greatly improved compared to Example 1, as were the optical properties.

The improvement in film quality has allowed the advantages of ZnO buffer layers to be exploited more fully than the inventors believe has previously been possible. GaN films were grown at a temperature of around 650° C. The quality of the GaN films grown at a temperature of around 650° c. was improved after the inventors realised that the use of the RPECVD technique created more damage than was previously thought.

Example 3

A Series of GaN Films Grown at 3 Torr using RPECVD

Results are presented and discussed below for multiple GaN films grown in an apparatus according to the present invention applying a process in accordance with the present invention. In the process, a lower base pressure of about $10^{-7}$ Torr was used and improved control of the gas flow rates by use of a pressure valve controlled by a Baritron feedback from the pressure gauge was maintained during growth of the gallium nitride film. The nitrogen flow rate was about 600 sccm/min. The trimethylgallium was introduced as a mixture with a nitrogen carrier gas at a flow rate of about 5 sccm/min. The amount of trimethylgallium to nitrogen carrier was about 1:2000, and the pressure during film growth was 3 Torr.

The apparatus differed in its geometry from previous apparatus used for growing gallium nitride films, in particular in relation to the orientation of the incoming gas and the plasma feed. In the apparatus used, the incoming gas and the plasma feed were directed downwards onto a substrate holder instead of across it.

Below are details of physical characteristics of two particular gallium nitride films grown under identical conditions on a ZnO/sapphire substrate, except the pressure is varied from 1 Torr to 3 Torr. In both cases, no impeller or baffle is used, the growth temperature is 650° C., the nitrogen flow from the plasma is 150 sccm, and the flow of trimethyl gallium in nitrogen is 5 sccm (1 trimethyl gallium atom: 76 nitrogen atoms) from the showerhead above the sample holder, and the base pressure is less than $7 \times 10^{-7}$ Torr at 650° C.

The first growth at 1 Torr growth pressure gave a sample that was very yellow in colour and insulating all over (resistivity greater than $10^4$ ohm·cm). UV-Vis light transmission measurements indicated a band-gap of 3.35 eV, which is slightly lower than the accepted value of 3.40 eV. The inventors have found that the lower band-gap is is generally indicative of gallium rich material. Also, below the absorption edge between 2.9 eV and 3.35 eV there is evidence of strong band-tailing in the absorption data (see FIG. 17).

The second growth at 3 Torr growth pressure produced a very slightly yellow sample (which may be due to interference fringes rather than crystal defects) which was highly conductive (resistivity=$3.2 \times 10^{-3}$ ohm·cm) with high carrier concentration of $1.2 \times 10^{19}$ cm$^{-3}$, but high mobility for that carrier concentration of 162 cm$^2$/V.s. The measured band-gap is high at 3.55 eV, which occurs because the high carrier concentration causes a slight Moss-Burstein shift. Band-tailing is much reduced for this sample, compared to the sample grown at 1 Torr.

The inventor's interpretation of the above results is that the damage by active neutral nitrogen species with mean energies above the bond energy of GaN, which are able to reach the substrate for film growth at 1 Torr, resulted in significant nitrogen loss from that sample, which resulted in the yellow colouration, and the low band-gap. The high level of damage results in the production of compensating defects which increase the resistivity of the sample considerably. At the higher pressure of 3 Torr the damage is considerably reduced so that compensating defects are not apparent and a high background carrier concentration could be achieved. The electron mobility is high for that carrier concentration which is indicative of a low level of defect related compensating centres.

Experimental Details for Example 3

A series of GaN samples were grown in a UHV RPECVD system. Prior to commencing film growth, the deposition chamber was pre-evacuated to a base pressure of approximately $2\times10^{-7}$ Torr at the desired 650° C. substrate temperature.

The growth pressure was 3 Torr for all the film growths. Trimethylgallium was introduced into the chamber, with nitrogen carrier gas, through a showerhead in the form of a ring above the sample holder with a flow rate of 5 sccm. A nitrogen flow of 150 sccm was introduced through a microwave plasma from the top of the growth system (where an impeller is used the flow rate is 600 sccm). The growth rate was around 0.2 µm/h. The final thickness of all films was between 0.8 to 2 µm. GaN films were grown on a variety of substrates: sapphire, silica, soda lime and borosilicate glass. On all substrates, studies were done either without any buffer layer or with an additional 50 nm thick ZnO RF sputtered buffer layer.

Results

The growth temperature and pressure were critical parameters during GaN deposition. Appropriate thermal contact between the substrate and the substrate holder was required. The best GaN films were grown at 650° C. For growths performed a few degrees below this temperature, the GaN films had poorer crystal quality and showed no photoluminescence response at room temperature. Growing at 650° C. was quite damaging for a soda lime substrate, compared with the other substrates as this type of glass has a softening point very close to the growth temperature. Optical absorption measurements were performed on all samples. Optical density squared versus energy spectra [5] gave a value of the optical band gap between 3.35 to 3.40 eV for all the samples. The established band gap of wurtzite GaN is 3.40 eV. An example plot is shown in FIG. 4.

X-ray diffraction, AFM, SIMS and photoluminescence were used to demonstrate the quality of the GaN structures obtained. The growth rate was 0.2 µm/h. Oxygen levels are shown to be as low as commercial GaN samples grown at temperatures >950° C. Band-edge photoluminescence is also comparable to commercial MOCVD grown material. A strong red luminescence is observed for many samples.

X-Ray Diffraction (XRD)

X-ray diffraction (XRD) measurements were performed using a Philips X'Pert PRO diffraction system with a standard CuKα radiation source with a wavelength λ=1.542 Å. The divergence slit was set at ½° and the receiver slit at ⅛°. All GaN films presented wurtzite (0002) and (0004) reflections. There were no other crystallographic orientations. XRD measurement results are reported in Table 1 below for films grown on different substrates at 650° C. As can be seen in Table 1, GaN grown on Silica/ZnO substrates gives the closest value to the c lattice parameter literature value reported for GaN bulk material [6,7] and with the sharpest peak full width half maximum (FWHM) values.

TABLE 1

Details of XRD (0002) reflection in RPECVD GaN samples grown on different substrates

| GaN grown at 650° C. on different substrates | 2θ(°) | c(Å) | FWHM |
| --- | --- | --- | --- |
| Sapphire | 34.550 | 5.1926 | 0.2000 |
| Sapphire/ZnO buffer layer | 34.535 | 5.1952 | 0.1730 |
| Silica/ZnO buffer layer | 34.545 | 5.1933 | 0.1730 |
| Sodalime/ZnO buffer layer | 34.635 | 5.1803 | 0.2172 |

Figure 1:
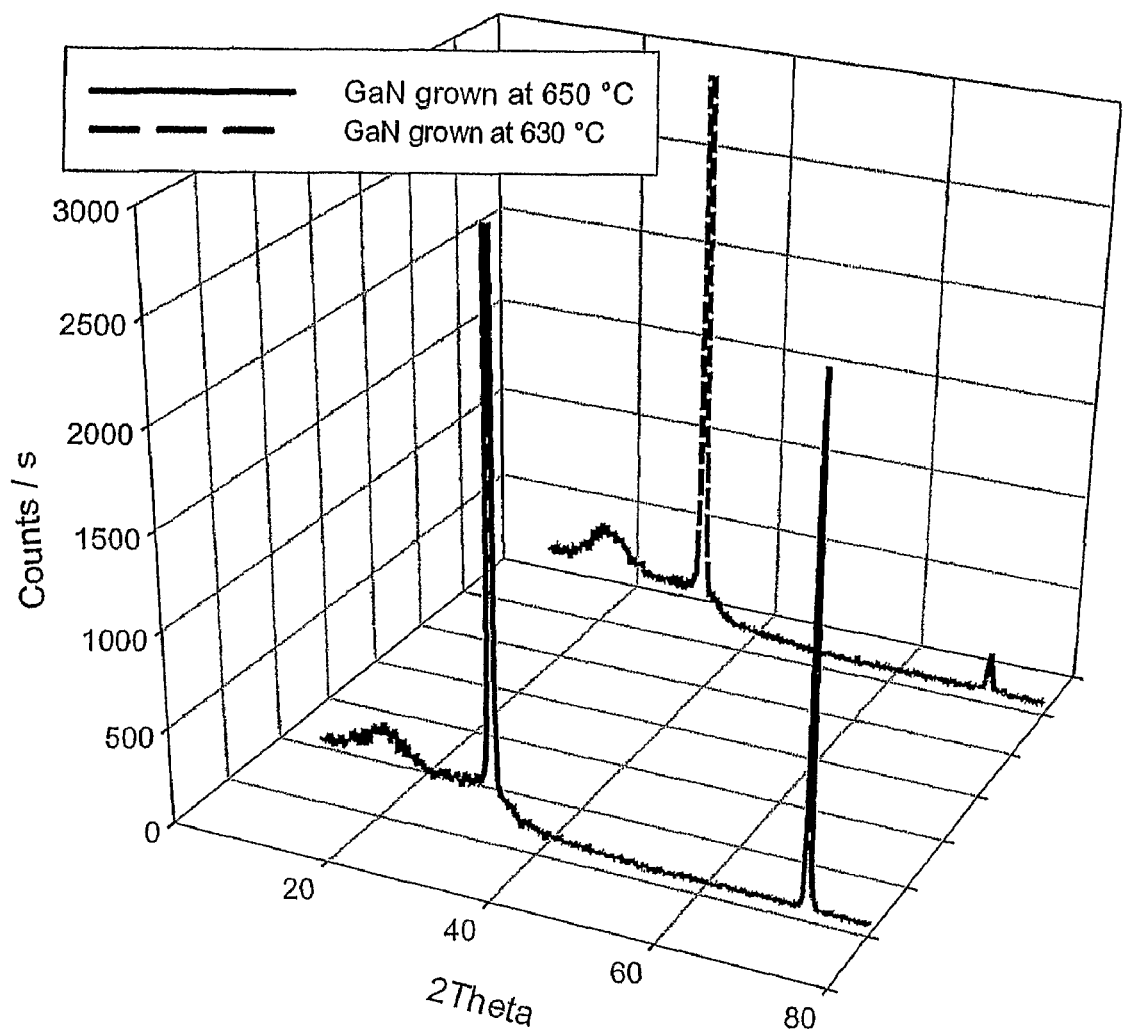
FIG. 1 is an X-ray diffraction analysis, in a 2θ configuration, of two GaN samples grown on ZnO/silica substrates using a process in accordance with one embodiment of the invention, the GaN samples being respectively grown at 630° C. and 650° C., where (0002) and (0004) reflections are observed in the X-ray diffraction analysis, the representation showing that the sample grown at 650° C. presents a sharper FVHM than the one grown at 630° C.

FIG. 1 shows the XRD measurements performed for two GaN samples grown on the same substrate: Silica with a 50 nm ZnO buffer layer at 650° C. and at 630° C. Crystal quality is weaker for the film grown at 630° C. with a FWHM of 0.645 for the (0002) reflection of GaN grown at 630° C. compared with a FWHM of 0.173 for the GaN grown at 650° C. The value for the sample grown at 650° C. is instrumentally limited by the XRD machine used and may be substantially lower than what is indicated by these raw measurements.

Film Morphology

Figure 2:
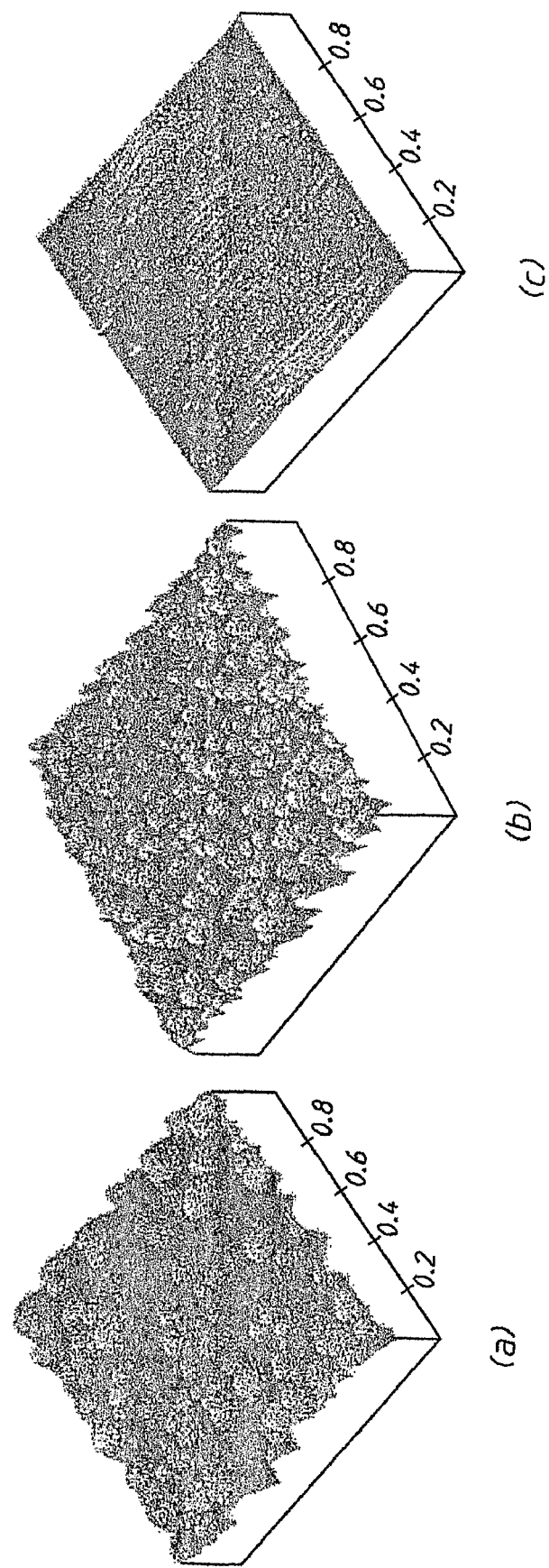
FIGS. 2(a), (b) and (c) are 3D 1 μm² AFM images of the surfaces of three optimized GaN layers respectively grown.

The morphology of the sample surfaces was studied with an AFM in taping mode. The GaN films were usually polycrystalline, except for some films grown on silica substrates with ZnO buffer layer. The size of the grains varied according to the type of substrate on which the GaN was grown. There was not a noticeable trend between the size of grains and the optical quality of the GaN. FIG. 2 shows some 3D AFM 1 µm² images of samples grown on different substrates. The samples appear to show many crystallites of approximately 20-25 nm average diameter. The GaN surface root-mean-squared (rms) roughness was 19 to 27 nm when grown on ZnO/Sodalime; 9 to 13 nm when grown on ZnO/Sapphire or ZnO/Silica substrates. The surface rms roughness was smaller by half a degree of magnitude when grown on substrates without a ZnO buffer layer. Epitaxial growth was achieved for some samples (rms roughness~1 nm, sharp XRD) when proper thermal contact between the substrate holder and the substrate was achieved as seen in FIG. 2 c) for GaN on a ZnO/Silica substrate.

Secondary Ion Mass Microscopy (SIMS)

SIMS measurements were carried out using a Cameca 5F dynamic SIMS system with a Cs⁺ ion beam for the RPECVD samples, and two commercial MOCVD samples. As the RPECVD technique uses a remote plasma and lower growth temperature than conventional MOCVD, one of the drawbacks of this technique could be greater oxygen incorporation in GaN during growth. These measurements were carried out to estimate the oxygen incorporation in the GaN samples during growth. Only a qualitative chemical analysis was required, the ratio of the oxygen ion signal to the nitrogen ion signal in each sample was calculated and the results are reported in FIG. 3. The commercial EMCORE sample shows the lowest O⁺/N⁺ ratio. It is closely followed by the ratio of the GaN sample grown at 650° C. The sample grown at 630° C. presents a little more oxygen incorporation, however the oxygen level is still smaller in concentration than that observed for the commercial TDI sample grown by MOCVD.

Photoluminescence at Room Temperature (PL)

PL measurements were performed at room temperature on the GaN samples using the 325 nm line of a He—Cd laser as the excitation source. As an example, FIG. 4 shows PL measurements together with an optical absorption squared plot for a GaN sample grown on a ZnO/Silica substrate. Linear extension of the optical absorption squared on the X scale (dashed line on graph) indicates a band-edge at 3.4 eV. This band-edge is in accordance with the PL study at the band gap of the sample with a maximum signal of the peak also at 3.4 eV. A broad red luminescence of the sample is also observed with a maximum signal at 1.9 eV. FIG. 5 shows details of the PL at the band gap for different GaN samples. The PL for two different commercial MOCVD samples, from TDI and EMCORE, are shown for comparison. The PL results show that the EMCORE sample has the highest band-edge signal. GaN grown on Silica/ZnO substrate gave the highest band-edge signal of all the RPECVD samples and is reported with half the signal intensity of the GaN commercial TDI sample. Below-gap luminescence in the region of commonly observed yellow luminescence (YL) was also studied and is reported in FIG. 6 for RPECVD GaN samples and for MOCVD GaN commercial samples. All the GaN samples presented a broad signal in this region, the EMCORE sample signal centered more around 2.2 eV corresponding to yellow luminescence, and while the TDI sample centered at 1.8 eV corresponding to a red luminescence. The RPECVD samples presented a broad red luminescence centered at 1.9 eV between the two commercial samples. These variations could be due to different background dopants in the GaN samples. Intensities of the signals are comparable though a lower signal is seen in the case of GaN grown on ZnO/Silica substrate. Smaller PL signals (in both FIGS. 5 and 6) for the RPECVD samples may be due to the result of lower sample thickness (<1 μm) compared to the commercial samples (>1.5 μm).

Discussion and Conclusion

GaN samples were grown on different substrates by the RPECVD technique at lower temperature than the conventional MOCVD technique. Comparable optical properties were observed. The RPECVD technique is a very good candidate for growing GaN. At these specific growth parameters best quality GaN material was obtained when growing at 650° C. The presence of a ZnO buffer layer is desirable and best results were achieved when using ZnO on Silica. The GaN samples were still generally polycrystalline, but epitaxial growth was observed when better thermal contact between substrate holder and substrate was achieved. SIMS results have demonstrated that in the new upgraded growth system, there is better control of the oxygen incorporation, the oxygen level being comparable to commercial GaN samples. Room temperature PL at the band gap for GaN grown at 650° C. was recorded to be almost half that produced by commercial material grown at 1000° C. Using this growth technique, it appears that inexpensive and convenient substrates with a ZnO buffer layer are a potential substitute for sapphire and SiC substrates in device fabrication.

Example 4

Comparative Example of GaN Film Grown in the Absence of any Passivation

A conventional RPECVD system with no load lock was evacuated to a base pressure between about $2 \times 10^{-5}$ and about $2 \times 10^{-6}$ Torr. The growth chamber was exposed to ambient atmosphere (although a nitrogen flow was used in an attempt to minimize contact of the inner surfaces of the apparatus with atmospheric oxygen, during loading of samples). A nitrogen purifier was used to maintain impurities in the nitrogen to below 1 part per billion.

The growth chamber was kept under vacuum when the system was not in use, to avoid contact of the inner surfaces of the apparatus with atmospheric oxygen. The system pressure was usually kept at the aforementioned base pressure.

For film growth, a substrate was introduced into the system after closing off the vacuum pumps from the growth chamber and after flushing the chamber with purified nitrogen. The substrate was introduced through the sample loading port, with purified nitrogen flowing continuously.

The nitrogen flushing of the chamber was then turned off and the chamber was evacuated to the base pressure, whilst heating the sample to about 650° C. The growth chamber was generally left for about 16 hours or at least 4 hours to achieve a good vacuum.

The nitrogen plasma was started just prior to the start of film growth, by switching on a power supply to a magnetron causing microwaves to be generated which in turn ionised a flow of nitrogen to form the plasma. The active species were introduced to the growth chamber through a silica containment tube. A nitrogen flow rate of 150 sccm was typically used. The nitrogen plasma was then ignited.

A small flow of ammonia was used in the system (at a flow rate of 50 sccm) directed straight down onto the substrate. This small flow of ammonia appeared to be necessary to is obtain the lowest oxygen possible for the samples grown in this system.

A flow of trimethylgallium (TMG) in 10 sccm of nitrogen was then introduced to the growth chamber, to commence film growth.

At the end of film growth, the TMG and ammonia flows were stopped; the nitrogen plasma was turned off and the samples were cooled to room temperature either under vacuum or in a flow of nitrogen gas.

The lowest oxygen content in the samples grown with this procedure was 1.6 atomic % (equivalent to $7 \times 10^{20}$ oxygen atoms per cm$^3$).

Example 5

Comparative Example of GaN Film Grown Following Passivation with Purified Nitrogen Gas The procedure of Example 4 was repeated, and the conditions were the same, except that the containment tube (made of quartz), was treated with purified nitrogen for 1 to 2 days, in an attempt at passivating the inner surface of the containment tube. However, the oxygen content of the gallium nitride film grown in the growth chamber could not be brought below the value obtained in Example 4. In a similar test done using a containment tube made of sapphire, similar results were obtained.

Example 6

Growth of a GaN Film According to an Embodiment of the Invention

A growth system comprising a load lock was used for introducing a sample. The base pressure of the system ranged from $8 \times 10^{-8}$ to $2 \times 10^{-6}$ Torr. The main growth chamber was maintained at the base pressure when growth was not occurring, and was therefore not exposed to the ambient atmosphere. A nitrogen purifier was also used to ensure that impurities in the nitrogen were kept to below 1 part per billion. The best oxygen levels were obtained after exposing the silica plasma containment tube to a purified nitrogen plasma for a period of several days, after initial start-up, or several hours, in between growth cycles.

1) The microwave plasma containment tube was conditioned prior to film growth so that minimal oxygen contamination could occur from the tube.
2) While maintaining the growth chamber under vacuum, the load lock was opened to atmosphere and the sample holder, with samples to be grown on the substrates, were introduced onto a loading fork.
3) The load lock lid was then closed and the load lock was evacuated down to approximately $10^{-2}$ to $10^{-3}$ Torr.
4) The pumps for the load lock were then isolated from the load lock, and the chamber gate valve was opened so that the sample holder and the samples could be transferred on to the sample heater.
5) The chamber pressure rose from a value of approximately $10^{-7}$ Torr when the load lock was opened to the growth chamber, and when the sample was heated to the growth temperature.
6) After the sample holder and samples were loaded on to the heater the loading fork was removed from the growth chamber and the chamber gate valve was closed. The chamber was then pump down for 4-16 hours with the sample at the growth temperature or at a slightly higher temperature. A vacuum of $8\times10^{-8}$ to $5\times10^{-6}$ Torr was achieved at the higher temperature before film growth.
7) During growth, 150 sccm of nitrogen flow was introduced into the chamber through the plasma containment tube and a microwave plasma was struck.
8) No ammonia flow was used but 10 sccm of nitrogen with TMG was introduced into the growth system, so as to commence film growth.
9) At the end of film growth, the TMG/nitrogen flow was stopped. The nitrogen plasma was then turned off. The system returned to base pressure.
10) The samples were allowed to cool, before the load lock was re-evacuated to $10^{-2}$ to $10^{-3}$ Torr.
11) After isolating the load lock from its pumps the gate valve between the load lock and the growth chamber was opened and the sample was transferred to the load lock.
12) The chamber gate valve was then closed and the load lock was brought up to atmospheric pressure, while the growth chamber remained under constant vacuum.
13) The GaN samples were analysed for oxygen contamination using secondary ion mass spectroscopy (SIMS). The lowest oxygen level was below 0.038 atomic percent (or $9.6\times10^{18}$ oxygen atoms per $cm^{-3}$). This value is at the limit of what can be accurately measured by SIMS, so that lower values of oxygen contamination may actually have been achieved (another n type GaN film that was showed a measured carrier concentration of about $10^{17}$ carriers $cm^{-3}$ which suggests an oxygen concentration as low as 0.0003 atomic % may be achievable). The GaN samples were n type.

Example 7

Passivation of a Tube Used to Contain a Nitrogen Plasma

Prior to film growth, the tube used to contain the nitrogen plasma was treated to reduce the oxygen contamination that could be caused by the tube. The treatment was done by running a nitrogen plasma through the containment tube for 20 to 48 hours.

To do this, the system was evacuated to base pressure (at least 16 hours of pumping if pumped from atmospheric pressure).

Purified nitrogen was introduced into the growth chamber through the plasma containment tube.

A nitrogen plasma was then ignited and the system was left for 20-48 hours with the nitrogen ions and radicals bombarding and reacting with the inner surface of the containment tube.

The effectiveness of this nitrogenation was tested by analysing the films grown for subsequent film growths. If large amounts of oxygen were still present in the growth system during film growth, transmission spectra would indicate these gross amounts (percentage amounts) of oxygen in the film[8].

If the nitrogenation was incomplete, but smaller amounts of oxygen were present than could be observed with transmission spectra, then secondary ion mass spectroscopy (SIMS) was used to identify the oxygen content of the films. The electrical properties of the film also indirectly indicated that nitrogenation was incomplete, since there will be a variation in electrical properties until nitrogenation is complete (i.e. the carrier concentration falls with continued nitrogenation).

Once the tube was nitrogenated, continued use of the tube ensured that the nitrogenation was maintained. However, it was expected that, if the tube was exposed to air or a high concentration of ammonia, the nitride layer on the tube could be chemically attacked and possibly even removed. The tube was therefore maintained under vacuum when not in use for film growth, so as to avoid having to repeat the nitrogenation procedure.

When the tube had to be left under vacuum for a long period of time, without growing GaN films in the apparatus, the tube was subjected to a short period of re-nitrogenation so as to eliminate oxygen that may have originated from background water vapour in the growth chamber. The time of nitrogenation was found to be dependent on the amount of water vapour that had interacted with the tube over the inactive period.

Example 8

Heating Element

A 31 cm length of braided carbon fibre supplied by Toray Carbon Fibres America, Inc., product number T300-1000, consisting of 12 individual strands braided together, having a mass per unit length of 800 g/1000m and a density of 1.76 g/cm$^3$ yielding a 0.45 mm$^2$ cross-sectional area, was measured to have a resistance of 13.67 ohms. In order to determine how much current could be passed through it before it "burns out", a current was passed through it and increased until the carbon fibre failed at approximately 6 ampere. This current was calculated to be yielding a power of approximately 350 Watts (given that at a raised temperature the resistance of the heater was lower).

Example 9

Manufacture of a Base for a Heating Element

A groove designed to accommodate the carbon fibre as a heating element was machined into an upper surface of a compressed boron nitride base. A carbon fibre heating element made of the braided carbon fibre of Example 1 was laid in the groove and tensioned to avoid the formation of loops which could short-circuit the heating element on to itself. Elevation and plan views of the heater, without the overlay, are shown in FIGS. 20 and 21. After insertion of the carbon fibre heating element into the groove, the carbon fibre heating element was covered by an overlay made of sapphire. The base and the overlay, with the braided carbon fibre heating element sandwiched in between, in the groove, were placed on a disc shaped ceramic support. The ends of the carbon fibre heating element were connected to an electric circuit and a tension of 50 volts was applied across the ends of the heating element, causing the temperature of the heating element to rise. To prepare the carbon fibre for vacuum use after exposure to air following a period of use with metalorganics, a current of 1 ampere was passed through it for a period of about 1 hour, causing the temperature of the carbon fibre to increase to about 200° C., whereafter the temperature was increased to about 700° C. over a period of about 15 minutes. The temperature was measured using a thermocouple.

At a current of approximately 4.4 ampere, this carbon fibre can generate a power of approximately 250 Watts which is sufficient for use in the RPECVD process for growing gallium nitride films at a temperature on the substrate of approximately 650° C. After 15 films growths, the heater according to the invention is still performing satisfactorily.

Example 10

Use of Conventional Heaters (Comparative)

Conventional heaters comprising a heating element made of tantalum lasted for only two growths of gallium nitride films. In some cases, the heating elements became brittle and fell apart. In other cases, the heating elements were short-circuited by metal deposits that caused overheating.

REFERENCES

[1] K. S. A. Butcher, H. Timmers, Afifuddin, P. P.-T. Chen, T. D. M. Weijers, E. M. Goldys, T. L. Tansley, R. G. Elliman, J. A. Freitas Jr, Journal of Applied Physics 92 (2002) 3397.
[2] K. S. A. Butcher, Afifuddin, P. P.-T Chen, M. Godlewski, A. Szczerbakow, E. M. Goldys, T. L. Tansley, J. A. Freitas Jr, J. Cryst. Growth, 246 (2002) 273.
[3] M. J. Paterson, E. M. Goldys, H. Y. Zuo and T. L. Tansley, Jpn. J. Appl. Phys. 37 (1998) 426.
[4] B. Zhou, X. Li, T. L. Tansley, and K. S. A. Butcher, Appl. Surf. Sci., 100 (1996) 643.
[5] J. A. Miragliotta, Optical functions of GaN, in: Propreties of Group III Nitrides, Ed. J. H. Edgar, INSPEC, London 1994 (p. 192).
[6] M. Leszczynski et al, Appl. Phys. Lett., 69 (1994) 73.
[7] A. Shintami and S. Minagawa, J. Cryst. Growth, 22 (1994) 1.
[8] *Studies of the Plasma Related Oxygen Contamination of Gallium Nitride Grown by Remote Plasma Enhanced Chemical Vapour Deposition*, K. S. A. Butcher, Afifuddin, P. P.-T. Chen and T. L. Tansley, Physica Status Solidi C 0 (2002) 156-160.
[9] S. J. Pearton, J. C. Zolper, R. J. Shul and F. Ren, J. Appl. Phys. 86 (1999)$_1$
[10] O. Ambacher, J. Phys. D: Appl. Phys. 31 (1998) 2653.
[11] C. Stampfl, C. G. Van de Walle, D. Vogel, P. Kruger and J. Pollmann, Phys. Rev. B 61 (2000) R7846.
[12] K. S. A. Butcher, Afifuddin, P. P.-T. Chen and T. L. Tansley, Physica Status Solidi C. no. 1 (2002) 156.
[13] B. Zhou, X. Li, T. L. Tansley, K. S. A. Butcher, and M. R. Phillips, J. Cryst. Growth, 151 (1995) 249.
[14] B. Zhou, X. Li, T. L. Tansley, and K. S. A. Butcher, J. Cryst. Growth, 160 (1996) 201.
[15] K. S. A. Butcher, Afifuddin, P. P.-T Chen, M. Godlewski, A. Szczerbakow, E. M. Goldys, T. L. Tansley, J. A. Freitas Jr, J. Cryst. Growth, 246 (2002) 273.
[16] J. A. Miragliotta, Optical functions of GaN, in: Propreties of Group III Nitrides, Ed. J. H. Edgar, INSPEC, London 1994 (p. 192).
[17] H. Timmers, T. D. M. Weijers, R. G. Elliman, Nucl. Instr. Meth. B 190 (2002) 393.
[18] Afifuddin et al, The Properties of GaN Films Grown by Plasma Assisted Laser-Induced Chemical Vapour Deposition. 2000 International Semiconducting and Insulating Materials Conference Proceedings (Institute of Electronic and Electrical Engineers, Piscataway N.J., U.S.A.) 51.

The invention claimed is:

1. A process for growing a group (III) metal nitride film by remote plasma enhanced chemical vapour deposition, the process comprising the steps of:
    (a) contacting at least a portion of an inner surface of a containment tube comprising silica or quartz with a nitrogen plasma at a pressure of from 10 mTorr to 100 Torr and for a period of 1 hour to 100 hours, the contacting at least a portion of the inner surface of the containment tube with a nitrogen plasma causing at least a portion of the inner surface of the containment tube to react with nitrogen ions in the nitrogen plasma, whereby at least a portion of the inner surface is converted into a passivated species that releases less oxygen atoms at a pressure of from 10 mTorr to 100 Torr;
    (b) heating an object selected from the group consisting of a substrate and a substrate comprising a buffer layer in a growth chamber to a temperature in the range of from about 400° C. to about 750° C.;
    (c) producing active neutral nitrogen species in a nitrogen plasma remotely located from the growth chamber;
    (d) transferring the active neutral nitrogen species to the growth chamber via the containment tube;
    (e) forming a reaction mixture in the growth chamber, the reaction mixture containing a species of a group (III) metal that is capable of reacting with the nitrogen species so as to form a group (III) metal nitride film; and
    (f) forming a film of group (III) metal nitride on the heated object under conditions whereby the film is suitable for device purposes.

2. The process according to claim 1 wherein step (f) comprises step (f1):
    (f1) forming a film of group (III) metal nitride on the heated object under conditions whereby the measured band gap of the film is less than 500 meV below the established band gap of the group (III) metal nitride and the film is suitable for device purposes.

3. The process according to claim 2, wherein step (f) comprises step (f3):
    (f3) forming a film of group (III) metal nitride on the heated object whereby the measured band gap of the film is from 70 to 40 meV below the established band gap of the group (III) metal nitride and the film is suitable for device purposes.

4. The process according to claim 1, wherein step (f) comprises step (f2):
    (f2) forming a film of group (III) metal nitride on the heated object under conditions whereby the measured band gap of the film is less than 500 meV below the established band gap of the group (III) metal nitride and the film is suitable for device purposes wherein during said forming at least one condition applies which condition is selected from the group consisting of:
        the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

5. The process according to claim 4, wherein step (f) comprises step (f4):
(f4) forming a film of group (III) metal nitride on the heated object whereby the measured band gap of the film is from 70 to 40 meV below the established band gap of the group (III) metal nitride and the film is suitable for device purposes.

6. The process according to claim 1, wherein step (f) comprises step (f5):
(f5) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object under conditions whereby the film is a semiconducting film and the film is suitable for device purposes.

7. The process according to claim 1, wherein step (f) comprise step (f6):
(f6) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object under conditions whereby the film is a semiconducting film and the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

8. The process according to claim 1, wherein step (f) comprises step (f7):
(f7) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object, under conditions wherein the resistivity of the film is between about 0.0001 and $10^4$ ohm·cm, and the film is suitable for device purposes.

9. The process according to claim 1, wherein step (f) comprises step (f8):
(f8) forming a film of group (III) metal nitride wherein the metal is selected from the group consisting of gallium, indium, a combination of gallium and aluminium, a combination of gallium and indium, a combination of indium and aluminium, and a combination of gallium, indium and aluminium on the heated object, wherein the resistivity of the film is between about 0.0001 and $10^4$ ohm·cm, and the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

10. The process according to claim 1, wherein step (f) comprises step (f9):
(f9) forming a film of group (III) metal nitride on the heated object under conditions whereby the film exhibits a crystallographic structure characteristic of the group (III) metal nitride and the film is suitable for device purposes.

11. The process according to claim 1, wherein step (f) comprises step (f10):
(f10) forming a film of group (III) metal nitride on the heated object whereby the film exhibits a crystallographic structure characteristic of the group (III) metal nitride and the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;

(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

12. The process according to claim 1, wherein step (f) comprises step (f11):
(f11) forming a film of group (III) metal nitride on the heated object under conditions whereby the film exhibits an oxygen concentration less than 1.6 atomic % and wherein the film is suitable for device purposes.

13. The process according to claim 1, wherein step (f) comprises step (f12):
(f12) forming a film of group (III) metal nitride on the heated object whereby the film exhibits an oxygen concentration less than 1.6 atomic % and wherein the film is suitable for device purposes wherein during said forming at least one condition applies which condition is selected from the group consisting of:
(i) the object is located in the growth chamber at a distance of about 20 cm to about 25 cm from where the nitrogen plasma exits a region in which the nitrogen plasma is generated and wherein the pressure in the growth chamber is between about 1 Torr and about 15 Torr;
(ii) the partial pressure of oxygen in the growth chamber is less than $10^{-4}$ Torr;
(iii) the partial pressure of oxygen in the growth chamber is in the range $10^{-4}$ Torr-$10^{-11}$ Torr;
(iv) the pressure in the growth chamber is between about 1 Torr and about 15 Torr;
(v) the pressure in the growth chamber is between about 2 Torr and about 5 Torr;
(vi) a baffle or impeller is located between the object and a source of the remotely located nitrogen plasma; and
(vii) the object is located in the growth chamber at a distance of about 20 cm to about 25 cm from the remotely located nitrogen plasma.

14. The process according to claim 1, wherein step (c) comprises step (c1):
(c1) producing active neutral nitrogen species in a nitrogen plasma remotely located from the growth chamber wherein the plasma is generated from nitrogen gas comprising impurities less than or equal to 10 parts in one billion parts of nitrogen.

15. The process according to claim 1, wherein step (d) comprises step (d1):
(d1) transferring the active neutral nitrogen species to the growth chamber such that the active neutral nitrogen species are directed towards a central region of the object, along a path that is located substantially from an angle in the range of 45 degrees to a right angle with a plane containing the object.

16. The process according to claim 1, wherein in step (a) at least a portion of the inner surface of the containment tube is converted into a passivated species that does not release oxygen atoms.

* * * * *